(12) United States Patent
Hirose et al.

(10) Patent No.: US 11,626,709 B2
(45) Date of Patent: Apr. 11, 2023

(54) LIGHT-EMITTING DEVICE AND PRODUCTION METHOD FOR SAME

(71) Applicant: HAMAMATSU PHOTONICS K.K., Hamamatsu (JP)

(72) Inventors: Kazuyoshi Hirose, Hamamatsu (JP); Yoshitaka Kurosaka, Hamamatsu (JP); Yuu Takiguchi, Hamamatsu (JP); Takahiro Sugiyama, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 16/769,805

(22) PCT Filed: Nov. 28, 2018

(86) PCT No.: PCT/JP2018/043843
§ 371 (c)(1),
(2) Date: Jun. 4, 2020

(87) PCT Pub. No.: WO2019/111787
PCT Pub. Date: Jun. 13, 2019

(65) Prior Publication Data
US 2020/0373739 A1    Nov. 26, 2020

(30) Foreign Application Priority Data

Dec. 8, 2017 (JP) .............................. JP2017-236198
Mar. 14, 2018 (JP) .............................. JP2018-047102
(Continued)

(51) Int. Cl.
*H01S 5/183* (2006.01)
*H01S 5/22* (2006.01)
(Continued)

(52) U.S. Cl.
CPC ............ *H01S 5/222* (2013.01); *H01S 5/0427* (2013.01); *H01S 5/06246* (2013.01); *H01S 5/18361* (2013.01)

(58) Field of Classification Search
CPC ...... H01S 5/222; H01S 5/06246; H01S 5/185; H01S 5/062; H01S 5/2018; H01S 2301/166; H01S 5/4093; H01S 5/18305
(Continued)

(56) References Cited

U.S. PATENT DOCUMENTS 5,561,683 A    10/1996 Kwon
5,583,351 A    12/1996 Brown et al.
(Continued)

FOREIGN PATENT DOCUMENTS

CN    1908764 A    2/2007
CN    101040409 A    9/2007
(Continued)

OTHER PUBLICATIONS

Y. Kurosaka et al., "Effects of non-lasing band in two-dimensional photonic-crystal lasers clarified using omnidirectional band structure," Opt. Express 20, 2012, p. 21773-p. 21783.
(Continued)

*Primary Examiner* — Tuan N Nguyen
(74) *Attorney, Agent, or Firm* — Faegre Drinker Biddle & Reath LLP

(57) ABSTRACT

The embodiment relates to a light-emitting device in which a positional relationship between a modified refractive index region's gravity-center position and the associated lattice point differs from a conventional device, and a production method. In this device, a stacked body including a light-emitting portion and a phase modulation layer optically coupled to the light-emitting portion is on a substrate. The phase modulation layer includes a base layer and plural
(Continued)

modified refractive index regions in the base layer. Each modified refractive index region's gravity-center position locates on a virtual straight line passing through a corresponding reference lattice point among lattice points of a virtual square lattice on the base layer's design plane. A distance between the reference lattice point and the modified refractive index region's gravity center along the virtual straight line is individually set such that this device outputs light forming an optical image.

17 Claims, 57 Drawing Sheets

(30) Foreign Application Priority Data

Jun. 8, 2018 (JP) ............................ JP2018-110112
Jun. 13, 2018 (WO) ................. PCT/JP2018/022609

(51) Int. Cl.
  *H01S 5/042* (2006.01)
  *H01S 5/062* (2006.01)

(58) Field of Classification Search
  USPC ........................................ 372/43.01, 50.123
  See application file for complete search history.

(56) References Cited

U.S. PATENT DOCUMENTS

| | | | |
|---|---|---|---|
| 6,005,262 A | 12/1999 | Cunningham et al. | |
| 6,810,056 B1 | 10/2004 | Lipson et al. | |
| 6,826,223 B1 | 11/2004 | Meyer et al. | |
| 9,531,160 B2 | 12/2016 | Noda et al. | |
| 9,991,669 B2 | 6/2018 | Hirose et al. | |
| 10,734,786 B2 | 8/2020 | Hirose et al. | |
| 11,031,747 B2 | 6/2021 | Kurosaka et al. | |
| 11,031,751 B2 | 6/2021 | Kurosaka et al. | |
| 2003/0010763 A1 | 1/2003 | Fukuchi et al. | |
| 2003/0235229 A1 | 12/2003 | Deng et al. | |
| 2004/0247009 A1 | 12/2004 | Noda et al. | |
| 2004/0252741 A1 | 12/2004 | Meyer et al. | |
| 2007/0008998 A1 | 1/2007 | Ohta et al. | |
| 2007/0019099 A1 | 1/2007 | Lieberman et al. | |
| 2007/0030873 A1 | 2/2007 | Deng | |
| 2007/0075318 A1 | 4/2007 | Noda et al. | |
| 2007/0177647 A1 | 8/2007 | Noda et al. | |
| 2008/0175286 A1 | 7/2008 | Kamijima | |
| 2008/0240179 A1 | 10/2008 | Otsuka et al. | |
| 2008/0259981 A1 | 10/2008 | Wang et al. | |
| 2009/0010298 A1 | 1/2009 | Kiyota | |
| 2009/0074024 A1 | 3/2009 | Noda et al. | |
| 2009/0135869 A1 | 5/2009 | Noda et al. | |
| 2009/0175304 A1 | 7/2009 | Noda et al. | |
| 2009/0232179 A1 | 9/2009 | Ikuta | |
| 2009/0289266 A1 | 11/2009 | Lee et al. | |
| 2010/0220763 A1 | 9/2010 | Ikuta | |
| 2011/0188526 A1 | 8/2011 | Noda et al. | |
| 2012/0002692 A1 | 1/2012 | Noda et al. | |
| 2012/0050694 A1 | 3/2012 | Huang et al. | |
| 2013/0039375 A1 | 2/2013 | Noda et al. | |
| 2013/0121358 A1 | 5/2013 | Hirose et al. | |
| 2013/0163626 A1 | 6/2013 | Seurin et al. | |
| 2013/0243026 A1 | 9/2013 | Noda et al. | |
| 2013/0343415 A1 | 12/2013 | Hori et al. | |
| 2014/0211822 A1 | 7/2014 | Fattal et al. | |
| 2014/0299742 A1 | 10/2014 | Fujii | |
| 2014/0348195 A1* | 11/2014 | Sakaguchi ............... H01S 5/11 372/45.01 |
| 2014/0355635 A1 | 12/2014 | Iwahashi et al. | |
| 2015/0185523 A1 | 7/2015 | Matsumoto et al. | |
| 2016/0020580 A1 | 1/2016 | Takigchi et al. | |
| 2016/0020581 A1 | 1/2016 | Hirose et al. | |
| 2016/0036201 A1 | 2/2016 | Takigchi et al. | |
| 2016/0072258 A1 | 3/2016 | Seurin et al. | |
| 2016/0075258 A1 | 3/2016 | Kim | |
| 2016/0248224 A1* | 8/2016 | Noda .................. H01S 5/04256 |
| 2016/0257036 A1 | 9/2016 | Fang et al. | |
| 2016/0261093 A1 | 9/2016 | Noda et al. | |
| 2016/0327906 A1 | 11/2016 | Futterer | |
| 2016/0380405 A1 | 12/2016 | Takiguchi et al. | |
| 2018/0006426 A1 | 1/2018 | Takiguchi et al. | |
| 2018/0109075 A1 | 4/2018 | Kurosaka et al. | |
| 2019/0165546 A1 | 5/2019 | Hogg et al. | |
| 2019/0181613 A1 | 6/2019 | Kurosaka et al. | |
| 2019/0288483 A1 | 9/2019 | Sugiyama et al. | |
| 2019/0312410 A1 | 10/2019 | Sugiyama et al. | |
| 2020/0373739 A1 | 11/2020 | Hirose et al. | |
| 2021/0249841 A1 | 8/2021 | Aoki et al. | |

FOREIGN PATENT DOCUMENTS

| | | | |
|---|---|---|---|
| CN | 101258652 A | 9/2008 | |
| CN | 101685941 A | 3/2010 | |
| CN | 102447028 A | 5/2012 | |
| CN | 102638003 A | 8/2012 | |
| CN | 103038959 A | 4/2013 | |
| CN | 103988379 A | 8/2014 | |
| CN | 104471465 A | 3/2015 | |
| CN | 104852278 A | 8/2015 | |
| CN | 105191029 A | 12/2015 | |
| CN | 105960744 A | 9/2016 | |
| JP | S49-024190 A | 3/1974 | |
| JP | S59-177282 A | 10/1984 | |
| JP | H7-297110 A | 11/1995 | |
| JP | H9-139540 A | 5/1997 | |
| JP | H9-282437 A | 10/1997 | |
| JP | H9-311614 A | 12/1997 | |
| JP | 2006-026726 A | 2/2006 | |
| JP | 2007-019277 A | 1/2007 | |
| JP | 2008-256823 A | 10/2008 | |
| JP | 2009-111360 A | 5/2009 | |
| JP | 2009-212359 A | 9/2009 | |
| JP | 2009-540593 A | 11/2009 | |
| JP | 2010-283335 A | 12/2010 | |
| JP | 2012-195341 A | 10/2012 | |
| JP | 2013-161965 A | 8/2013 | |
| JP | 2014-026083 A | 2/2014 | |
| JP | 2014-027264 A | 2/2014 | |
| JP | 2014-197665 A | 10/2014 | |
| JP | 2014-202867 A | 10/2014 | |
| JP | 2014-236127 A | 12/2014 | |
| JP | 2016-122711 A | 7/2016 | |
| JP | 2016-129208 A | 7/2016 | |
| JP | 2016-167639 A | 9/2016 | |
| JP | 2018-026463 A | 2/2018 | |
| WO | WO-01/053876 A1 | 7/2001 | |
| WO | WO-2008/041138 A2 | 4/2008 | |
| WO | WO-2012/035620 A1 | 3/2012 | |
| WO | WO 2012/036300 A1 | 3/2012 | |
| WO | WO-2014/017289 A1 | 1/2014 | |
| WO | WO-2014/136607 A1 | 9/2014 | |
| WO | WO-2014/136955 A1 | 9/2014 | |
| WO | WO-2014/136962 A1 | 9/2014 | |
| WO | WO-2014-136962 A1 | 9/2014 | |
| WO | WO-2014/175447 A1 | 10/2014 | |
| WO | WO-2015/008627 A1 | 1/2015 | |
| WO | WO 2015/118741 A1 | 8/2015 | |
| WO | WO 2016 031965 A1 | 3/2016 | |
| WO | WO-2016/111332 A1 | 7/2016 | |
| WO | WO-2016/148075 A1 | 9/2016 | |
| WO | WO-2017/191320 A1 | 11/2017 | |

OTHER PUBLICATIONS

K. Sakai et al., "Coupled-Wave Theory for Square-Lattice Photonic Crystal Lasers With TE Polarization," IEEE J.Q.E.46, 2010, p. 788-p. 795.

Peng, et al., "Coupled-wave analysis for photonic-crystal surface-emitting lasers on air holes with arbitrary sidewalls," Optics Express vol. 19, No. 24, 2011, p. 24672-p. 24686.

(56) References Cited

OTHER PUBLICATIONS

Lee, "Sampled Fourier Transform Hologram Generated by Computer," Applied Optics, Mar. 1970, vol. 9, No. 3, p. 639-p. 644.
Kurosaka et al., "Phase-modulating lasers toward on-chip integration", Scientific Reports, Jul. 26, 2016, vol. 6, p. 30138.
International Preliminary Report on Patentability dated Feb. 21, 2019 in WO Patent Application No. PCT/JP2017/029152.
International Preliminary Report on Patentability dated Mar. 21, 2019 in WO Patent Application No. PCT/JP2017/031466.
International Preliminary Report on Patentability dated Oct. 10, 2019 in WO Patent Application No. PCT/JP2018/012188.
International Preliminary Report on Patentability dated Oct. 10, 2019 in WO Patent Application No. PCT/JP2018/012191.
International Preliminary Report on Patentability dated Dec. 26, 2019 in WO Patent Application No. PCT/JP2018/022609.
JP Office Action dated Aug. 17, 2021 from counterpart Japanese patent application No. P2019-509823 (with attached English-language translation).
JP Office Action dated Mar. 23, 2021 from counterpart Japanese patent application No. 2017-117736 (with attached English-language translation).
International Preliminary Report on Patentability dated Jun. 18, 2020 in WO Patent Application No. PCT/JP2018/043843.
International Preliminary Report on Patentability dated Dec. 17, 2020 in WO Patent Application No. PCT/JP2019/022363.

\* cited by examiner

Fig.6
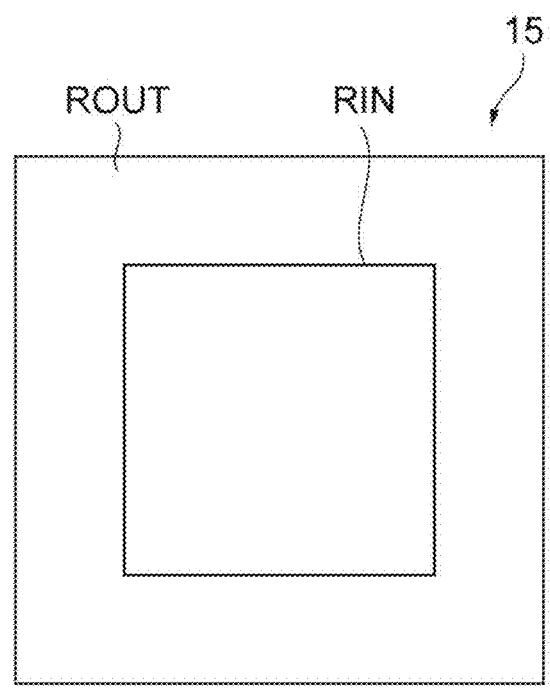
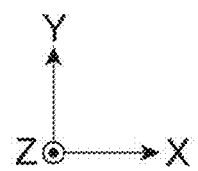

Fig.9A

| A2 | A1 |
|----|----|
| A3 | A4 |

ORIGINAL IMAGE

Fig.9B

| A4 | A3 |
|----|----|
| A2 ROTATION | A1 ROTATION |
| A1 | A2 |
| A3 ROTATION | A4 ROTATION |

OBTAINED BEAM PATTERN

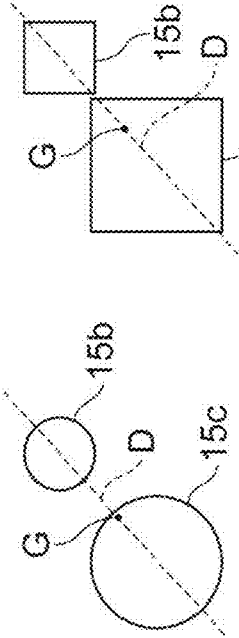
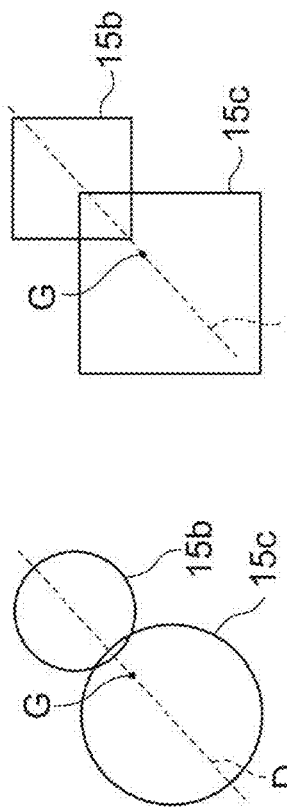
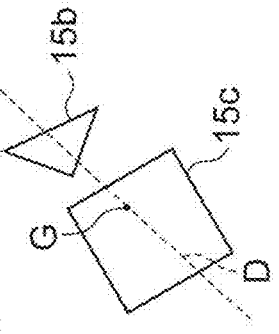
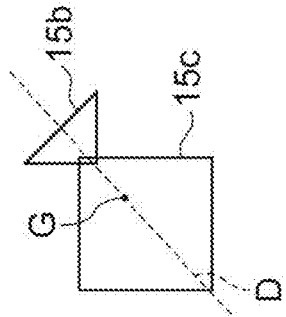
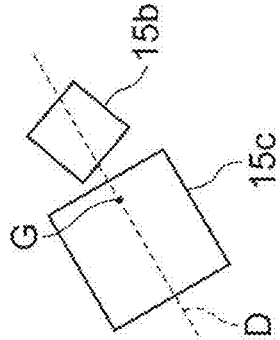
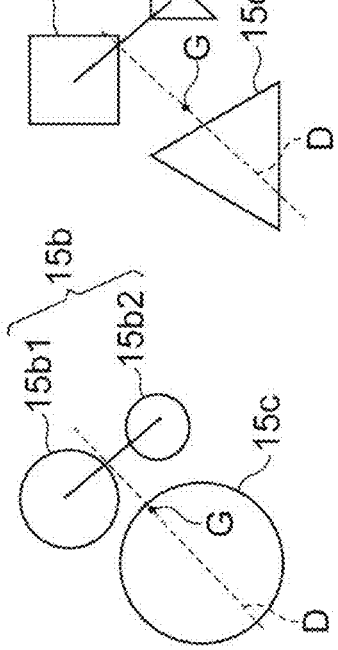
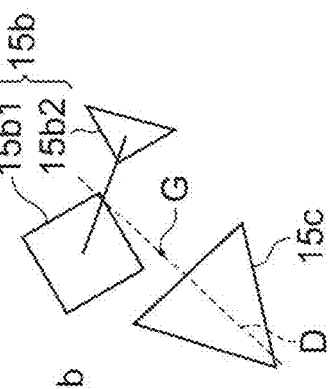
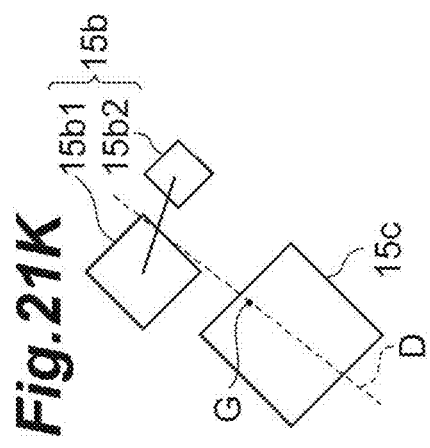

Fig.27

| LAYER NUMBER | CONDUCTIVITY TYPE | LAYER STRUCTURE | FILM THICKNESS (nm) | REFRACTIVE INDEX |
|---|---|---|---|---|
| 1 | P TYPE | GaAs CONTACT LAYER | 100 | 3.55 |
| 2 | P TYPE | AlGaAs CLADDING LAYER | 700 | 3.12 |
| 3 | I TYPE | PHASE MODULATION LAYER (GaAs/CAVITY, CAVITY FF = 15%) | 250 | 3.30 |
| 4 | I TYPE | InGaAs/AlGaAs ACTIVE LAYER | 225 | 3.46 |
| 5 | N TYPE | AlGaAs CLADDING LAYER | 2000 | 3.27 |

Fig.29

| LAYER NUMBER | CONDUCTIVITY TYPE | LAYER STRUCTURE | FILM THICKNESS (nm) | REFRACTIVE INDEX |
|---|---|---|---|---|
| 1 | P TYPE | GaInAsP(Eg=1.15eV) CONTACT LAYER | 100 | 3.35 |
| 2 | P TYPE | InP CLADDING LAYER | 1000 | 3.21 |
| 3 | I TYPE | PHASE MODULATION LAYER (GaInAsP (Eg = 1.0 eV)/CAVITY, CAVITY FF = 15%) | 300 | 3.20 |
| 4 | I TYPE | GaInAsP ACTIVE LAYER | 275 | 3.42 |
| 5 | N TYPE | InP CLADDING LAYER | 2000 | 3.21 |

Fig.31

| LAYER NUMBER | CONDUCTIVITY TYPE | LAYER STRUCTURE | FILM THICKNESS (nm) | REFRACTIVE INDEX |
|---|---|---|---|---|
| 1 | P TYPE | GaN CONTACT LAYER | 100 | 2.55 |
| 2 | P TYPE | AlGaN CLADDING LAYER | 600 | 2.53 |
| 3 | P TYPE | AlGaN CARRIER BARRIER LAYER | 20 | 2.48 |
| 4 | I TYPE | InGaN ACTIVE LAYER | 130 | 2.59 |
| 5 | N TYPE | GaN GUIDE LAYER | 150 | 2.55 |
| 6 | N TYPE | PHASE MODULATION LAYER (GaN/CAVITY, CAVITY FF = 15%) | 100 | 2.39 |
| 7 | N TYPE | AlGaN CLADDING LAYER | 2000 | 2.54 |

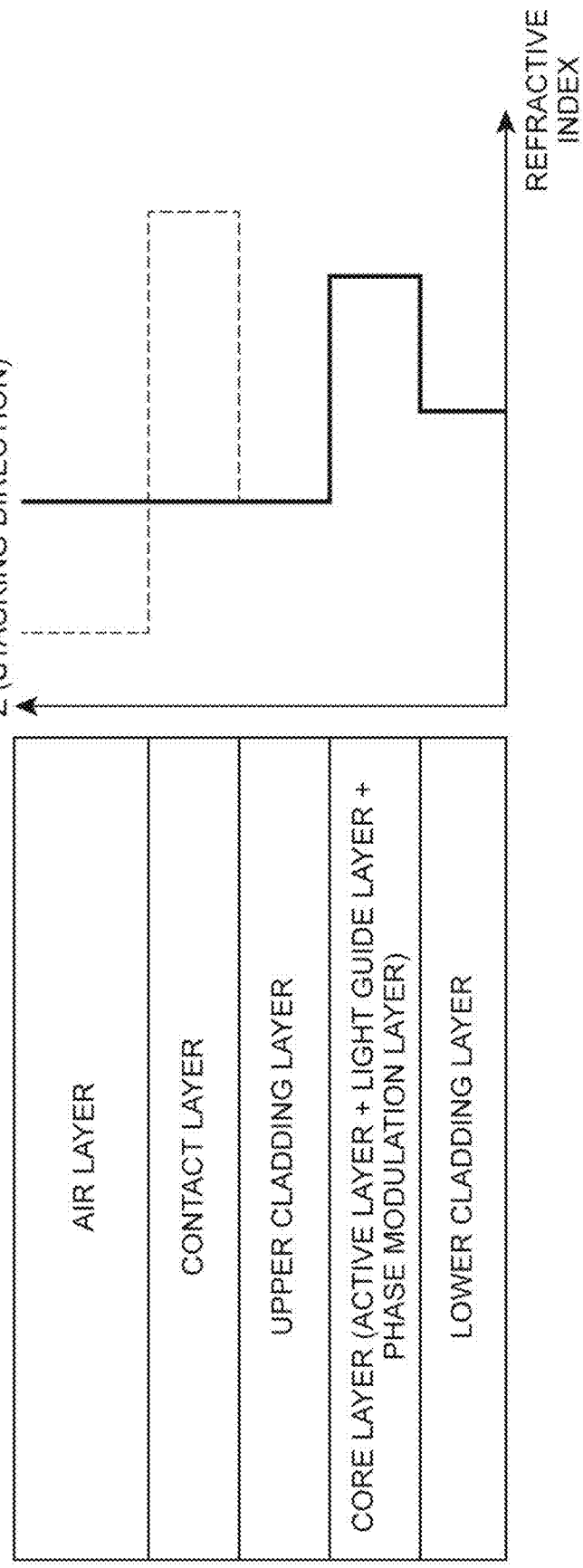

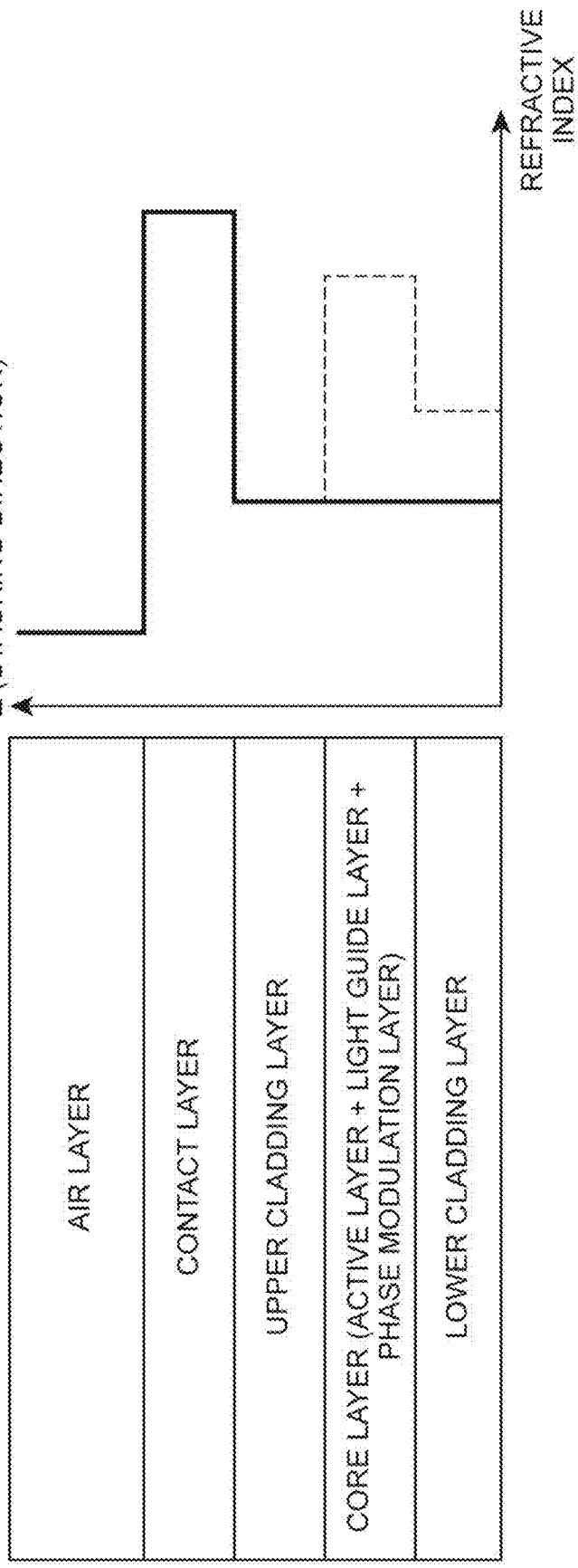

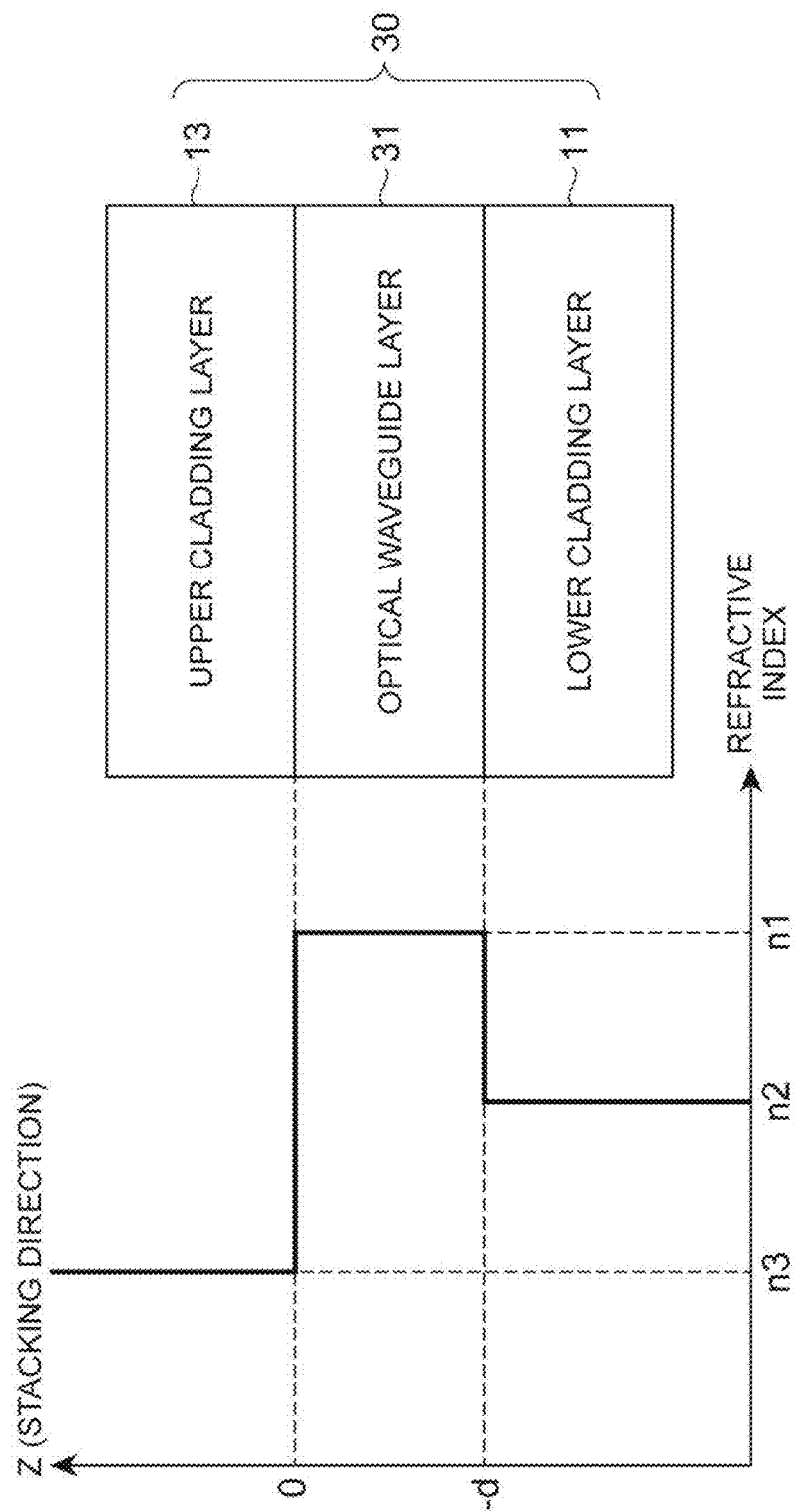

Fig.40

| LAYER NUMBER | CONDUCTIVITY TYPE | LAYER STRUCTURE | FILM THICKNESS (nm) | REFRACTIVE INDEX |
|---|---|---|---|---|
| 1 | — | AIR | ∞ | 1.00 |
| 2 | P TYPE | GaAs CONTACT LAYER | 100 | 3.55 |
| 3 | P TYPE | AlGaAs CLADDING LAYER | 700 | 3.12 |
| 4 | I TYPE | CORE LAYER (PHASE MODULATION + QUANTUM WELL + GUIDE LAYER) | 475 | 3.38 |
| 5 | N TYPE | AlGaAs CLADDING LAYER | 2000 | 3.27 |

Fig.41A

| WAVELENGTH | 940nm |
|---|---|
| $n_1$ | 3.38 |
| $n_2$ | 3.27 |
| $n_3$ | 3.12 |
| $a'$ | 1.40 |
| $n_{clad}$ | 3.12 |

Fig.41B

| ORDER | $V_1$ | FILM THICKNESS (nm) |
|---|---|---|
| 0 | 0.869 | 157 |
| 1 | 4.01 | 723 |

Fig.43A

| WAVELENGTH | 940nm |
|---|---|
| $n_4$ | 3.55 |
| $n_5$ | 3.12 |
| $n_6$ | 1.00 |
| a' | 3.04 |
| nclad | 3.27 |

Fig.43B

| b | $V_2$ | FILM THICKNESS (nm) |
|---|---|---|
| 0.335 | 2.17 | 192 |

Fig.46

| LAYER NUMBER | CONDUCTIVITY TYPE | LAYER STRUCTURE | FILM THICKNESS (nm) | REFRACTIVE INDEX |
|---|---|---|---|---|
| 1 | — | AIR | ∞ | 1.00 |
| 2 | P TYPE | GaInAsP(Eg=1.15eV) CONTACT LAYER | 100 | 3.35 |
| 3 | P TYPE | InP CLADDING LAYER | 1000 | 3.21 |
| 4 | I TYPE | PHASE MODULATION LAYER (GaInAsP (Eg = 1.0 eV)/CAVITY, CAVITY FF = 15%) | 300 | 3.20 |
| 5 | I TYPE | CORE LAYER (QUANTUM WELL + GUIDE LAYER) | 275 | 3.42 |
| 6 | N TYPE | InP CLADDING LAYER | ∞ | 3.21 |

Fig.47A

| WAVELENGTH | 1300nm |
|---|---|
| $n_1$ | 3.42 |
| $n_2$ | 3.21 |
| $n_3$ | 3.20 |
| a' | 0.0267 |
| $n_{clad}$ | 3.21 |

Fig.47B

| b | $V_2$ | FILM THICKNESS (nm) |
|---|---|---|
| 0 | 0.162 | 28 |
| 0 | 3.30 | 579 |

Fig.49A

| WAVELENGTH | 1300nm |
|---|---|
| $n_4$ | 3.35 |
| $n_5$ | 3.21 |
| $n_6$ | 1.00 |
| a' | 10.1 |
| $n_{clad}$ | 3.21 |

Fig.49B

| b | $V_2$ | FILM THICKNESS (nm) |
|---|---|---|
| 0 | 1.27 | 273 |

Fig.52

| LAYER NUMBER | CONDUCTIVITY TYPE | LAYER STRUCTURE | FILM THICKNESS (nm) | REFRACTIVE INDEX |
|---|---|---|---|---|
| 1 | – | AIR | ∞ | 1.00 |
| 2 | P TYPE | GaN CONTACT LAYER | 100 | 2.55 |
| 3 | P TYPE | AlGaN CLADDING LAYER | 600 | 2.53 |
| 4 | I/N TYPE | CORE LAYER (QUANTUM WELL + GUIDE LAYER) | 300 | 2.57 |
| 5 | N TYPE | PHASE MODULATION LAYER (GaN/CAVITY, CAVITY FF = 15%) | 100 | 2.39 |
| 6 | N TYPE | AlGaN CLADDING LAYER | ∞ | 2.54 |

Fig.53A

| WAVELENGTH | 405nm |
|---|---|
| $n_1$ | 2.57 |
| $n_2$ | 2.53 |
| $n_3$ | 2.39 |
| a' | 3.59 |
| $n_{clad}$ | 2.54 |

Fig.53B

| b | $V_1$ | FILM THICKNESS (nm) |
|---|---|---|
| 0.224 | 1.86 | 273 |
| 0.224 | 5.43 | 795 |

Fig.55A

| WAVELENGTH | 405nm |
|---|---|
| $n_4$ | 2.55 |
| $n_5$ | 2.53 |
| $n_6$ | 1.00 |
| a' | 40.8 |
| $n_{clad}$ | 2.54 |

Fig.55B

| b | $V_2$ | FILM THICKNESS (nm) |
|---|---|---|
| 0.33 | 2.51 | 445 |

LIGHT-EMITTING DEVICE AND PRODUCTION METHOD FOR SAME

TECHNICAL FIELD

The present invention relates to a light-emitting device and a production method for the same.

BACKGROUND ART

Patent Document 1 describes a technique relating to a semiconductor light-emitting element as a light-emitting device. The semiconductor light-emitting element includes an active layer, a pair of cladding layers sandwiching the active layer, and a phase modulation layer optically coupled to the active layer. The phase modulation layer has a base layer and a plurality of modified refractive index regions each of which has a refractive index different from a refractive index of the base layer. When an XYZ orthogonal coordinate system in which a thickness direction of the phase modulation layer is made coincide with a Z-axis direction is set, and a virtual square lattice with a lattice interval a is set on an X-Y plane corresponding to a design plane of the phase modulation layer, each of the modified refractive index regions is disposed so that each gravity-center position is shifted by a distance r from a lattice point in the virtual square lattice (the lattice point associated with any of the modified refractive index regions). The distance r satisfies $0 < r \leq 0.3a$.

CITATION LIST

Patent Literature

Patent Document 1: PCT International Application Publication No. 2016/148075

SUMMARY OF INVENTION

Technical Problem

As a result of examining the conventional light-emitting devices, the inventors have found out the following problems. That is, studies have been conducted regarding a light-emitting device, which outputs an arbitrary optical image by controlling a phase spectrum and an intensity spectrum of light outputted from a plurality of light-emitting points two-dimensionally arranged. One of the structures of such a light-emitting device is a structure including a phase modulation layer provided on a substrate. The phase modulation layer has a base layer and a plurality of modified refractive index regions each of which has a refractive index different from a refractive index of the base layer. When a virtual square lattice is set on a plane (design plane) orthogonal to the thickness direction of this phase modulation layer, each of the modified refractive index regions is arranged such that each of gravity-center positions is shifted from a position of a corresponding lattice point of the virtual square lattice according to an optical image that needs to be output. Such a light-emitting device is called static-integrable phase modulating (S-iPM) laser, and outputs light to form the optical image of an arbitrary shape in a direction inclined with respect to a normal direction of a main surface of the substrate.

Conventionally, as such a light-emitting device, there is known a light-emitting device in which each of gravity-center positions of modified refractive index regions is arranged in a state of being separated from a corresponding lattice point of a virtual square lattice so as to form a rotational angle according to an optical image that needs to be output about the corresponding lattice point as in the case of the semiconductor light-emitting element described in Patent Document 1. However, if it is possible to realize a novel light-emitting device in which the positional relationship between the gravity-center position of the modified refractive index region and the lattice point respectively associated with each other is different from the conventional one, the range of design of the phase modulation layer is expanded, which is extremely advantageous.

The invention has been made to solve the above-described problem, and an object thereof is to provide a light-emitting device and a production method for the same in which a positional relationship between a gravity-center position of a modified refractive index region and a lattice point associated with each other is different from the conventional one.

Solution to Problem

A light-emitting device according to the invention is a light-emitting device that outputs light to form an optical image in at least any one direction of a normal direction of a main surface and an inclination direction inclined with respect to the normal direction, and includes a structure for solving the above-described problems. That is, the light-emitting device includes: a substrate having the main surface; a light-emitting portion provided on the substrate; and a phase modulation layer provided on the substrate in a state of being optically coupled to the light-emitting portion. The phase modulation layer has a base layer and a plurality of modified refractive index regions each of which has a refractive index different from a refractive index of the base layer. When a virtual square lattice is set on a design plane of the phase modulation layer perpendicular to a thickness direction of the phase modulation layer, each of gravity-center positions of the plurality of the plurality of modified refractive index regions is arranged on a straight line that passes through the corresponding lattice point of the virtual square lattice and is inclined with respect to the square lattice. In addition, each distance between the gravity-center position of the modified refractive index region and the corresponding lattice point is individually set such that light forming an optical image is outputted from the light-emitting device.

Advantageous Effects of Invention

According to the invention, it is possible to provide the light-emitting device in which the positional relationship between the gravity-center position of the modified refractive index region and the lattice point associated with each other is different from the conventional light-emitting device.

BRIEF DESCRIPTION OF DRAWINGS

FIG. 6 is a plan view illustrating an example in which a refractive index substantially periodic structure is applied only within a specific region of the phase modulation layer.

FIGS. 9A and 9B are views for describing points to be noted when the phase distribution is obtained from a result of Fourier transform of the optical image and the arrangement of the modified refractive index regions is determined.

FIGS. 21A to 21K are views illustrating examples of the planar shapes of the modified refractive index regions on the X-Y plane (Part 3 thereof).

FIG. 27 is a table illustrating a layer structure when a semiconductor light-emitting element is made of a GaAs-based compound semiconductor (emission wavelength: 940 nm band).

FIG. 29 is a table illustrating a layer structure when a semiconductor light-emitting element is made of an InP-based compound semiconductor (emission wavelength: 1300 nm band).

FIG. 31 is a table illustrating a layer structure when a semiconductor light-emitting element is made of a nitride-based compound semiconductor (emission wavelength: 405 nm band).

FIGS. 37A and 37B are a cross-sectional view and a refractive index profile illustrating a three-layer slab structure related to an optical waveguide layer in the five-layer slab waveguide.

FIGS. 38A and 38B are a cross-sectional view and a refractive index profile illustrating a three-layer slab structure related to a contact layer in the five-layer slab waveguide.

FIG. 39A is a cross-sectional view illustrating a three-layer slab structure including the cladding layer 11, an optical waveguide layer 31, and a cladding layer 13, and FIG. 39B is a refractive index profile thereof.

FIG. 40 is a table illustrating an example of a five-layer slab structure when a semiconductor light-emitting element is made of a GaAs-based compound semiconductor.

FIG. 41A is a table illustrating the refractive indices $n_1$, $n_2$, and $n_3$, the asymmetric parameter a', and the refractive index $n_{clad}$ of the cladding layer 11 used for calculation, and FIG. 41B is a table illustrating calculation results of a lower limit value and an upper limit value.

FIG. 43A is a table illustrating the refractive indices $n_4$, $n_5$, and $n_6$, the asymmetric parameter a', and the refractive index $n_{clad}$ of the cladding layer 11 used for calculation, and FIG. 43B is a table illustrating a calculation result of an upper limit value.

FIG. 46 is a table illustrating an example of a six-layer slab structure when a semiconductor light-emitting element is made of an InP-based compound semiconductor.

FIG. 47A is a table illustrating the refractive indices $n_1$, $n_2$, and $n_3$, the asymmetric parameter a', and the refractive index $n_{clad}$ of the cladding layer 11 used for calculation, and FIG. 47B is a table illustrating calculation results of a lower limit value and an upper limit value.

FIG. 49A is a table illustrating the refractive indices $n_4$, $n_5$, and $n_6$, the asymmetric parameter a', and the refractive index $n_{clad}$ of the cladding layer 11 used for calculation, and FIG. 49B is a table illustrating a calculation result of an upper limit value.

FIG. 52 is a table illustrating an example of a six-layer slab structure when a semiconductor light-emitting element is made of a nitride-based compound semiconductor.

FIG. 53A is a table illustrating the refractive indices $n_1$, $n_2$, and $n_3$, the asymmetric parameter a', and the refractive index $n_{clad}$ of the cladding layer 11 used for calculation, and FIG. 53B is a table illustrating calculation results of a lower limit value and an upper limit value.

FIG. 55A is a table illustrating the refractive indices $n_4$, $n_5$, and $n_6$, the asymmetric parameter a', and the refractive index $n_{clad}$ of the cladding layer 11 used for calculation, and FIG. 55B is a table illustrating a calculation result of an upper limit value.

DESCRIPTION OF EMBODIMENTS

Figure 1:
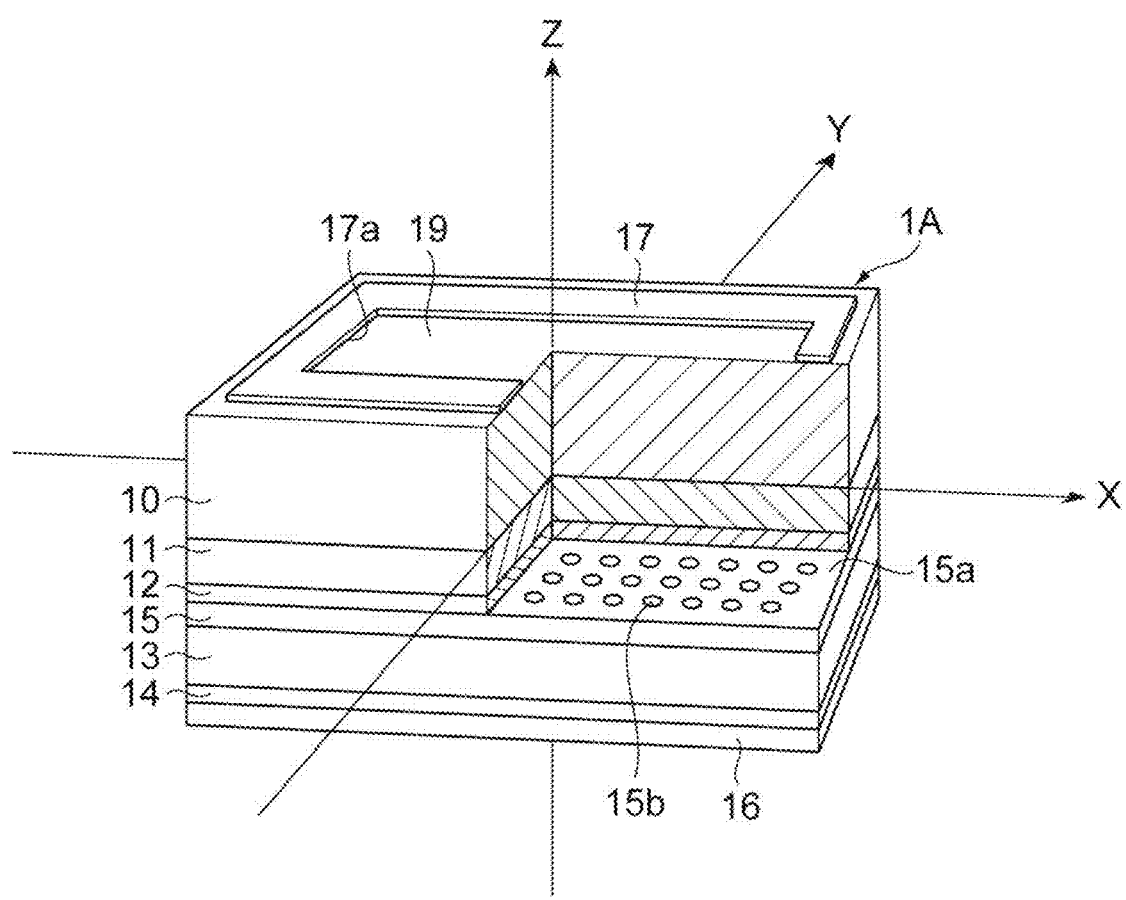
FIG. 1 is a perspective view illustrating a configuration of a semiconductor light-emitting element as a light-emitting device according to a first embodiment of the invention.

[Description of Embodiments of Invention of Present Application]

First, the content of embodiments of the invention of the present application will be individually listed and described.

(1) In a production method for a light-emitting device according to the present embodiment, the light-emitting device that needs to be produced includes at least a substrate, a light-emitting portion, and a phase modulation layer in order to output light to form an optical image in at least any one direction of a normal direction of a main surface and an inclination direction inclined with respect to the normal direction. The substrate has the main surface. The light-emitting portion is provided on the substrate. The phase modulation layer is provided on the substrate in a state of being optically coupled to the light-emitting portion. In addition, the phase modulation layer has a base layer and a plurality of modified refractive index regions each of which has a refractive index different from a refractive index of the base layer. When a virtual square lattice is set on a plane orthogonal to a thickness direction of the phase modulation layer, that is, a design plane of the phase modulation layer, each of the plurality of modified refractive index regions have gravity-center positions arranged on a straight line that passes through a lattice point of the virtual square lattice (a lattice point associated with any of the modified refractive index regions) and is inclined with respect to the square lattice. Each distance between the gravity-center position of the modified refractive index region and the corresponding lattice point is individually set such that light forming an optical image is outputted from the light-emitting device.

More specifically, each of the plurality of modified refractive index regions is arranged on the design plane of the phase modulation layer so as to have one-to-one correspondence to any lattice point of the virtual square lattice. At this time, among a plurality of valid lattice points associated with the plurality of modified refractive index regions among lattice points constituting the virtual square lattice, a line segment connecting an arbitrary specific lattice point and a gravity center of a specific modified refractive index region associated with the specific lattice point is parallel to each of line segments connecting each of a plurality of peripheral lattice points adjacent to the specific lattice point at the shortest distance and each gravity center of a plurality of peripheral modified refractive index regions respectively associated with the plurality of peripheral lattice points. peripheral modified refractive index regions respectively associated with the plurality of peripheral lattice points. More preferably, it is preferable that a line segment connecting any specific lattice point and a gravity center of a specific modified refractive index region associated with the specific lattice point among the plurality of valid lattice points be parallel to each of line segments connecting remaining valid lattice points excluding the specific lattice point and remaining modified refractive index regions respectively associated with the remaining valid lattice points.

In this light-emitting device, the gravity centers of the respective modified refractive index regions are arranged on the straight line that passes through the lattice point of the virtual square lattice and is inclined with respect to the square lattice. Then, each distance between the gravity center of the modified refractive index region and the corresponding lattice point is individually set such that light forming an optical image is outputted from the light-emitting device. According to such a structure, an optical image of an arbitrary shape can be outputted in a direction that is inclined with respect to the normal direction of the main surface of the substrate similarly to a conventional structure in which a gravity center of each modified refractive index region has a rotational angle according to an optical image about each lattice point. That is, it is possible to provide the light-emitting device in which a positional relationship between the gravity center of each of the modified refractive index regions and each of the lattice points is different from the conventional one.

(2) Specifically, a production method for a light-emitting device according to the present embodiment includes, as one aspect, a preparation step and a stacking step. In the preparation step, a substrate is prepared. In the stacking step, a light-emitting portion and a phase modulation layer optically coupled to the light-emitting portion are provided on a substrate. The stacking step includes at least a first step and a second step. In the first step, a base layer having a predetermined refractive index and constituting a part of the phase modulation layer is provided on the substrate. In the second step, a plurality of modified refractive index regions having a refractive index different from the refractive index of the base layer are provided in the base layer provided in the first step. The second step includes at least first to fourth setting steps and a region formation step.

Incidentally, a virtual square lattice is set on a design plane of the base layer orthogonal to a normal direction of a main surface of the substrate in the first setting step. The square lattice is defined by a plurality of first reference lines arranged in parallel to each other and a plurality of second reference lines arranged in parallel to each other in a state of being orthogonal to the plurality of first reference lines. In the second setting step, an intersection between any of the plurality of first reference lines and any of the plurality of second reference lines is specified as a reference lattice point serving as an arrangement reference of a modified refractive index region, selected from among the plurality of modified refractive index regions, among lattice points of the square lattice. In the third setting step, a virtual straight line passing through the reference lattice point and having a predetermined tilt angle with respect to the first reference line or the second reference line orthogonal at the reference lattice point is set on the design plane of the base layer. A gravity center of the selected modified refractive index region is arranged on this virtual straight line. In the fourth setting step, a distance on the virtual straight line from the reference lattice point to the gravity center of the selected modified refractive index region is set on the design plane of the base layer such that at least a part of the light forming the optical image is outputted. In the region formation step, the above-described second to fourth setting steps are repeated for each of the plurality of modified refractive index regions, thereby forming the plurality of modified refractive index regions in the base layer.

(3) As one aspect of the present embodiment, the second to fourth setting steps included in the second step may be performed under the same conditions for some modified refractive index regions among the plurality of modified refractive index regions. For example, the second to fourth setting steps may be performed with the tilt angle fixed for at least the selected modified refractive index region having the reference lattice point as an arrangement reference among the plurality of modified refractive index regions, and each of peripheral modified refractive index regions having lattice points adjacent to the reference lattice point at a shortest distance as arrangement references. In addition, as one aspect of the present embodiment, the second to fourth setting steps included in the second step may be performed with the tilt angle fixed for each of the plurality of modified refractive index regions.

(4) As one aspect of the present embodiment, a tilt angle based on a line segment connecting the reference lattice point and a lattice point adjacent to the reference lattice point is preferably an angle excluding 0°, 90°, 180° and 270°, the line segment included in the first reference line or the second reference line orthogonal at the reference lattice point. In addition, as one aspect of the present embodiment, a tilt angle based on a line segment connecting the reference lattice point and a lattice point adjacent to the reference lattice point is preferably 45°, 135°, 225°, or 315°, the line segment included in the first reference line or the second reference line orthogonal at the reference lattice point. As a result, four fundamental waves traveling along the square lattice (light traveling in a positive direction of an X-axis, light traveling in a negative direction of the X-axis, light traveling in a positive direction of a Y-axis, and light traveling in a negative direction of the Y-axis when each lattice point of the square lattice set on the X-Y plane is an origin) can evenly contribute to the optical image. Incidentally, when the tilt angle is 0°, 90°, 180°, or 270°, the straight line (virtual straight line passing through the lattice point) corresponds to the X-axis or the Y-axis of the square lattice. At this time, for example, when the tilt angle is 0° or 180° and the straight line extends along the X-axis, two traveling waves facing each other in a Y-axis direction among the four fundamental waves do not receive phase modulation, and thus, do not contribute to signal light. In addition, when the tilt angle is 90° or 270° and the straight line extends along the Y-axis, two traveling waves facing each other in the X-axis direction do not contribute to the signal light. Thus, when the tilt angle is 0°, 90°, 180°, or 270°, the generation efficiency of the signal light is degraded.

(5) As one aspect of the present embodiment, the light-emitting portion is preferably an active layer provided on the substrate. With this configuration, it is possible to optically couple the light-emitting portion and the phase modulation layer in an easy manner.

(6) As one aspect of the present embodiment, in a light-emitting device according to the present embodiment produced by the above-described production method, a plurality of modified refractive index regions are arranged at predetermined positions in a base layer according to an arrangement pattern for formation of an optical image. To be specific, when a virtual square lattice constituted by M1 (an integer of one or more)×N1 (an integer of one or more) unit constituent regions R each having a square shape is set on an X-Y plane in an XYZ orthogonal coordinate system defined by a Z-axis coinciding with a normal direction of a main surface of a substrate and the X-Y plane including an X-axis and a Y-axis orthogonal to each other and coinciding with a design plane of a phase modulation layer (for example, one surface of the phase modulation layer including the plurality of modified refractive index regions), the arrangement pattern is defined such that a gravity center G of a modified refractive index region positioned inside a unit constituent region R(x, y) is separated from a lattice point O(x, y), which is a center of the unit constituent region R(x, y), by a distance r and a vector from the lattice point O(x, y) to the gravity center G is directed in a specific direction in the unit constituent region R(x, y) on the X-Y plane specified by a coordinate component x (an integer of from 1 to M1) in an X-axis direction and a coordinate component y (an integer of from 1 to N1) in a Y-axis direction. In addition, the specific direction is defined by a tilt angle of a straight line passing through the lattice point O(x, y) with respect to the X-axis.

(7) As one aspect of the present embodiment, in a plurality of valid unit constituent regions in which a plurality of modified refractive index regions are arranged among the M1×N1 unit constituent regions R, a tilt angle of a straight line (virtual straight line passing through the lattice point) set in a specific unit constituent region included in the plurality of valid unit constituent regions may coincide with a tilt angle of a straight line set in each of adjacent unit constituent regions sharing one side with the specific unit constituent region. Further, in a plurality of valid unit constituent regions in which the plurality of modified refractive index regions are respectively arranged among the M1×N1 unit constituent regions R, a tilt angle of the straight line set in a specific unit constituent region included in the plurality of valid unit constituent regions may coincide with a tilt angle of a straight line set in each of remaining valid unit constituent regions excluding the specific unit constituent region.

(8) As one aspect of the present embodiment, a tilt angle based on a part of a line segment (line segment parallel to the X-axis) starting from the lattice point O(x, y) is preferably an angle excluding 0°, 90°, 180°, and 270°. In addition, as one aspect of the present embodiment, the tilt angle based on a part of a line segment (line segment parallel to the X-axis) starting from the lattice point O(x, y) is preferably 45°, 135°, 225°, or 315°. This is because the generation efficiency of the signal light is degraded when the tilt angle is 0°, 90°, 180°, or 270° as described above.

As described above, each aspect listed in [Description of Embodiments of Invention of Present Application] can be applied to each of the remaining aspects or to all the combinations of these remaining aspects.

[Details of Embodiments of Invention of Present Application]

Hereinafter, specific examples of a light-emitting device and a production method for the same according to the present embodiments will be described in detail with reference to the accompanying drawings. Incidentally, the invention is not limited to these examples, but is illustrated by the claims, and equivalence of and any modification within the scope of the claims are intended to be included therein. In addition, the same elements in the description of the drawings will be denoted by the same reference signs, and redundant descriptions will be omitted.

First Embodiment

FIG. 1 is a perspective view illustrating a configuration of a semiconductor light-emitting element 1A as a light emitting device according to a first embodiment of the invention. Incidentally, an XYZ orthogonal coordinate system having an axis, which passes through a center of the semiconductor light-emitting element 1A and extends in a thickness direction of the semiconductor light-emitting element 1A, as a Z-axis is defined. The semiconductor light-emitting element 1A is an S-iPM laser that forms a standing wave along an X-Y plane and outputs a phase-controlled plane wave in a Z-axis direction, and outputs light to form a two-dimensional optical image having an arbitrary shape in at least any one direction of a normal direction of a main surface 10a of a semiconductor substrate (substrate) 10 (that is, the Z-axis direction) and an inclination direction inclined with respect to the normal direction as will be described later.

Figure 2:
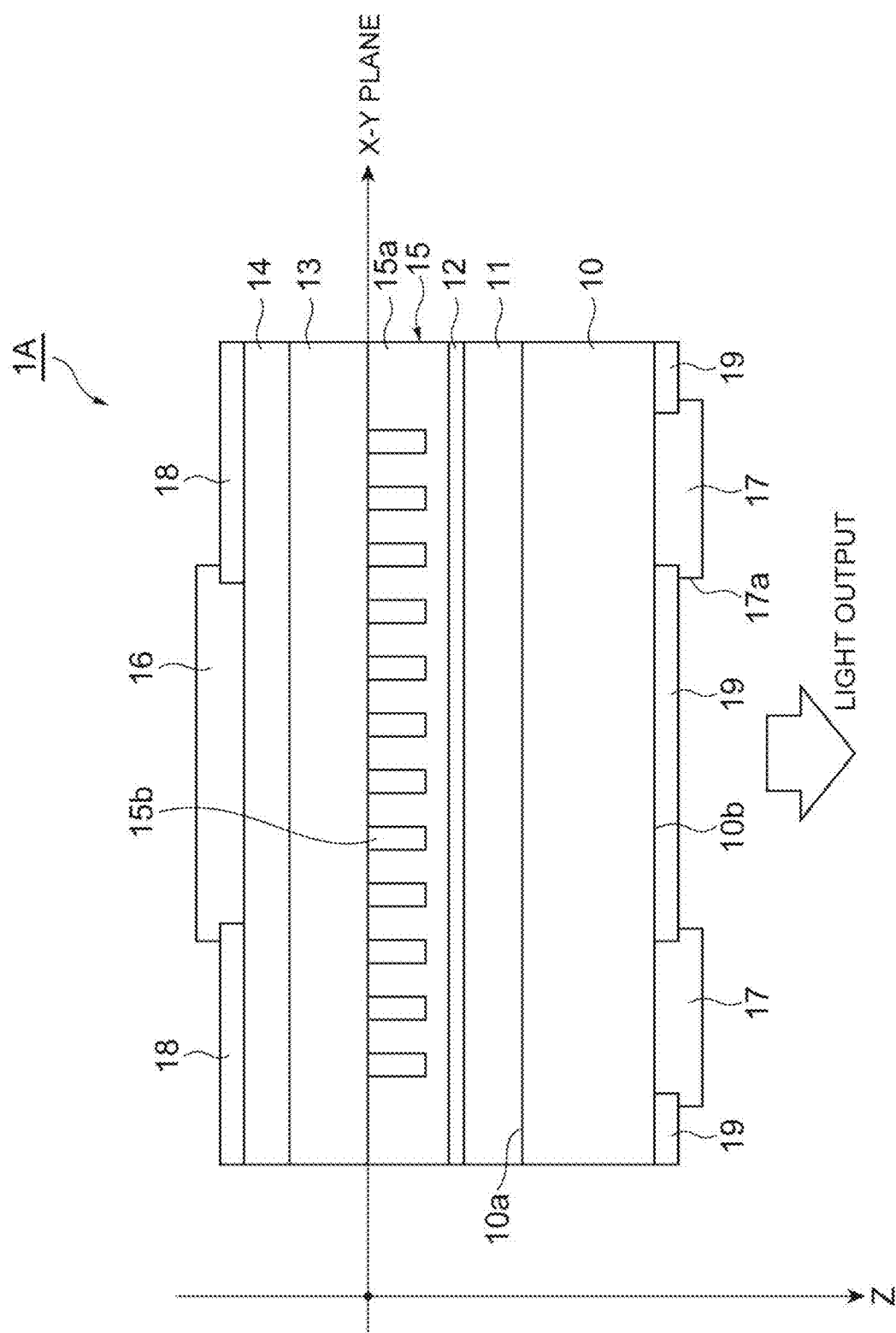
FIG. 2 is a cross-sectional view illustrating a stacked structure of the semiconductor light-emitting element.

FIG. 2 is a cross-sectional view illustrating a stacked structure of the semiconductor light-emitting element 1A. As illustrated in FIGS. 1 and 2, the semiconductor light-emitting element 1A includes: an active layer 12 serving as a light-emitting portion provided on the semiconductor substrate 10; a pair of cladding layers 11 and 13 sandwiching the active layer 12; and a contact layer 14 provided on the cladding layer 13. The semiconductor substrate 10 and the respective layers 11 to 14 are configured using a compound semiconductor, for example, a GaAs-based semiconductor, an InP-based semiconductor, or a nitride-based semiconductor. An energy band gap of the cladding layer 11 and an energy band gap of the cladding layer 13 are larger than an energy band gap of the active layer 12. Thickness directions of the semiconductor substrate 10 and the respective layers 11 to 14 coincide with the Z-axis direction.

In addition, the semiconductor light-emitting element 1A further includes a phase modulation layer 15 optically coupled to the active layer 12. In the present embodiment, the phase modulation layer 15 is provided between the active layer 12 and the cladding layer 13. A light guide layer may be provided at least one of between the active layer 12 and the cladding layer 13 and between the active layer 12 and the cladding layer 11 if necessary. When the light guide layer is provided between the active layer 12 and the cladding layer 13, the phase modulation layer 15 is provided between the cladding layer 13 and the light guide layer. The thickness direction of the phase modulation layer 15 coincides with the Z-axis direction. Incidentally, a light guide layer may include a carrier barrier layer configured to efficiently confine carriers in the active layer 12.

Figure 3:
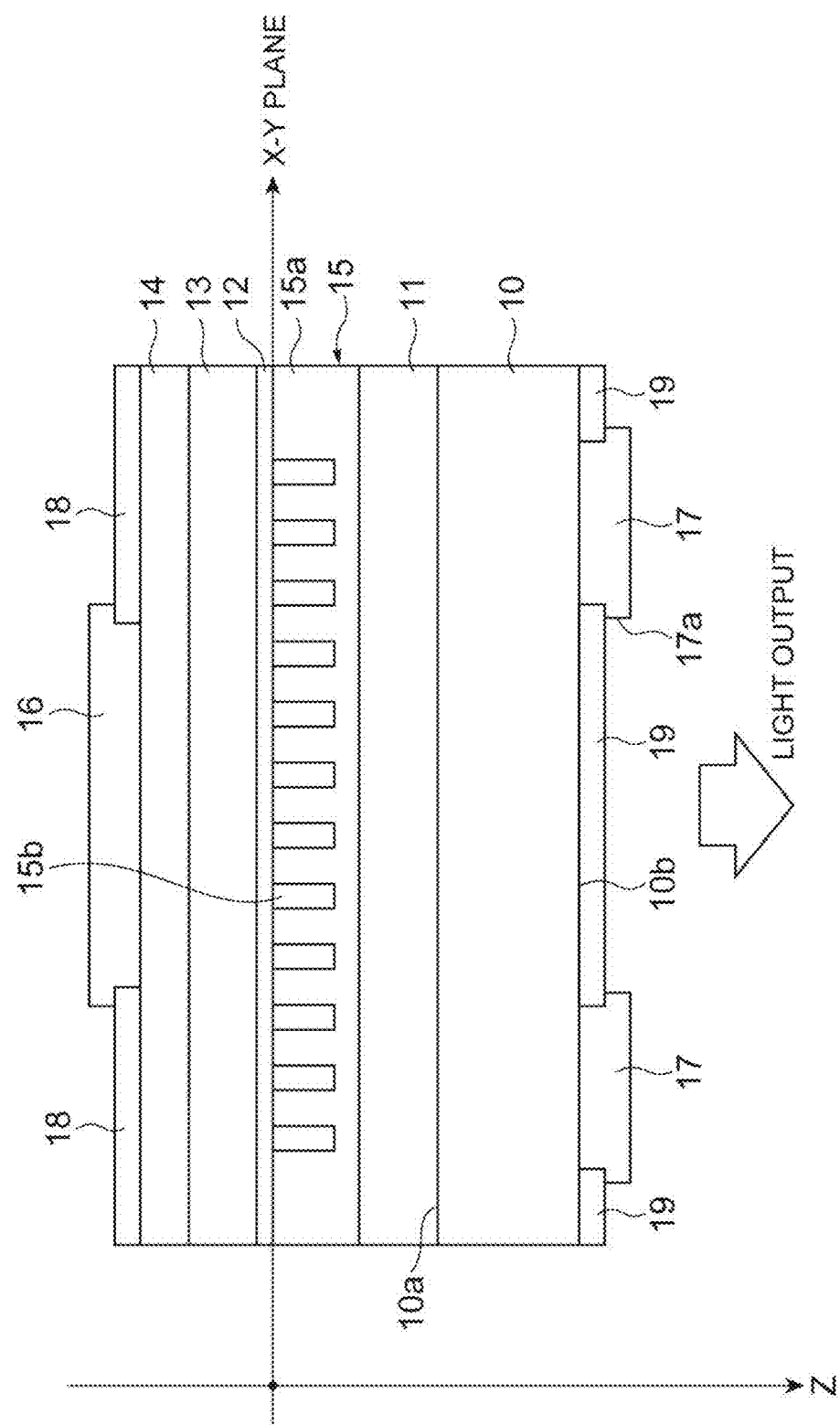
FIG. 3 is a view illustrating the stacked structure of the semiconductor light-emitting element in a case where a phase modulation layer is provided between a cladding layer 11 and an active layer 12.

As illustrated in FIG. 3, the phase modulation layer 15 may be provided between the cladding layer 11 and the active layer 12. Further, when the light guide layer is provided between the active layer 12 and the cladding layer 11, the phase modulation layer 15 is provided between the cladding layer 11 and the light guide layer.

The phase modulation layer 15 includes a base layer 15a and a plurality of modified refractive index regions 15b existing in the base layer 15a. The base layer 15a is made of a first refractive index medium, and each of the plurality of modified refractive index regions 15b is made of a second refractive index medium having a refractive index different from that of the first refractive index medium. The plurality of modified refractive index regions 15b include a substantially periodic structure. When an effective refractive index of the phase modulation layer 15 is n, a wavelength $\lambda_0$ (=a×n, a is a lattice interval) selected by the phase modulation layer 15 is included within an emission wavelength range of the active layer 12. The phase modulation layer 15 can select the wavelength $\lambda_0$ out of the emission wavelength of the active layer 12 and output light of the selected wavelength to the outside. The laser light incident into the phase modulation layer 15 forms a predetermined mode corresponding to the arrangement of the modified refractive index regions 15b in the phase modulation layer 15. Eventually, the laser light is outputted to the outside from the surface of the semiconductor light-emitting element 1A as a laser beam having a desired pattern.

The semiconductor light-emitting element 1A further includes an electrode 16 provided on the contact layer 14 and an electrode 17 provided on a rear surface 10b of the semiconductor substrate 10. The electrode 16 is in ohmic contact with the contact layer 14, and the electrode 17 is in ohmic contact with the semiconductor substrate 10. The electrode 17 has an opening 17a. The electrode 16 is provided in a central region of the contact layer 14. A portion other than the electrode 16 on the contact layer 14 is covered with a protective film 18 (see FIG. 2). Incidentally, the contact layer 14 that is not in contact with the electrode 16 may be removed. A portion of the rear surface 10b of the semiconductor substrate 10 other than the electrode 17 (including the inside of the opening 17a) is covered with an anti-reflection film 19. The anti-reflection film 19 in a region other than the opening 17a may be removed.

When a drive current is supplied between the electrode 16 and the electrode 17, recoupling between electrons and holes occurs in the active layer 12, and light is generated in the active layer 12. The electrons and holes contributing to the light emission and the generated light are efficiently confined between the lower cladding layer 11 and the upper cladding layer 13.

The light outputted from the active layer 12 enters the inside of the phase modulation layer 15, and forms a predetermined mode corresponding to a lattice structure inside the phase modulation layer 15. Laser light outputted from the phase modulation layer 15 is directly outputted from the rear surface 10b to the outside of the semiconductor light-emitting element 1A through the opening 17a or is reflected by the electrode 16 and then is outputted from the rear surface 10b to the outside of the semiconductor light-emitting element 1A through the opening 17a. At this time, 0th-order light included in the laser light is outputted in the direction (the normal direction of the main surface 10a) perpendicular to the main surface 10a. On the other hand, the signal light included in the laser light is outputted in at least any one direction of the normal direction of the main surface 10a and the inclination direction inclined with respect to the normal direction so as to form a two-dimensional optical image having an arbitrary shape. It is the signal light that forms a desired optical image.

As an example, the semiconductor substrate 10 is a GaAs substrate, and each of the cladding layer 11, the active layer 12, the cladding layer 13, the contact layer 14, and the phase modulation layer 15 is a compound semiconductor layer constituted by elements contained in the group III element and the group V element. Specifically, for example, the cladding layer 11 is made of AlGaAs. The active layer 12 has a multiple quantum well structure (barrier layer: AlGaAs/well layer: InGaAs). In the phase modulation layer 15, the base layer 15a is made of GaAs, and the modified refractive index region 15b is a depression (may be a hole). The cladding layer 13 is made of AlGaAs. The contact layer 14 is made of GaAs.

Incidentally, a multiple quantum well structure of the active layer 12 is a structure in which a barrier layer and a well layer are alternately stacked, the barrier layer is made of AlGaAs, and the well layer is made of InGaAs.

An energy band gap and a refractive index of AlGaAs can be easily changed by changing a composition ratio of Al. Regarding $Al_xGa_{1-x}As$, when a composition ratio x of Al having a relatively small atomic radius is decreased (increased), the energy band gap having a positive correlation with the composition ratio x decreases (increases). In addition, the energy band gap decreases even in InGaAs obtained by mixing In having a large atomic radius with GaAs. That is, the Al composition ratio of the cladding layers 11 or 13 is larger than the Al composition ratio of the barrier layer (AlGaAs) of the active layer 12. The Al composition ratio of the cladding layers 11 or 13 is set to, for example, 0.2 to 1.0 (for example, 0.4). The Al composition ratio of the barrier layer of the active layer 12 is set to, for example, 0 to 0.3 (for example, 0.15).

Incidentally, noise light having a mesh-like dark portion is superimposed on a beam pattern outputted from the semiconductor light-emitting element 1A and corresponding to an optical image in some cases. According to studies of the inventors, the noise light having the mesh-like dark portion is caused by a higher-order mode in the stacking direction inside the semiconductor light-emitting element 1A. Here, a fundamental mode in the stacking direction means a mode having an intensity distribution in which one peak exists over a region including the active layer 12 and sandwiched between the cladding layers 11 and 13. In addition, the higher-order mode means a mode having an intensity distribution in which two or more peaks exist. Incidentally, the peak of the intensity distribution in the fundamental mode is formed in the vicinity of the active layer 12, whereas the peak in the intensity distribution in the higher-order mode is formed also in the cladding layer 11, the cladding layer 13, the contact layer 14, and the like. In addition, there are a guided mode and a leakage mode as modes in the stacking direction, but the leakage mode does not exist stably. Therefore, only the guided mode will be focused in the following description. In addition, the guided mode includes a TE mode in which an electric field vector exists in a direction along the X-Y plane and a TM mode in which an electric field vector exists in a direction perpendicular to the X-Y plane, but only the TE mode will be focused on in the following description. When the refractive index of the cladding layer 13 between the active layer 12 and the contact layer is higher than the refractive index of the cladding layer 11 between the active layer 12 and the semiconductor substrate, the higher-order mode as described above is significantly generated. Normally, the refractive indexes of the active layer 12 and the contact layer 14 are much higher than the refractive indexes of the cladding layers 11 and 13. Therefore, when the refractive index of the cladding layer 13 is higher than the refractive index of the cladding layer 11, light is confined also in the cladding layer 13, thereby forming the guided mode. This results in generation of the higher-order mode.

In the semiconductor light-emitting element 1A of the present embodiment, the refractive index of the cladding layer 13 is equal to or lower than the refractive index of the cladding layer 11. As a result, the generation of the higher-order mode as described above can be suppressed, and the noise light having the mesh-like dark portion superimposed on the beam pattern can be reduced.

Here, a preferable thickness of an optical waveguide layer including the active layer 12 will be described. Assuming that an optical waveguide layer includes only the active layer 12 (the optical waveguide layer does not include the cladding layer 11, the cladding layer 13, and the phase modulation layer 15) in a case where the refractive index of the phase modulation layer 15 is lower than the refractive index of the cladding layer 11 as a premise, and a three-layer slab waveguide structure including such an optical waveguide layer and two upper and lower layers adjacent to the optical waveguide layer is considered. On the other hand, assuming that an optical waveguide layer includes the phase modulation layer 15 and the active layer 12 (does not include the cladding layer 11 and the cladding layer 13) in a case where the refractive index of the phase modulation layer 15 is equal to or higher than the refractive index of the cladding layer 11, and a three-layer slab waveguide structure including such an optical waveguide layer and two upper and lower layers adjacent to the optical waveguide layer is considered. Incidentally, a guided mode in a layer thickness direction is the TE mode. At this time, a normalized waveguide width $V_1$ of the optical waveguide layer and a normalized propagation constant b of the TE mode are defined by the following Formula (1).

$$V_1 = \frac{1}{\sqrt{1-b}}\left[\tan^{-1}\sqrt{\frac{b}{1-b}} + \tan^{-1}\sqrt{\frac{b+a'}{1-b}} + N_1\pi\right] \quad (1)$$

However, when a guided mode is formed in the optical waveguide layer (the mode order is $N_1$), an equivalent refractive index of the TE mode needs to be higher than the refractive index of the cladding layer 11 in order for the guided mode not to leak to the semiconductor substrate 10 through the cladding layer 11, and the normalized propagation constant b needs to satisfy the following Formula (2).

$$b \geq \frac{n_{clad}^2 - n_2^2}{n_1^2 - n_2^2} \quad (2)$$

At this time, there is a single mode guided through the optical waveguide layer if the normalized waveguide width $V_1$ that satisfies Formulas (1) and (2) falls within a range having only one solution. Here, a' and b respectively represent an asymmetric parameter and the normalized propagation constant in the three-layer slab waveguide, and are real numbers that satisfy the following Formulas (3) and (4), respectively. Incidentally, in Formulas (3) and (4), $n_{clad}$ is a refractive index of the cladding layer 11, $n_1$ is a refractive index of an optical waveguide layer including the active layer 12, $n_2$ is a refractive index of a layer having a higher refractive index between layers adjacent to the optical waveguide layer, $n_3$ is a refractive index of a layer having a lower refractive index between the layers adjacent to the optical waveguide layer, and $n_{eff}$ is an equivalent refractive index of the TE mode for the three-layer slab waveguide structure including the optical waveguide layer and two upper and lower layers adjacent to the optical waveguide layer.

$$a' = \frac{n_2^2 - n_3^2}{n_1^2 - n_2^2} \quad (3)$$

$$B = \frac{n_{eff}^2 - n_2^2}{n_1^2 - n_2^2} \quad (4)$$

According to the studies of the inventors, it has been found that a higher-order mode is also generated in the optical waveguide layer (high refractive index layer) including the active layer 12. Then, the inventors have found that the higher-order mode can be suppressed by appropriately controlling the thickness and the refractive index of the optical waveguide layer. That is, as a value of the normalized waveguide width $V_1$ of the optical waveguide layer satisfies the above conditions, the generation of the higher-order mode is further suppressed, and the noise light having the mesh-like dark portion superimposed on the beam pattern can be further reduced.

A preferable thickness of the contact layer 14 is as follows. That is, in a three-layer slab waveguide structure including the contact layer 14 and two upper and lower layers adjacent to the contact layer 14, a normalized waveguide width $V_2$ and a normalized propagation constant b of the TE mode are defined by the following Formula (5).

$$V_2 = \frac{1}{\sqrt{1-b}} \left[ \tan^{-1} \sqrt{\frac{b}{1-b}} + \tan^{-1} \sqrt{\frac{b+a'}{1-b}} + N_2 \pi \right] \quad (5)$$

However, when a guided mode is formed in the contact layer (the mode order is N2), an equivalent refractive index of the TE mode needs to be higher than the refractive index of the cladding layer 11 in order for the guided mode not to leak to the semiconductor substrate 10 through the cladding layer 11, and the normalized propagation constant b needs to satisfy the following Formula (6).

$$b \geq \frac{n_{clad}^2 - n_5^2}{n_4^2 - n_5^2} \quad (6)$$

At this time, if the normalized waveguide width $V_2$ that satisfies Formulas (5) and (6) falls within a range having no solution, there is no mode guided through the contact layer 14 even including the fundamental mode.

Here, a' and b respectively represent an asymmetric parameter and the normalized propagation constant in the three-layer slab waveguide, and are real numbers that satisfy the following Formulas (7) and (8), respectively. Incidentally, in Formulas (7) and (8), $n_4$ is a refractive index of the contact layer 14, $n_5$ is a refractive index of a layer having a higher refractive index between the layers adjacent to the contact layer 14, $n_6$ is a refractive index of a layer having a lower refractive index between the layers adjacent to the contact layer 14, and $n_{eff}$ is an equivalent refractive index of the TE mode for the three-layer slab waveguide structure including the contact layer 14 and the two adjacent upper and lower layers.

$$a' = \frac{n_5^2 - n_6^2}{n_4^2 - n_5^2} \quad (7)$$

$$b = \frac{n_{eff}^2 - n_5^2}{n_4^2 - n_5^2} \quad (8)$$

As described above, the generation of the guided mode due to the contact layer 14 is suppressed by appropriately controlling the thickness of the contact layer 14, and the generation of the higher-order mode in the semiconductor light-emitting element can be further suppressed.

As another example, the semiconductor substrate 10 is an InP substrate, and each of the cladding layer 11, the active layer 12, the phase modulation layer 15, the cladding layer 13, and the contact layer 14 is made of, for example, an InP-based compound semiconductor.

Specifically, for example, the cladding layer 11 is made of InP. The active layer 12 has a multiple quantum well structure (barrier layer: GaInAsP/well layer: GaInAsP). In the phase modulation layer 15, the base layer 15a is made of GaInAsP, and the modified refractive index region 15b is a depression (may be a hole). The cladding layer 13 is made of InP. The contact layer 14 is made of GaInAsP.

In addition, as still another example, the semiconductor substrate 10 is a GaN substrate, and each of the cladding layer 11, the active layer 12, the phase modulation layer 15, the cladding layer 13, and the contact layer 14 is made of, for example, a nitride-based compound semiconductor. Specifically, for example, the cladding layer 11 is made of AlGaN. The active layer 12 has a multiple quantum well structure (barrier layer: InGaN/well layer: InGaN). In the phase modulation layer 15, the base layer 15a is made of GaN, and the modified refractive index region 15b is a depression (may be a hole). The cladding layer 13 is made of AlGaN. The contact layer 14 is made of GaN.

A conductivity type which is the same as that of the semiconductor substrate 10 is given to the cladding layer 11, and a conductivity type opposite to that of the semiconductor substrate 10 is given to the cladding layer 13 and the contact layer 14. For example, the semiconductor substrate 10 and the cladding layer 11 are an n-type and the cladding layer 13 and the contact layer 14 are a p-type. When provided between the active layer 12 and the cladding layer 11, the phase modulation layer 15 has the same conductivity type as the semiconductor substrate 10. On the other hand, when provided between the active layer 12 and the cladding layer 13, the phase modulation layer 15 has a conductivity type opposite to that of the semiconductor substrate 10. Incidentally, an impurity concentration is, for example, $1 \times 10^{17}$ to $1 \times 10^{21}/cm^3$. The active layer 12 is intrinsic (i-type) which is not intentionally doped with any impurity, and an impurity concentration thereof is $1 \times 10^{15}/cm^3$ or less. In addition, an impurity concentration of the phase modulation layer 15 may be intrinsic (i-type) in a case where it is necessary to suppress the influence of loss caused by light absorption via the impurity level, or the like.

The thickness of the semiconductor substrate 10 is, for example, 150 μm. The thickness of the cladding layer 11 is, for example, 2000 nm. The thickness of the active layer 12 is, for example, 175 nm. The thickness of the phase modulation layer 15 is, for example, 280 nm. The depth of the modified refractive index region 15b is, for example, 200 nm. The thickness of the cladding layer 13 is, for example, 2000 nm. The thickness of the contact layer 14 is, for example, 150 nm.

Although the modified refractive index region 15b is the depression (or hole) in the above structure, the modified refractive index region 15b may be formed by embedding a semiconductor having a refractive index different from the refractive index of the base layer 15a in the depression. In such a case, for example, a hole or depression that is to serve as the base layer 15a may be formed by etching, and then, the semiconductor may be embedded in the hole or depression using a metal organic chemical vapor deposition method, a sputtering method, or an epitaxial method. For example, when the base layer 15a is made of GaAs, the modified refractive index region 15b may be made of AlGaAs. In addition, the modified refractive index region 15b may be formed by embedding the semiconductor in the depression of the base layer 15a, and then, the same semiconductor as the modified refractive index region 15b may be further deposited thereon. Incidentally, when the modified refractive index region 15b is a depression (or a hole), the depression may be filled with an inert gas such as argon, nitrogen, hydrogen, or air.

The anti-reflection film 19 is made of a dielectric single layer film such as silicon nitride (for example, SiN) and silicon oxide (for example, $SiO_2$), or a dielectric multilayer film. For example, it is possible to use a film, obtained by stacking two or more types of dielectric layers selected from a dielectric layer group consisting of titanium oxide ($TiO_2$), silicon dioxide ($SiO_2$), silicon monoxide (SiO), niobium oxide ($Nb_2O_5$), tantalum pentoxide ($Ta_2O_5$), magnesium fluoride ($MgF_2$), titanium oxide ($TiO_2$), aluminum oxide ($Al_2O_3$), cerium oxide ($CeO_2$), indium oxide ($In_2O_3$), zirconium oxide ($ZrO_2$), and the like, as the dielectric multilayer film. For example, a film having a thickness of λ/4 as an optical film thickness for light of a wavelength λ is stacked. In addition, the protective film 18 is an insulating film such as silicon nitride (for example, SiN) and silicon oxide (for example, $SiO_2$). When the semiconductor substrate 10 and the contact layer 14 are made of a GaAs-based semiconductor, the electrode 16 can be made of a material containing at least one of Cr, Ti, and Pt and Au, and has, for example, a stacked structure of a Cr layer and an Au layer. The electrode 17 can be made of a material containing at least one of AuGe and Ni and Au, and has, for example, a stacked structure of an AuGe layer and an Au layer. Incidentally, the materials of the electrodes 16 and 17 are not limited to these ranges as long as ohmic junction can be realized.

Incidentally, a production method for a light-emitting device according to the present embodiment includes: a preparation step of preparing the semiconductor substrate 10; and a stacking step of providing a plurality of layers including the active layer 12 as a light-emitting portion, the phase modulation layer 15 optically connected to the active layer 12, and the like on the semiconductor substrate 10 in order to produce the semiconductor light-emitting element 1A as the light-emitting device. In addition, the stacking step includes a first step of forming the base layer 15a constituting a part of the phase modulation layer 15, and a second step of providing the plurality of modified refractive index regions 15b in the base layer 15a, as steps for formation of the phase modulation layer 15. In addition, as will be described later, the second step includes: a first setting step of setting a virtual square lattice; a second setting step of specifying a reference lattice point serving as an arrangement reference of the selected modified refractive index region 15b; a third setting step of setting a virtual straight line on which a gravity center G of the selected modified refractive index region 15b is arranged; a fourth setting step of setting a distance on the virtual straight line from the reference lattice point to the gravity center of the selected modified refractive index region 15b; and a region formation step of repeating the second to fourth setting steps for each of the plurality of modified refractive index regions 15b, and then, forming the plurality of modified refractive index regions 15b in the base layer 15a.

Figure 4:
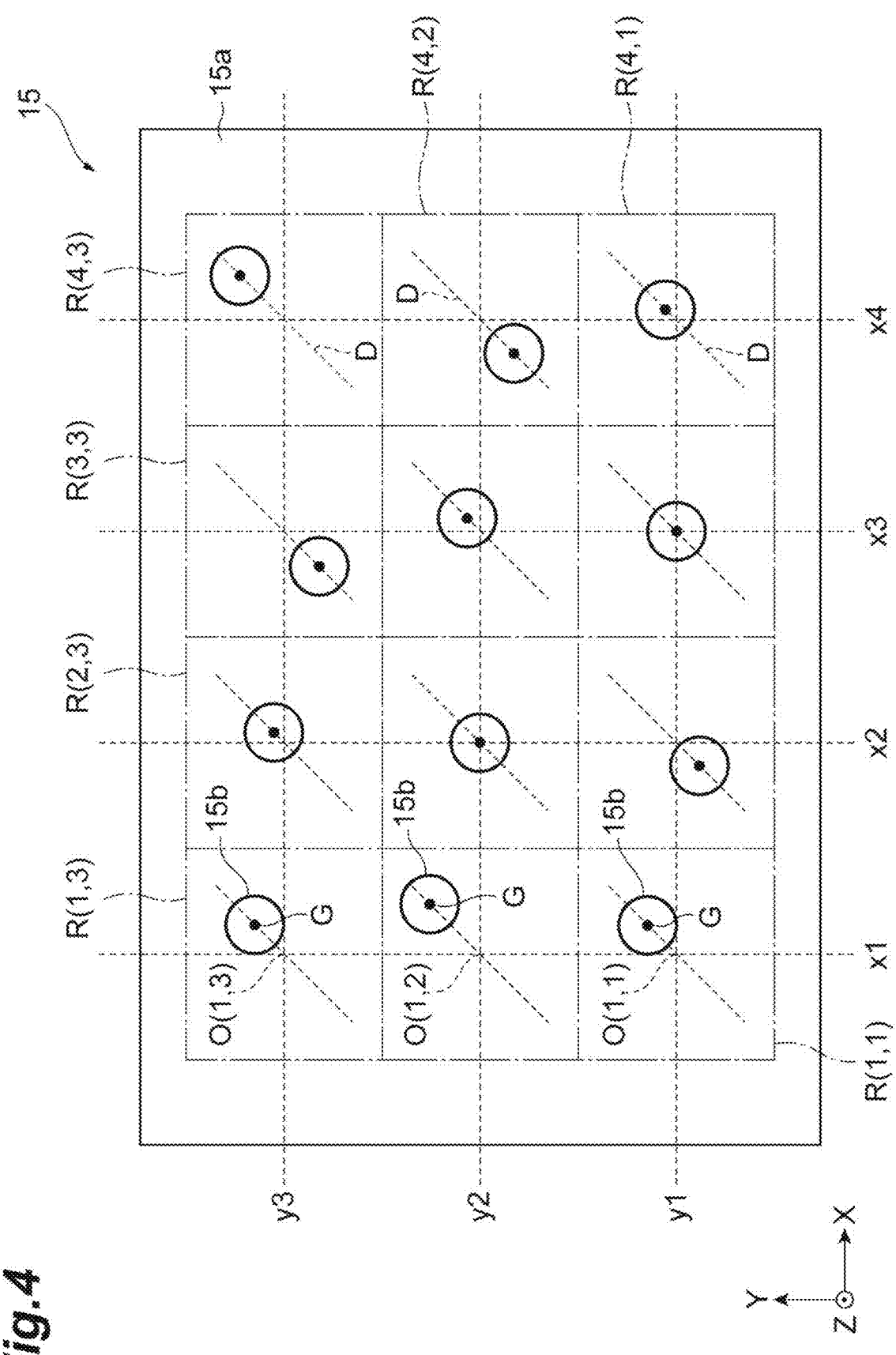
FIG. 4 is a plan view of the phase modulation layer.

FIG. 4 is a plan view of the phase modulation layer 15. This phase modulation layer 15 is obtained through the above-described second step. That is, the phase modulation layer 15 includes the base layer 15a and the modified refractive index regions 15b. The base layer 15a is made of the first refractive index medium, and the modified refractive index region 15b is made of the second refractive index medium having the refractive index different from that of the first refractive index medium. Here, the virtual square lattice is set on a design plane of the phase modulation layer 15 that coincides with the X-Y plane (the first setting step). One side of the square lattice is parallel to the X-axis and the other side is parallel to the Y-axis. At this time, unit constituent regions R each of which has a square shape with a lattice point O of the square lattice as the center thereof can be set two-dimensionally over a plurality of columns (first reference lines x1 to x4) arranged in parallel along the X-axis and a plurality of rows (second reference lines y1 to y3) arranged in parallel along the Y-axis. If a coordinate of each of the unit constituent regions R is given as a gravity-center position of each of the unit constituent regions R, this gravity-center position coincides with the lattice point O of the virtual square lattice. The modified refractive index regions 15b are provided one by one in each of the unit constituent regions R. A planar shape of the modified refractive index region 15b is, for example, a circular shape. The lattice point O may be positioned outside the modified refractive index region 15b or may be included in the modified refractive index region 15b.

Incidentally, a ratio of the area S of the modified refractive index region 15b occupying within one unit constituent region R is referred to as a filling factor (FF). When a lattice interval of the square lattice is a, the filling factor FF of the modified refractive index region 15b is given as $S/a^2$. Here, S is the area of the modified refractive index region 15b on the X-Y plane, and is given as $S=\pi(DA/2)^2$ using a diameter DA of a perfect circle when the shape of the modified refractive index region 15b is the perfect circle, for example. In addition, when the shape of the modified refractive index region 15b is a square shape, $S=LA^2$ is given using a length LA of one side of the square.

Figure 5:
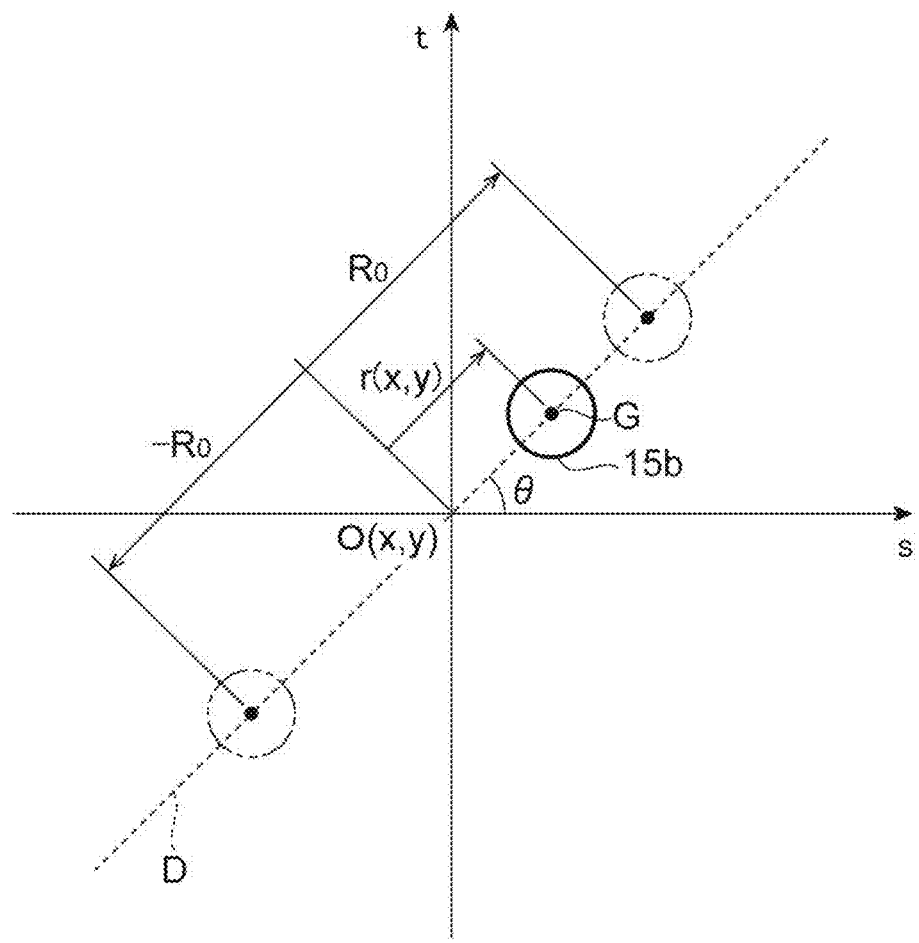
FIG. 5 is a view illustrating a positional relationship of modified refractive index regions in the phase modulation layer.

FIG. 5 is a graph for describing a positional relationship of the gravity center G of the modified refractive index region 15b and the lattice point O(x, y) in the virtual square lattice as an example of the arrangement pattern determined by the present embodiment (on-axis shift scheme). For example, the lattice point O(x, y) illustrated in FIG. 5 corresponds to the reference lattice point specified in the second setting step. As illustrated in FIG. 5, the gravity center G of each of the modified refractive index regions 15b is arranged on a straight line D. Incidentally, the straight line D corresponds to the virtual straight line set in the third setting step, and the straight line D is the straight line that passes through the corresponding lattice point O(x, y) of the unit constituent region R(x, y) and is inclined with respect to each side of the square lattice. In other words, the straight line D is a straight line that is inclined with respect to both an s-axis (parallel to the X-axis) and a t-axis (parallel to the Y-axis) that define the unit constituent region R(x, y). A tilt angle of the straight line D with respect to the s-axis (the tilt angle based on a part of the s-axis starting from a lattice point) is θ. The tilt angle θ is constant in the phase modulation layer 15 (may be partially constant in the phase modulation layer 15). The tilt angle θ satisfies 0°<θ<90°, and in one example, θ=45°. Alternatively, the tilt angle θ satisfies 180°<θ<270°, and in one example, θ=225°. When the tilt angle θ satisfies 0°<θ<90° or 180°<θ<270°, the straight line D extends from the first quadrant to the third quadrant of the coordinate plane defined by the s-axis and the t-axis. Alternatively, the tilt angle θ satisfies 90°<θ<180°, and in one example, θ=135°. Alternatively, the tilt angle θ satisfies 270°<θ<360°, and in one example, θ=315°. When the tilt angle θ satisfies 90°<θ<180° or 270°<θ<360°, the straight line D extends from the second quadrant to the fourth quadrant of the coordinate plane defined by the s-axis and the t-axis. In this manner, the tilt angle θ is an angle excluding 0°, 90°, 180°, and 270°. Here, a distance between the lattice point O(x, y) and the gravity center G is denoted by r(x, y). Here, x represents a position of an x-th lattice point on the X-axis, and y represents a position of a y-th lattice point on the Y-axis. When the distance r(x, y) is a positive value, the gravity center G is positioned in the first quadrant (or the second quadrant). When the distance r(x, y) is a negative value, the gravity center G is positioned in the third quadrant (or the fourth quadrant). When the distance r(x, y) is zero, the lattice point O and the gravity center G coincide with each other.

The distance r(x, y) between the gravity center G of each of the modified refractive index regions 15b and the corresponding lattice point O(x, y) of the unit constituent region R(x, y) illustrated in FIG. 5 is set for each of the modified refractive index regions 15b according to an output beam pattern (optical image) (the fourth setting step). That is, the distribution of the distance r(x, y) has a specific value for each position determined by values of x (x1 to x4 in the example of FIG. 4) and y (y1 to y3 in the example of FIG. 4), but is not necessarily expressed by a specific function. The distribution of the distance r(x, y) is determined by extracting the phase distribution from the complex amplitude distribution obtained by inverse Fourier transform of the output beam pattern. That is, the distance r(x, y) is set to zero when the phase P(x, y) in the unit constituent region R(x, y) is $P_0$, the distance r(x, y) is set to the maximum value $R_0$ when the phase P(x, y) is $\pi+P_0$, and the distance r(x, y) is set to the minimum value $-R_0$ when the phase P(x, y) is $-\pi+P_0$ as will be described later. Then, for the intermediate phase P(x, y) thereof, the distance r(x, y) is such that $r(x, y)=\{P(x, y)-P_0\}\times R_0/\pi$. Here, the initial phase $P_0$ can be arbitrarily set. When the lattice interval of the square lattice is a, the maximum value $R_0$ of r(x, y) is, for example, in the range of the following Formula (9).

$$0 \leq R_0 \leq \frac{a}{\sqrt{2}} \qquad (9)$$

Incidentally, reproducibility of the beam pattern is improved by applying an iterative algorithm such as the Gerchberg-Saxton (GS) method which is generally used in hologram generation calculation at the time of obtaining the complex amplitude distribution from the output beam pattern. In addition, the second to fourth setting steps are repeated for all the modified refractive index regions 15b by the region formation step included in the second step in the production method for a light-emitting device according to the present embodiment, thereby obtaining the phase modulation layer 15 in which all the modified refractive index regions 15b are arranged according to the predetermined arrangement pattern illustrated in FIG. 4.

FIG. 6 is a plan view illustrating an example in which a refractive index substantially periodic structure of FIG. 4 is applied only within a specific region of the phase modulation layer. In the example illustrated in FIG. 6, the substantially periodic structure configured to output a desired beam pattern is formed inside a square inner region RIN similarly to the example illustrated in FIG. 4. On the other hand, a perfect circular modified refractive index region of which gravity-center position coincides with a lattice point position of the square lattice is arranged in an outer region ROUT surrounding the inner region RIN. Lattice intervals of the square lattices that are virtually set are the same (=a) in both the inner region RIN and the outer region ROUT. In this structure, light is distributed also in the outer region ROUT so that it is possible to suppress the occurrence of high-frequency noise (so-called window function noise) caused by an abrupt change in light intensity in the peripheral portion of the inner region RIN. In addition, light leakage in a direction parallel to the X-Y plane can be suppressed, and reduction in threshold current can be expected.

Figure 7:
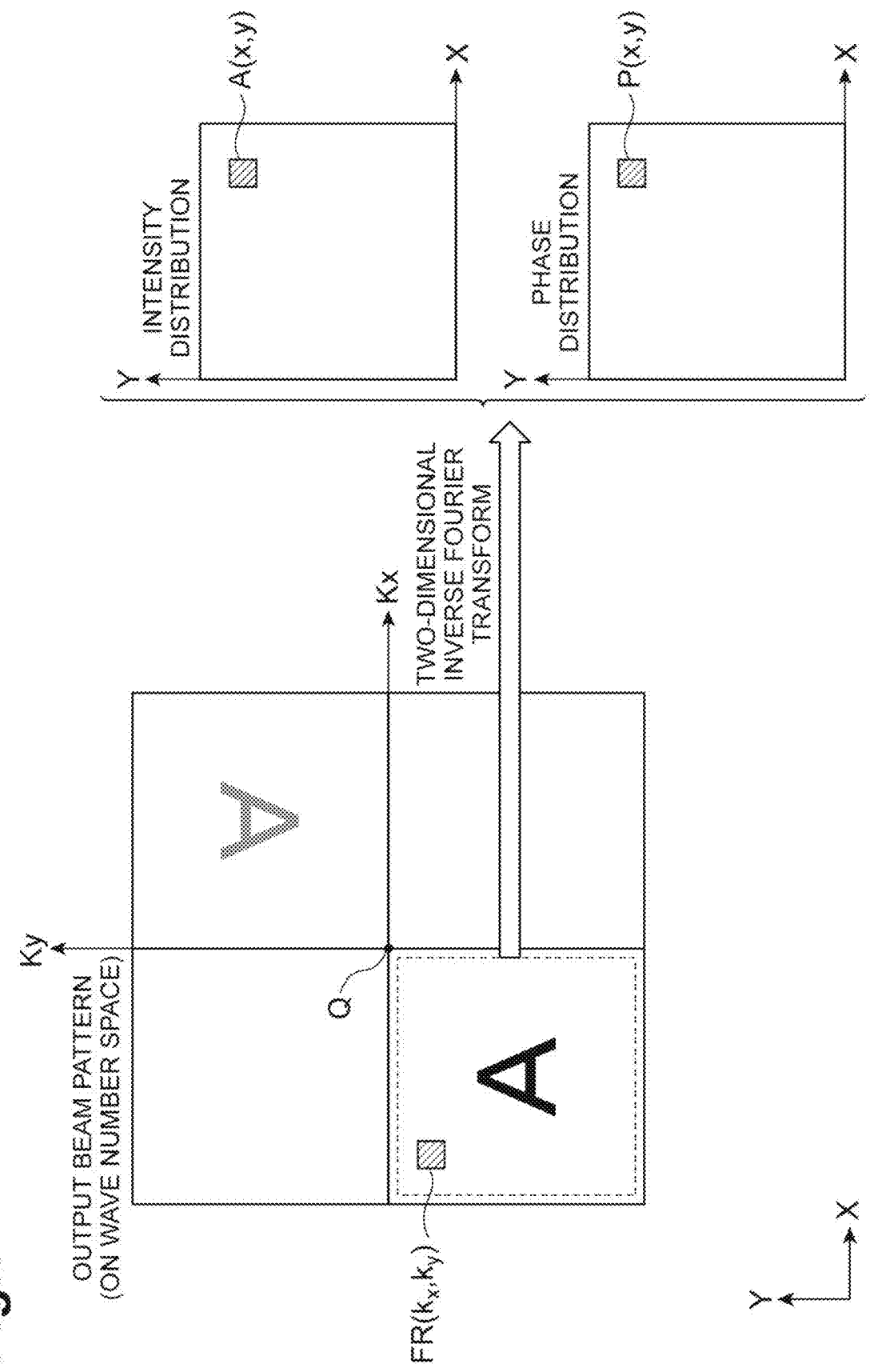
FIG. 7 is a view for describing a relationship between an optical image obtained by forming an output beam pattern of the semiconductor light-emitting element and a distance distribution in the phase modulation layer.

FIG. 7 is a view for describing a relationship between an output beam pattern (optical image) from the semiconductor light-emitting element 1A and distance distribution in the phase modulation layer 15. Although details will be described later, a Kx-Ky plane obtained by converting a beam projection region, which is a projection range of the output beam pattern, into a wave number space will be considered. A Kx-axis and a Ky-axis defining this Kx-Ky plane are orthogonal to each other, and correspond to angles with respect to a normal direction when a projection direction of the output beam patterns is swung to the main surface 10a from the normal direction (Z-axis direction) of the main surface 10a (details will be described later). It is assumed that a specific region including the output beam pattern is constituted by M2 (an integer of one or more)×N2 (an integer of one or more) image regions FR each having a square shape on the Kx-Ky plane. In addition, it is assumed that the virtual square lattice set on the X-Y plane on the design plane (X-Y plane) of the phase modulation layer 15 is constituted by M1 (an integer of one or more)×N1 (an integer of one or more) unit constituent regions R. Incidentally, the integer M2 does not need to coincide with the integer M1. Likewise, the integer N2 does not need to coincide with the integer N1. At this time, a complex amplitude F(x, y) in the unit constituent region R(x, y), which is obtained by two-dimensional inverse Fourier transform of each image region FR($k_x$, $k_y$) on the Kx-Ky plane, specified by the coordinate component $k_x$ (an integer of from 0 to M2−1) in the Kx-axis direction and the coordinate component $k_y$ (an integer of 0 to N2−1) in the Ky-axis direction, to the unit constituent region R(x, y) specified by the coordinate component x (an integer of from 1 to M1) in the X-axis direction and the coordinate component y (an integer of from 1 to N1) in the Y-axis direction, is defined by an amplitude term A(x, y) and a phase term P(x, y). In addition, as illustrated in FIG. 7, the distribution of the amplitude term A(x, y) at the complex amplitude F(x, y) of the unit constituent region R(x, y) corresponds to the intensity distribution on the X-Y plane in a range of coordinate components of x=1 to M1 and y=1 to N1. In addition, the distribution of the phase term P(x, y) at the complex amplitude F(x, y) in the unit constituent region R corresponds to phase distribution on the X-Y plane in the range of x=1 to M1 and y=1 to N1. The distance r(x, y) in the unit constituent region R(x, y) is obtained from P(x, y), and the distribution of the distance r(x, y) of the unit constituent region R(x, y) corresponds to the distance distribution on the X-Y plane in the range of coordinate components of x=1 to M1 and y=1 to N1.

Incidentally, the center Q of the output beam pattern on the Kx-Ky plane is positioned on an axis perpendicular to the main surface 10a, and four quadrants with the center Q as the origin are illustrated in FIG. 7. Although a case where an optical image is obtained in the first quadrant and the third quadrant is illustrated in FIG. 7 as an example, it is also possible to obtain images in the second quadrant and the fourth quadrant, or in all the quadrants. In the present embodiment, a pattern point-symmetric with respect to the origin can be obtained as illustrated in FIG. 7. FIG. 7 illustrates a case where, for example, a character "A" in the third quadrant and a pattern obtained by rotating the character "A" by 180° in the first quadrant are obtained. Incidentally, rotationally-symmetric optical images (for example, a cross, a circle, a double circle, or the like) are observed as one optical image in an overlapping manner.

The output beam pattern (optical image) from the semiconductor light-emitting element 1A becomes an optical image corresponding to the designed optical image (original image) expressed by at least one of a spot, a spot group consisting of three or more points, a straight line, a cross, a line drawing, a lattice pattern, a photograph, a stripe pattern, computer graphics (CG), and a character. Here, the distance r(x, y) of the modified refractive index region 15b in the unit constituent region R(x, y) is determined by the following procedure in order to obtain the output beam pattern (the fourth setting step).

Figure 8:
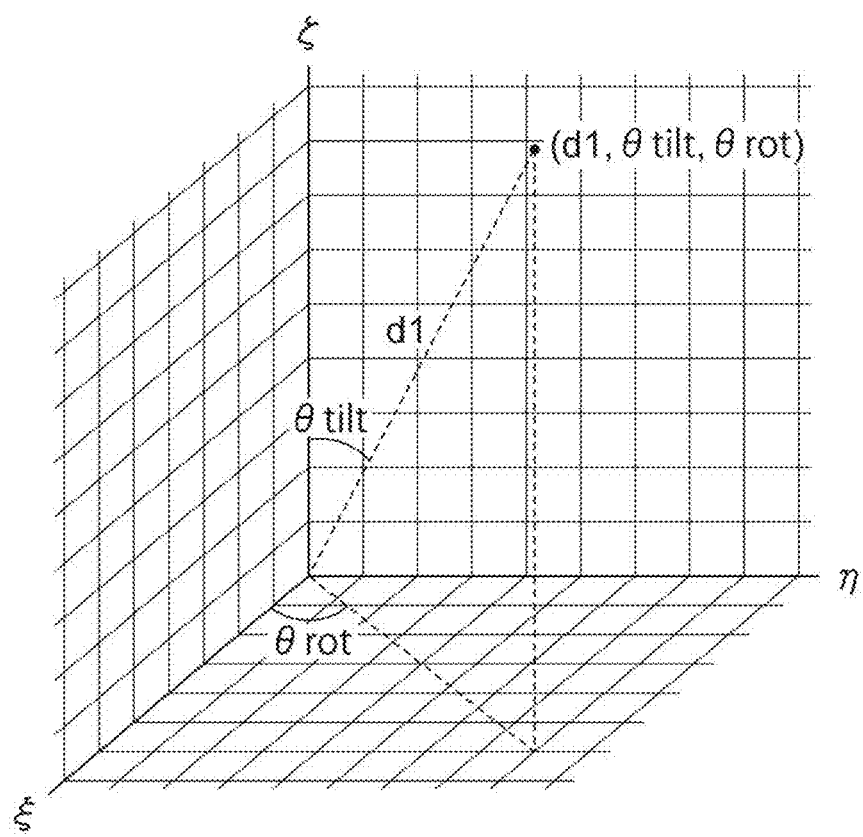
FIG. 8 is a view for describing coordinate conversion from a spherical coordinate to a coordinate in an XYZ orthogonal coordinate system.

First, as a first precondition, a virtual square lattice constituted by M1 (an integer of one or more)×N1 (an integer of one or more) unit constituent regions R each having a square shape is set on the X-Y plane in the XYZ orthogonal coordinate system (the first setting step). Next, as a second precondition, coordinates (ξ, η, ζ) in the XYZ orthogonal coordinate system are assumed to satisfy a relationship expressed by the following Formulas (10) to (12) with respect to spherical coordinates (d1, $\theta_{tilt}$, $\theta_{rot}$) defined by a radius length d1, a tilt angle $\theta_{tilt}$ from the Z-axis, and a rotational angle $\theta_{rot}$ from the X-axis specified on the X-Y plane as illustrated in FIG. 8. Incidentally, FIG. 8 is a view for describing coordinate transformation from spherical coordinates (d1, $\theta_{tilt}$, $\theta_{rot}$) to coordinates (ξ, η, ζ) in the XYZ orthogonal coordinate system, and a designed optical image on a predetermined plane set in the XYZ orthogonal coordinate system, which is the real space, is expressed by the coordinates (ξ, η, ζ). When the beam pattern corresponding to the optical image outputted from the semiconductor light-emitting element is a set of bright spots directed in directions defined by the angles $\theta_{tilt}$ and $\theta_{rot}$, the angles $\theta_{tilt}$ and $\theta_{rot}$ are converted to a coordinate value $k_x$, which is a normalized wave number defined by the following Formula (13), on a Kx-axis corresponding to the X-axis and a coordinate value $k_y$ which is a normalized wave number defined by the following Formula (14), on a Ky-axis corresponds to the Y-axis and orthogonal to the Kx-axis. The normalized wave number means a wave number normalized assuming that a wave number corresponding to the lattice interval of the virtual square lattice is 1.0. At this time, in the wave number space defined by the Kx-axis and the Ky-axis, a specific wave number range including the beam pattern corresponding to the optical image is constituted by M2 (an integer of one or more)×N2 (an integer of one or more) image regions FR each having a square shape. Incidentally, the integer M2 does not need to coincide with the integer M1. Likewise, the integer N2 does not need to coincide with the integer N1. In addition, Formulas (13) and (14) are disclosed in, for example, the following Document (1).

(1) Y. Kurosaka et al., "Effects of non-lasing band in two-dimensional photonic-crystal lasers clarified using omnidirectional band structure," Opt. Express 20, 21773-21783 (2012)

$$\xi = d1\sin\theta_{tilt}\cos\theta_{rot} \tag{10}$$

$$\eta = d1\sin\theta_{tilt}\sin\theta_{rot} \tag{11}$$

$$\zeta = d1\cos\theta_{tilt} \tag{12}$$

$$k_x = \frac{a}{\lambda}\sin\theta_{tilt}\cos\theta_{rot} \tag{13}$$

$$k_y = \frac{a}{\lambda}\sin\theta_{tilt}\sin\theta_{rot} \tag{14}$$

a: Lattice constant of virtual square lattice
λ: Oscillation wavelength

As a third precondition, in the wave number space, a complex amplitude F(x, y), which is obtained by two-dimensional inverse Fourier transform of each image region FR($k_x$, $k_y$), specified by the coordinate component $k_x$ (an integer of from 0 to M2−1) in the Kx-axis direction and the coordinate component $k_y$ (an integer of from 0 to N2−1) in the Ky-axis direction to the unit constituent region R(x, y) on the X-Y plane specified by the coordinate component x (an integer of from 1 to M1) in the X-axis direction and the coordinate component y (an integer of from 1 to N1) in the Y-axis direction, is given by the following Formula (15) with j as an imaginary unit. In addition, this complex amplitude F(x, y) is defined by the following Formula (16) when an amplitude term is A(x, y) and a phase term is P(x, y). In addition, as a fourth precondition, the unit constituent region R(x, y) is defined by an s-axis and a t-axis which are parallel to the X-axis and the Y-axis, respectively, and orthogonal to each other in the lattice point O(x, y) that is the center of the unit constituent region R(x, y).

$$F(x, y) = \sum_{k_x=0}^{M2-1} \sum_{k_y=0}^{N2-1} FR(k_x, k_y) \exp\left[j2\pi\left(\frac{k_x}{M2}x + \frac{k_y}{N2}y\right)\right] \quad (15)$$

$$F(x, y) = A(x, y) \times \exp[jP(x, y)] \quad (16)$$

Under the above first to fourth preconditions, the phase modulation layer 15 is configured to satisfy the following conditions. That is, the corresponding modified refractive index region 15b is arranged in the unit constituent region R(x, y) such that the distance r(x, y) from the lattice point O(x, y) to the gravity center G of the corresponding modified refractive index region 15b satisfies a relationship of $$r(x,y) = C \times (P(x,y) - P_0)$$

(here, C is a proportional constant, for example, $R_0/\pi$ and $P_0$ is an arbitrary constant, for example, 0). That is, the distance r(x, y) is set to zero when the phase P(x, y) in certain coordinates R(x, y) is $P_0$, is set to the maximum value $R_0$ when the phase P(x, y) is $\pi+P_0$, and is set to the minimum value $-R_0$ when the phase P(x, y) is $-\pi+P_0$. When it is desired to obtain a desired optical image, the optical image is preferably subjected to inverse Fourier transform to apply the distribution of the distance r(x, y) corresponding to the phase P(x, y) of the complex amplitude to the plurality of modified refractive index regions 15b. The phase P(x, y) and the distance r(x, y) may be proportional to each other.

Incidentally, a far-field image after the inverse Fourier transform of the laser beam can take various shapes such as a single spot shape or a plurality of spot shapes, an annular shape, a linear shape, a character shape, a double annular shape, and a Laguerre Gaussian beam shape. Since a beam direction can be also controlled, a laser processing machine that electrically performs high-speed scanning can be realized by arraying the semiconductor light-emitting elements 1A one-dimensionally or two-dimensionally. Incidentally, the beam pattern is represented by angle information in the far field, and thus, the inverse Fourier transform may be performed after once converting the pattern to the angle information and then, converting the angle information to the wave number space in the case of a bit map image or the like in which the target beam pattern is represented by two-dimensional position information.

As a method for obtaining the intensity distribution and the phase distribution from the complex amplitude distribution obtained by the inverse Fourier transform, for example, the intensity distribution I(x, y) can be calculated by using the abs function of numerical analysis software "MATLAB" of MathWorks, Inc., and the phase distribution P(x, y) can be calculated by using the angle function of MATLAB.

Here, a description will be given regarding points to be noted in the case of performing calculation using general discrete Fourier transform (or fast Fourier transform) when the distance r(x, y) of the respective modified refractive index regions 15b is determined by obtaining the phase distribution P(x, y) based on a result of the inverse Fourier transform of the optical image. The output beam pattern calculated from the complex amplitude distribution obtained by the inverse Fourier transform of FIG. 9A, which is the desired optical image, is given as illustrated in FIG. 9B. When divided into four quadrants A1, A2, A3, and A4 as illustrated in FIGS. 9A and 9B, a pattern in which a pattern, obtained by rotating a pattern of the first quadrant of FIG. 9A by 180°, and a pattern of the third quadrant in FIG. 9A overlap with each other appears in the first quadrant of the output beam pattern in FIG. 9B. A pattern in which a pattern, obtained by rotating a pattern of the second quadrant of FIG. 9A by 180°, and a pattern of the fourth quadrant of FIG. 9A overlap with each other appears in the second quadrant of the beam pattern. A pattern in which a pattern, obtained by rotating the pattern of the third quadrant of FIG. 9A by 180°, and the pattern of the first quadrant of FIG. 9A overlap with each other appears in the third quadrant of the beam pattern. A pattern in which a pattern, obtained by rotating the pattern of the fourth quadrant of FIG. 9A by 180°, and the pattern of the second quadrant of FIG. 9A overlap with each other appears in the fourth quadrant of the beam pattern. At this time, the pattern rotated by 180° is a pattern formed based on −1st-order light component.

Therefore, when a beam pattern having a value only in the first quadrant is used as the optical image (original optical image) before being subjected to the Fourier transform, the pattern of the first quadrant of the original optical image appears in the third quadrant of the obtained beam pattern, and a pattern obtained by rotating the first quadrant of the original optical image by 180° appears in the first quadrant of the obtained beam pattern.

Incidentally, a material system, a film thickness, and a layer configuration can be variously changed as long as it is configured to include the active layer 12 and the phase modulation layer 15 in the above structure. Here, a scaling rule holds regarding a so-called square lattice photonic crystal laser in which perturbation from the virtual square lattice is zero. That is, when a wavelength becomes constant α times, the same standing wave state can be obtained by multiplying the entire square lattice structure by α. Similarly, it is possible to determine the structure of the phase modulation layer 15 according to the scaling rule depending on the wavelength even in the present embodiment. Therefore, it is also possible to realize the semiconductor light-emitting element 1A that outputs visible light by using the active layer 12 that emits light such as blue, green, and red, and applying the scaling rule depending on the wavelength.

When producing the semiconductor light-emitting element 1A, each compound semiconductor layer is formed by a metal organic chemical vapor deposition (MOCVD) method or a molecular beam epitaxy method (MBE). In the production of the semiconductor light-emitting element 1A using AlGaAs, the growth temperature of AlGaAs is 500° C. to 850° C., and 550° C. to 700° C. was adopted in the experiment. Trimethylaluminium (TMA) is used as an Al raw material at the time of growth, trimethyl gallium (TMG) and triethyl gallium (TEG) are used as gallium raw materials, $AsH_3$ (arsine) is used as an As raw material, disilane ($Si_2H_6$) is used as a raw material of an N-type impurity, and diethylzinc (DEZn) is used as a raw material of a P-type impurity. In the growth of GaAs, TMG and arsine are used, but TMA is not used. InGaAs is produced using TMG, trimethylindium (TMI), and arsine. An insulating film is formed by sputtering a target with a constituent material thereof as a raw material or by a plasma CVD (PCVD) method.

That is, in the above semiconductor light-emitting element 1A, first, an AlGaAs layer serving as the n-type cladding layer 11, an InGaAs/AlGaAs multiple quantum well structure serving as the active layer 12, and a GaAs layer serving as the base layer 15a of the phase modulation layer 15 are sequentially stacked on a GaAs substrate serving as the N-type semiconductor substrate 10 by epitaxial growth using the metal-organic chemical vapor deposition (MOCVD) method.

Next, another resist is applied to the base layer 15a, and then, a two-dimensional fine pattern is drawn on the resist by an electron beam drawing apparatus with reference to the alignment mark. The two-dimensional fine pattern is formed on the resist by developing the surface of the resist. Thereafter, the two-dimensional fine pattern is transferred onto the base layer 15a by dry etching using the resist as a mask, and the resist is removed after holes (pores) are formed in the base layer 15a. Incidentally, the base layer 15a may be dry-etched through a step of forming a SiN layer or a $SiO_2$ layer on the base layer 15a by a PCVD method before forming a resist, a step of forming a resist mask thereon, a step of transferring a fine pattern to the SiN layer or $SiO_2$ layer using reactive ion etching (RIE), and a step of removing the resist. In this case, the resistance to dry etching can be enhanced. A depth of the hole is, for example, 200 nm. The holes formed in the base layer 15a in this manner are used as the modified refractive index regions 15b, or compound semiconductors (AlGaAs), which are to serve as the modified refractive index regions 15b, are regrown in these holes to be deeper than the depth of the hole. When the hole is the modified refractive index region 15b, the hole may be sealed with a gas such as air, nitrogen and argon. Next, an AlGaAs layer as the cladding layer 13 and a GaAs layer as the contact layer 14 are sequentially formed by MOCVD. The electrodes 16 and 17 are formed by a vapor deposition method or a sputtering method. In addition, the protective film 18 and the anti-reflection film 19 are formed by sputtering, a PCVD method, or the like if necessary.

Incidentally, the phase modulation layer 15 is preferably formed on the cladding layer 11 before the formation of the active layer 12 in the case where the phase modulation layer 15 is provided between the active layer 12 and the cladding layer 11. In addition, the lattice interval a of the virtual square lattice is a degree obtained by dividing a wavelength by an equivalent refractive index, and is set to about 300 nm, for example.

In addition, if unit vectors of orthogonal coordinates are x and y in the case of the square lattice with the lattice interval a, basic translation vectors are $a_1$=ax and $a_2$=ay, and basic reciprocal lattice vectors are $b_1$=($2\pi$/a)x, and $b_2$=($2\pi$/a)y for the translation vectors $a_1$ and $a_2$. In a case where a wave number vector of a wave existing in the lattice is k=$nb_1$+$mb_2$ (n and m are arbitrary integers), a wave number k exists at a Γ point. If a magnitude of the wave number vector is equal to a magnitude of the basic reciprocal lattice vector in such a case, a resonance mode (a standing wave in the X-Y plane) with the lattice interval a equal to the wavelength λ is obtained. In the present embodiment, oscillation in such a resonance mode (standing wave state) is obtained. Considering a TE mode in which an electric field is present in a plane parallel to the square lattice at this time, there are four modes of the standing wave state where the lattice interval and the wavelength are equal as described above due to the symmetry of the square lattice. In the present embodiment, a desired beam pattern can be similarly obtained in any mode of oscillation in any of these four standing wave states.

Incidentally, in the semiconductor light-emitting element 1A, the standing wave in the phase modulation layer 15 is scattered by the modified refractive index region 15b having a predetermined shape, and the wavefront obtained in the vertical direction (Z-axis direction) is phase-modulated. A desired beam pattern is obtained. Thus, the desired beam pattern can be obtained even without a polarizing plate. This beam pattern can be not only a pair of single peak beams (spots) but also a character shape or two or more spot groups having the same shape as described above or a vector beam or the like in which phase or intensity distribution is spatially non-uniform.

Incidentally, it is preferable that the refractive index of the base layer 15a be 3.0 to 3.5 and the refractive index of the modified refractive index region 15b be 1.0 to 3.4. In addition, an average radius of the depression (modified refractive index region 15b) of the base layer 15a is, for example, 20 nm to 120 nm in the case of a 940 nm band. As a size of this modified refractive index region 15b changes, the diffraction intensity in the Z-axis direction changes. This diffraction efficiency is proportional to an optical coupling coefficient κ1 represented by a first-order coefficient at the time of Fourier transform of the shape of the modified refractive index region 15b. The optical coupling coefficient is described in, for example, the following Document (2).

(2) K. Sakai et al., "Coupled-Wave Theory for Square-Lattice Photonic Crystal Lasers With TE Polarization", IEEE J.Q. E. 46, 788-795 (2010)

Hereinafter, effects obtained by the semiconductor light-emitting element 1A according to the present embodiment having the above configuration will be described. Conventionally, as a semiconductor light-emitting element, an arrangement pattern in which a gravity center G of each of modified refractive index regions 15b is arranged away from the corresponding lattice point O of a virtual square lattice and has a rotational angle according to an optical image about each lattice point O is known (for example, see Patent Document 1). However, if a novel light-emitting device in which a positional relationship between the gravity center G of each of the modified refractive index regions 15b and each lattice point O is different from the conventional one can be realized, the range of design of the phase modulation layer 15 is expanded, which is extremely advantageous.

In the semiconductor light-emitting element 1A according to the present embodiment, the phase modulation layer 15 optically coupled to the active layer 12 includes the base layer 15a and the plurality of modified refractive index regions 15b having the refractive index different from that of the base layer 15a. In addition, the gravity center G of each of the modified refractive index regions 15b is arranged on the straight line (virtual straight line) D that passes through the lattice point O of the virtual square lattice and is inclined with respect to the X-axis and the Y-axis of the square lattice. Then, the distance r(x, y) between the gravity center G of each of the modified refractive index regions 15b and the corresponding lattice point O is individually set according to a desired optical image. In such a case, the phase of the beam changes according to the distance between the lattice point O and the gravity center G. That is, it is possible to control the phase of the beam to be outputted from each of the modified refractive index regions 15b by only changing the position of the gravity center G, and to make the beam pattern to be formed as a whole in a desired shape. That is, the semiconductor light-emitting element 1A is the S-iPM laser. Further, with the above-described structure, it is possible to output light that forms an optical image of an arbitrary shape in the direction inclined with respect to the direction (normal direction) perpendicular to the main surface 10a of the semiconductor substrate 10 as in the conventional structure in which the gravity center G of each of the modified refractive index regions 15b has the rotational angle according to the optical image about each lattice point O. As described above, according to the present embodiment, it is possible to provide the semiconductor light-emitting element 1A in which the positional relationship between the gravity center G of each of the modified refractive index regions 15b and each of the lattice points O is completely different from the conventional one.

Figure 10A:
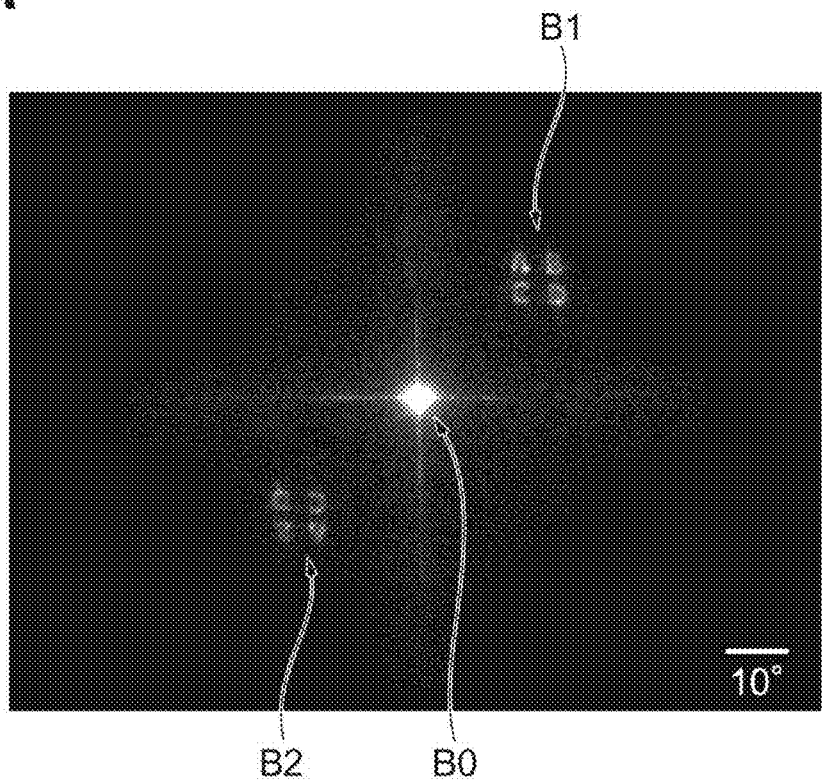
FIG. 10A is a view illustrating an example of a beam pattern (optical image) outputted from the semiconductor light-emitting element.
Figure 10B:
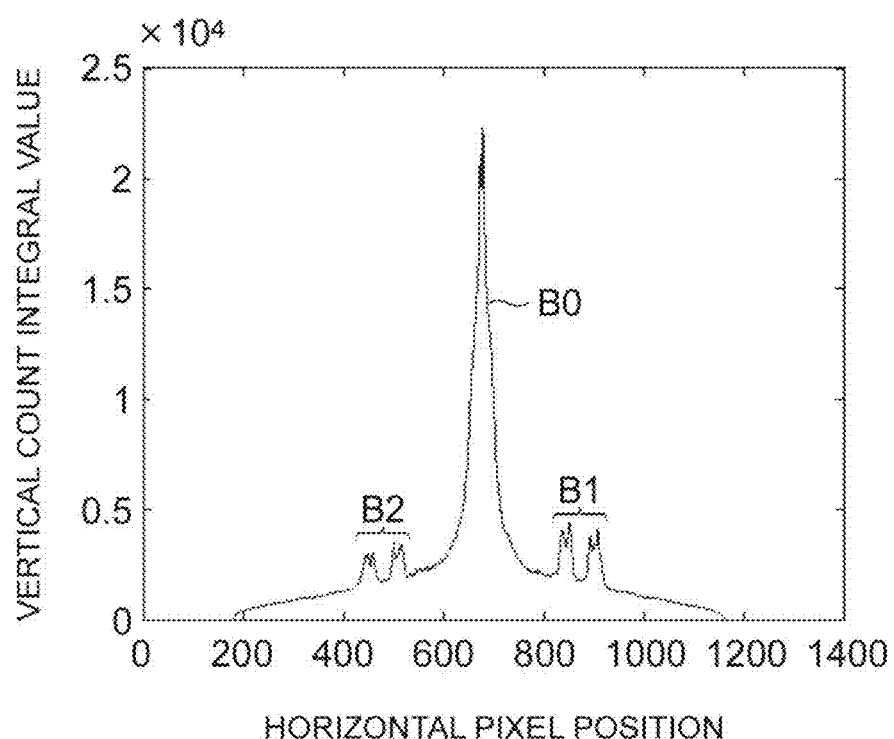
FIG. 10B is a graph illustrating a light intensity distribution in a cross section including an axis perpendicular to a light-emitting surface and intersecting the light-emitting surface of the semiconductor light-emitting element.
Figure 11A:
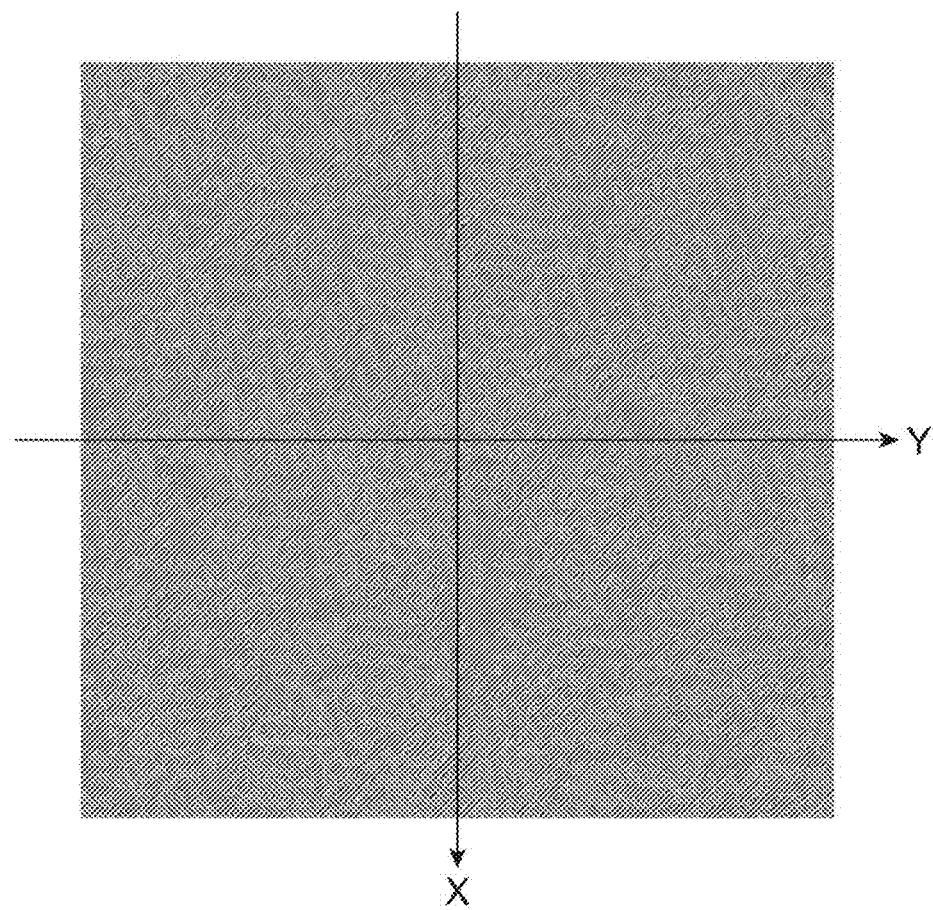
FIG. 11A is a view illustrating a phase distribution corresponding to the beam pattern illustrated in FIG. 10A.
Figure 11B:
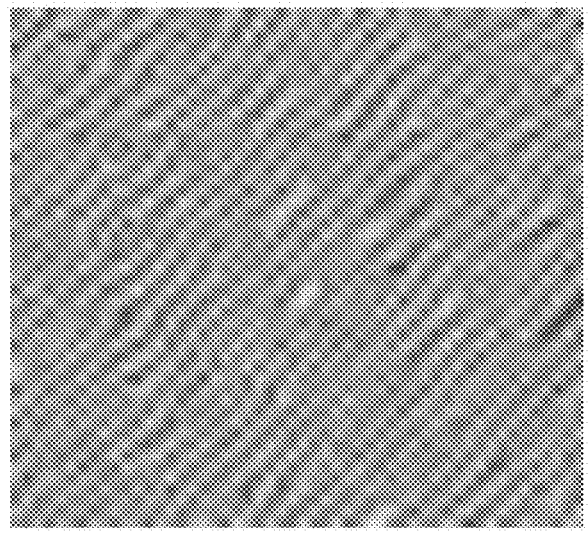
FIG. 11B is a partially enlarged view of FIG. 11A.

Here, FIG. 10A illustrates an example of a beam pattern (optical image) outputted from the semiconductor light-emitting element 1A. A center of FIG. 10A corresponds to an axis perpendicular to a light-emitting surface of the semiconductor light-emitting element 1A. In addition, FIG. 10B is a graph illustrating a light intensity distribution in a cross section including the axis. FIG. 10B is a far-field image, acquired using an FFP optical system (A3267-12 manufactured by Hamamatsu Photonics K.K.), a camera (ORCA-05G manufactured by Hamamatsu Photonics K.K.), and a beam profiler (Lepas-12 manufactured by Hamamatsu Photonics K.K.) which is an image obtained by integrating vertical counts of image data of 1344 dots×1024 dots and plotting the resultant. Incidentally, a maximum count number in FIG. 10A is normalized to 255, and 0th-order light B0 at the center is saturated to clearly illustrate an intensity ratio of ±1st-order light. A difference in intensity between the 1st-order light and the −1st-order light can be easily understood based on FIG. 10B. In addition, FIG. 11A is a view illustrating a phase distribution corresponding to the beam pattern illustrated in FIG. 10A. FIG. 11B is a partially enlarged view of FIG. 11A. In FIGS. 11A and 11B, a phase at each location in the phase modulation layer 15 is indicated by shading, and a darker portion is close to the phase angle of 0° and a lighter portion is close to the phase angle of 360°. However, a center value of the phase angle can be arbitrarily set, and thus, the phase angle is not necessarily set within the range of 0° to 360°. As illustrated in FIGS. 10A and 10B, the semiconductor light-emitting element 1A outputs the 1st-order light including a first optical image portion B1 outputted in a first direction inclined with respect to the axis, and −1st-order light including a second optical image portion B2 that is rotationally symmetric with the first optical image portion B1 with respect to the axis and outputted in a second direction that is symmetric with the first direction with respect to the axis. Typically, the first optical image portion B1 appears in the first quadrant in the X-Y plane, and the second optical image portion B2 appears in the third quadrant in the X-Y plane. However, there is a case where only the 1st-order light is used and the −1st-order light is not used depending on the application. In such a case, it is desirable that the light quantity of the −1st-order light be suppressed to be smaller than that of the 1st-order light.

Figure 12:
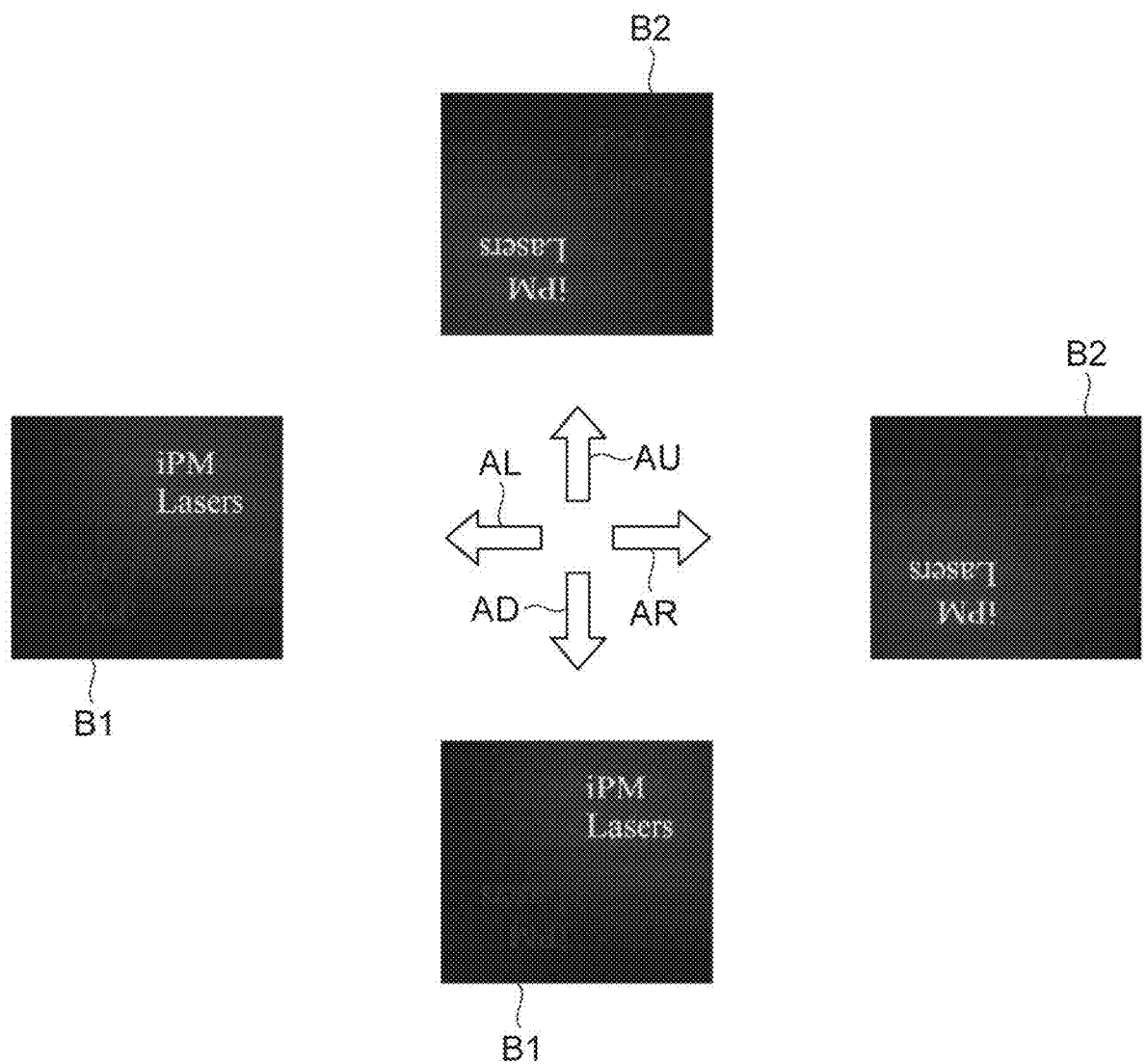
FIG. 12 is a view conceptually illustrating an example of a beam pattern of a traveling wave in each direction (in this example, a tilt angle of a straight line D with respect to an X-axis and a Y-axis is 45°).

FIG. 12 is a view conceptually illustrating an example of a beam pattern of a traveling wave in each direction. In this example, the tilt angle of the straight line D with respect to the s-axis and the t-axis is 45°. In the phase modulation layer of the square lattice type S-iPM laser, basic traveling waves AU, AD, AR, and AL are generated along the X-Y plane. The traveling waves AU and AD are beams of light traveling along sides extending in the Y-axis direction among sides of the square lattice. The traveling wave AU travels in the positive direction of the Y-axis, and the traveling wave AD travels in the negative direction of the Y-axis. In addition, the traveling waves AR and AL are beams of light traveling along sides extending in the X-axis direction among the sides of the square lattice. The traveling wave AR travels in the positive direction of the X-axis, and the traveling wave AL travels in the negative direction of the X-axis. In this case, beam patterns in opposite directions are obtained from the traveling waves traveling in opposite directions. For example, a beam pattern BU including only the second optical image portion B2 is obtained from the traveling wave AU, and a beam pattern BD including only the first optical image portion B1 is obtained from the traveling wave AD. Similarly, a beam pattern BR including only the second optical image portion B2 is obtained from the traveling wave AR, and a beam pattern BL including only the first optical image portion B1 is obtained from the traveling wave AL. In other words, one of the traveling waves traveling in opposite directions becomes the 1st-order light and the other becomes the −1st-order light. The beam pattern outputted from the semiconductor light-emitting element 1A is a pattern in which these beam patterns BU, BD, BR, and BL overlap with each other.

According to the examination of the present inventors, both traveling waves traveling in opposite directions are necessarily included due to the nature of the arrangement of the modified refractive index region in the conventional semiconductor light-emitting element in which the modified refractive index region is rotated about the lattice point. That is, in the conventional rotation scheme, the same quantity of the 1st-order light and the −1st-order light appear in any of the four traveling waves AU, AD, AR, and AL that form a standing wave, and the 0th-order light is generated depending on a radius of a rotation circle (a distance between the gravity center of the modified refractive index region and the lattice point). Thus, in principle, it is difficult to make a difference between the light quantities of the 1st-order light and the −1st-order light, and it is difficult to selectively reduce one of them. Therefore, it is difficult to relatively decrease the light quantity of the 1st-order light with respect to the light quantity of the 1st-order light.

Figure 13A:
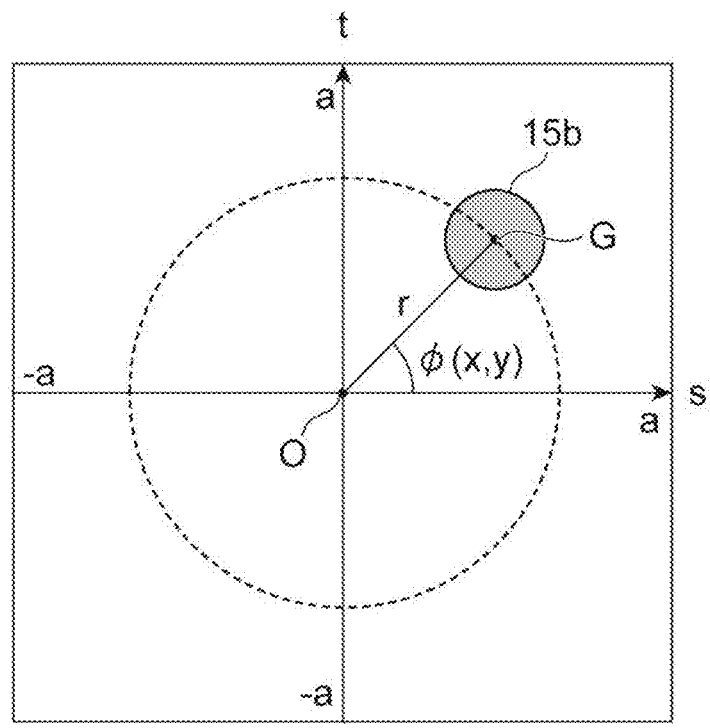
FIG. 13A is a view illustrating a conventional scheme of rotating a modified refractive index region about a lattice point.
Figure 13B:
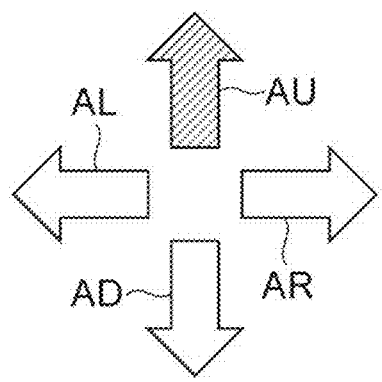
FIG. 13B is a view illustrating traveling waves AU, AD, AR, and AL.

Here, a description will be given regarding a reason why it is difficult to selectively reduce either the 1st-order light or the −1st-order light in the conventional rotation scheme illustrated in FIG. 13A in which the modified refractive index region 15b is rotated about the lattice point O. For a design phase φ(x, y) at a certain position, the traveling wave AU in the positive direction of the t-axis (parallel to the Y-axis) illustrated in FIG. 13B is considered as an example of the four traveling waves. At this time, a shift from the lattice point O is r·sin φ(x, y) for the traveling wave AU based on the geometrical relationship, and thus, a phase difference is (2π/a)r·sin φ(x, y). As a result, when the influence of the size of the modified refractive index region 15b is small and is negligible, the phase distribution Φ(x, y) for the traveling wave AU is given as Φ(x, y)=exp{j(2π/a)r·sin φ(x, y)}. The contribution of this phase distribution Φ(x, y) to the 0th-order light and ±1st-order light is given with components of n=0 and n=±1 in the case of being expanded by exp{jnΦ(x, y)} (n: integer). Meanwhile, when a mathematical formula for the Bessel function Jn(z) of the first kind of an order n defined by the following Formula (17) is used, the phase distribution Φ(x, y) can be expanded in series, and the respective light quantities of the 0th-order light and ±1st-order light can be explained.

$$e^{jz \sin \phi} = \sum_{n=-\infty}^{\infty} J_n(z) \cdot e^{jn\phi} \qquad (17)$$

At this time, a 0th-order light component, a 1st-order light component, and a −1st-order light component of the phase distribution Φ(x, y) are represented by $J_0(2\pi r/a)$, $J_1(2\pi r/a)$, and $J_{-1}(2\pi r/a)$, respectively. Meanwhile, a relationship of $J_1(x)=-J_{-1}(x)$ is established as for the ±1st-order Bessel function, so that the magnitudes of the ±1st-order light components become equal. Although the traveling wave AU in the t-axis positive direction has been considered as one example of the four traveling waves here, the same relationship is established for the other three waves (traveling waves AD, AR, and AL), and the magnitudes of the ±1st-order light components become equal. Based on the above discussion, it is difficult to provide the difference between the light quantities of the ±1st-order light component, in principle, in the conventional scheme in which the modified refractive index region 15b is rotated about the lattice point O.

On the other hand, according to the phase modulation layer 15 of the present embodiment, a difference occurs between the respective light quantities of the 1st-order light and the −1st-order light for the single traveling wave. For example, when the tilt angle θ is 45°, 135°, 225°, or 315°, an ideal phase distribution is obtained as the shift amount $R_0$ approaches an upper limit value of the above Formula (9). As a result, the 0th-order light is reduced, and one of the 1st-order light and the −1st-order light is selectively reduced in each of the traveling waves AU, AD, AR, and AL. Thus, in principle, it is possible to provide a difference between the light quantities of the 1st-order light and the −1st-order light by selectively reducing one of the traveling waves traveling in opposite directions.

Figure 14A:
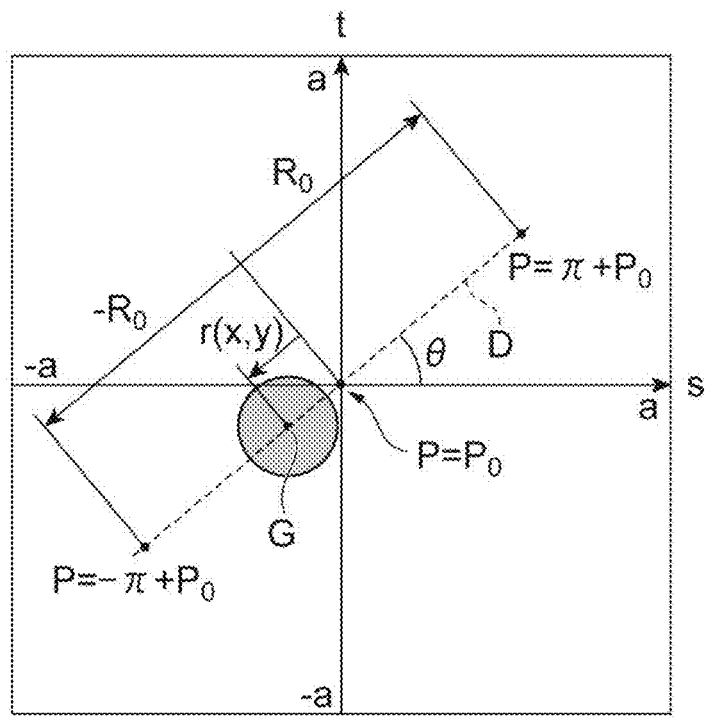
FIG. 14A is a view illustrating a scheme in which a modified refractive index region moves on an axis that passes through a lattice point and is inclined with respect to a square lattice.
Figure 14B:
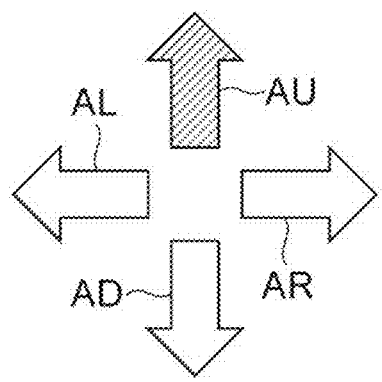
FIG. 14B is a view illustrating the traveling waves AU, AD, AR, and AL.

Here, a description will be given regarding a reason why it is possible to selectively reduce either the 1st-order light or the −1 order light in the axial shift scheme of the present embodiment in which the modified refractive index region 15b moves on the straight line D that passes through the lattice point O and is inclined with respect to the square lattice illustrated in FIG. 14A. For a design phase φ(x, y) at a certain position, the traveling wave AU in the positive direction of the t-axis (parallel to the Y-axis) illustrated in FIG. 14B is considered as an example of the four traveling waves. At this time, a shift from the lattice point O is r·sin θ·{φ(x, y)−φ$_0$}/π for the traveling wave AU based on the geometrical relationship, and thus, a phase difference is $(2\pi/a)r·\sin θ·\{φ(x, y)−φ_0\}/π$. Here, it is assumed that the tilt angle θ is 45° and the phase angle φ$_0$ is 0° for simplicity. When the influence of a size of the modified refractive index region 15b is small and can be ignored, the phase distribution Φ(x, y) for the traveling wave AU is given by the following Formula (18).

$$\Phi(x, y) = \exp\left\{j\left(\frac{\sqrt{2}\,r}{a}\right)\phi(x, y)\right\} \quad (18)$$

The contribution of this phase distribution φ(x, y) to the 0th-order light and ±1st-order light is given with components of n=0 and n=±1 in the case of being expanded by exp{nΦ(x, y)} (n: integer). Meanwhile, when a Laurent series expansion of a function f(z) expressed by the following Formula (19) and satisfying the condition of the following Formula (20) is performed, a mathematical formula such as the following Formula (21) is established.

$$f(z) = z^c \quad (19)$$

$$0 < |c| < 1 \quad (20)$$

$$c = \frac{\sqrt{2}\,r}{a}$$

$$z = \exp\{j\phi(x, y)\}$$

$$z^c = \sum_{n=-\infty}^{\infty} e^{j\pi(c-n)} \cdot \operatorname{sin} c[\pi(c - n)] \cdot z^n \quad (21)$$

Here, sinc(x)=x/sin(x). When this mathematical formula is used, the phase distribution Φ(x, y) can be expanded in series, and the respective light quantities of the 0th-order light and ±1st-order light can be described. At this time, when paying attention to the fact that an absolute value of an exponent term exp{jπ(c−n)} of the above Formula (21) is 1, a magnitude of a 0th-order light component of the phase distribution Φ(x, y) is expressed by the following Formula (22), a magnitude of a 1st-order light component is expressed by the following Formula (23), and a magnitude of a −1st-order light component is expressed by the following Formula (24).

$$\operatorname{sin} c\left(\frac{\sqrt{2}\,\pi r}{a}\right) \quad (22)$$

$$\operatorname{sin} c \cdot \pi\left(-1 + \frac{\sqrt{2}\,r}{a}\right) \quad (23)$$

$$\operatorname{sin} c \cdot \pi\left(1 + \frac{\sqrt{2}\,r}{a}\right) \quad (24)$$

Then, the 0th-order light and −1st-order light components appear in addition to the 1st-order light component in the above Formulas (22) to (24) except for a condition defined by the following Formula (25). However, the magnitudes of the ±1st-order light components are not equal to each other.

$$r = \frac{a}{\sqrt{2}} \quad (25)$$

Although the traveling wave AU in the t-axis positive direction (Y-axis direction) has been considered as one example of the four traveling waves in the above description, the same relationship is established for the other three waves (traveling waves AD, AR, and AL), and the difference occurs between the magnitudes of the ±1st-order light components. With the above discussion, in principle, it is possible to provide the difference between light quantities of the ±1st-order light components according to the axial shift scheme of the present embodiment in which the modified refractive index region 15b moves on the straight line D that passes through the lattice point O and is inclined from the square lattice. Therefore, in principle, it is possible to selectively extract only a desired optical image (the first optical image portion B1 or the second optical image portion B2) by reducing the −1st-order light or the 1st-order light. Even in FIG. 10B described above, it can be understood that the difference in intensity occurs between the 1st-order light and the −1st-order light.

In addition, the tilt angle θ of the straight line D with respect to the square lattice may be constant in all of the unit constituent regions in the phase modulation layer 15 as in the present embodiment. In this case, all the line segments of the unit constituent regions connecting the lattice points and the corresponding gravity centers of the modified refractive index regions are parallel to each other. As a result, it is possible to easily design the arrangement of the gravity centers G of the modified refractive index regions 15b. Incidentally, it is sufficient if the line segments connecting the lattice points and the gravity centers of the corresponding modified refractive index regions are parallel to each other at least between a plurality of unit constituent regions adjacent to each other among the plurality of unit constituent regions. In addition, the tilt angle may be 45°, 135°, 225°, or 315° in this case. As a result, four fundamental waves traveling along the square lattice (when setting an X-axis and a Y-axis along the square lattice, light traveling in the positive direction of the X-axis, light traveling in the negative direction of the X-axis, light traveling in the positive direction of the Y-axis, and light traveling in the negative direction of the Y-axis) can equally contribute to the optical image. Further, when the tilt angle θ is 45°, 135°, 225° or 315°, directions of electromagnetic fields on the straight line D are aligned in one direction by selecting an appropriate band edge mode, so that linearly polarized light can be obtained. Examples of such a mode include modes A and B illustrated in FIG. 3 of the following Document (3).

(3) C. Peng, et al., "Coupled-wave analysis for photonic-crystal surface-emitting lasers on air holes with arbitrary sidewalls," Optics Express Vol. 19, No. 24, pp. 24672-24686 (2011)

Incidentally, when the tilt angle θ is 0°, 90°, 180° or 270°, a pair of traveling waves traveling in the Y-axis direction or the X-axis direction among the four traveling waves AU, AD, AR, and AL does not contribute to the 1st-order light (signal light), and thus, it is difficult to increase the efficiency of signal light.

In addition, the light-emitting portion may be the active layer 12 provided on the semiconductor substrate 10 as in the present embodiment. As a result, it is possible to optically couple the light-emitting portion and the phase modulation layer 15 in an easy manner.

Figure 15:
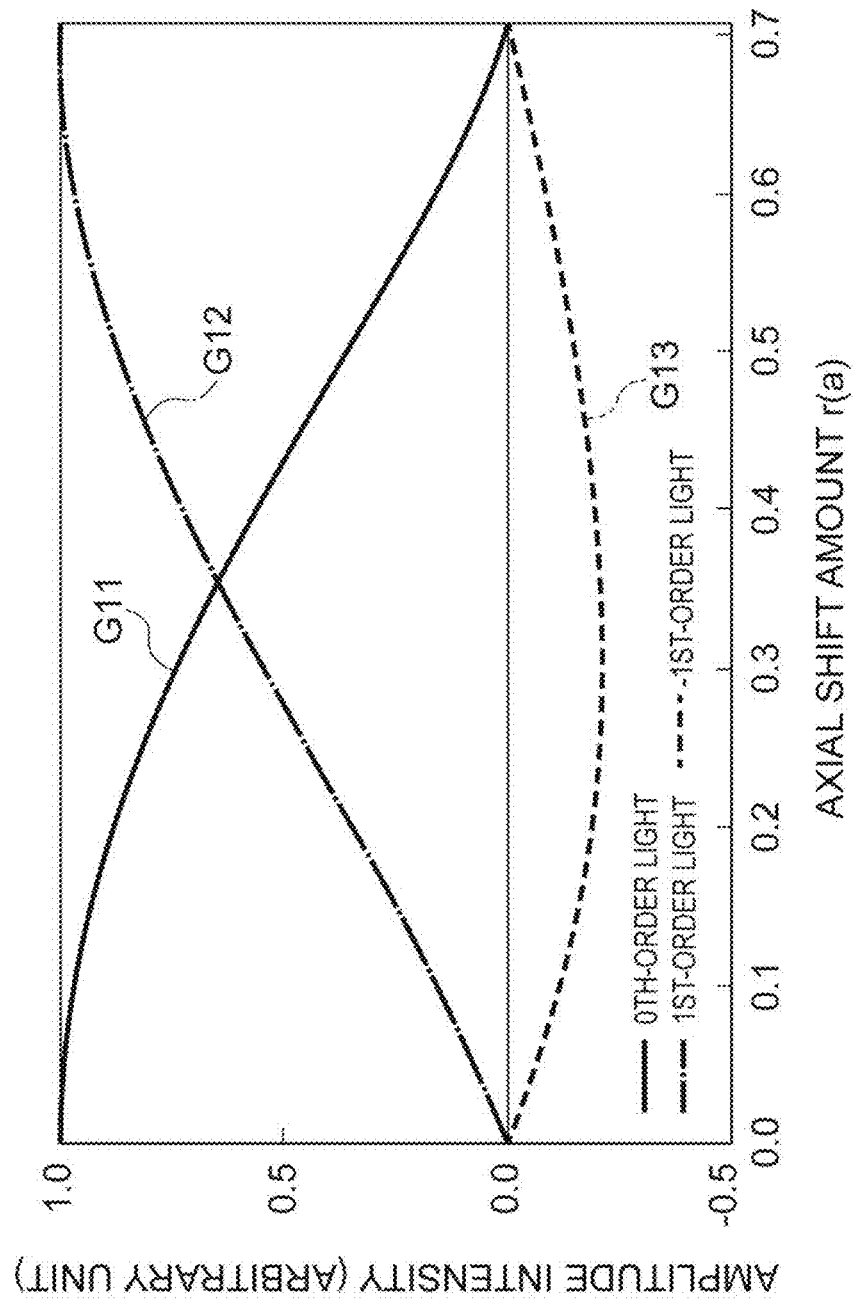
FIG. 15 is a graph illustrating a relationship between each amplitude of 0th-order light, −1st-order light, and 1st-order light (+1st-order light) and a value $R_0$.
Figure 16:
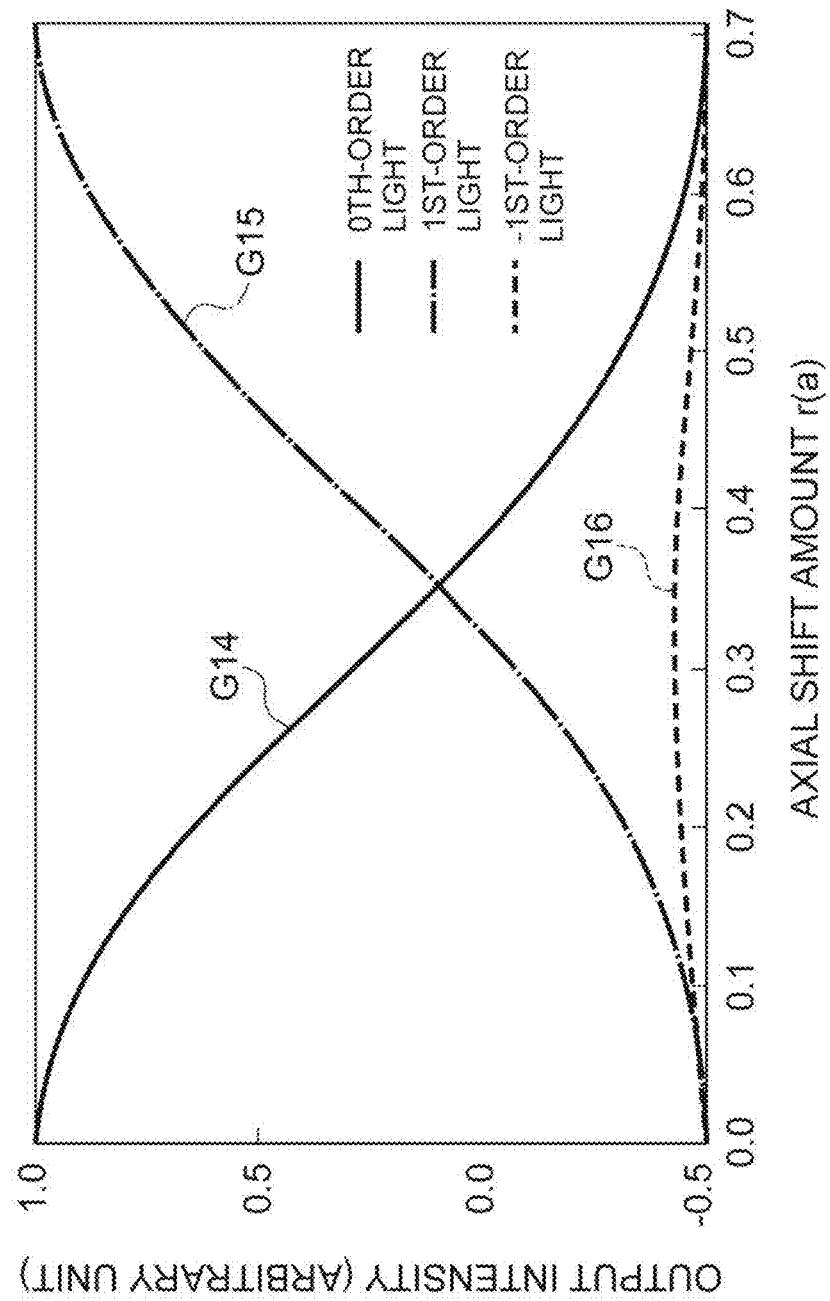
FIG. 16 is a graph illustrating a relationship between each light intensity of the 0th-order light, the −1st-order light, and the 1st-order light (+1st-order light) and the value $R_0$.
Figure 17:
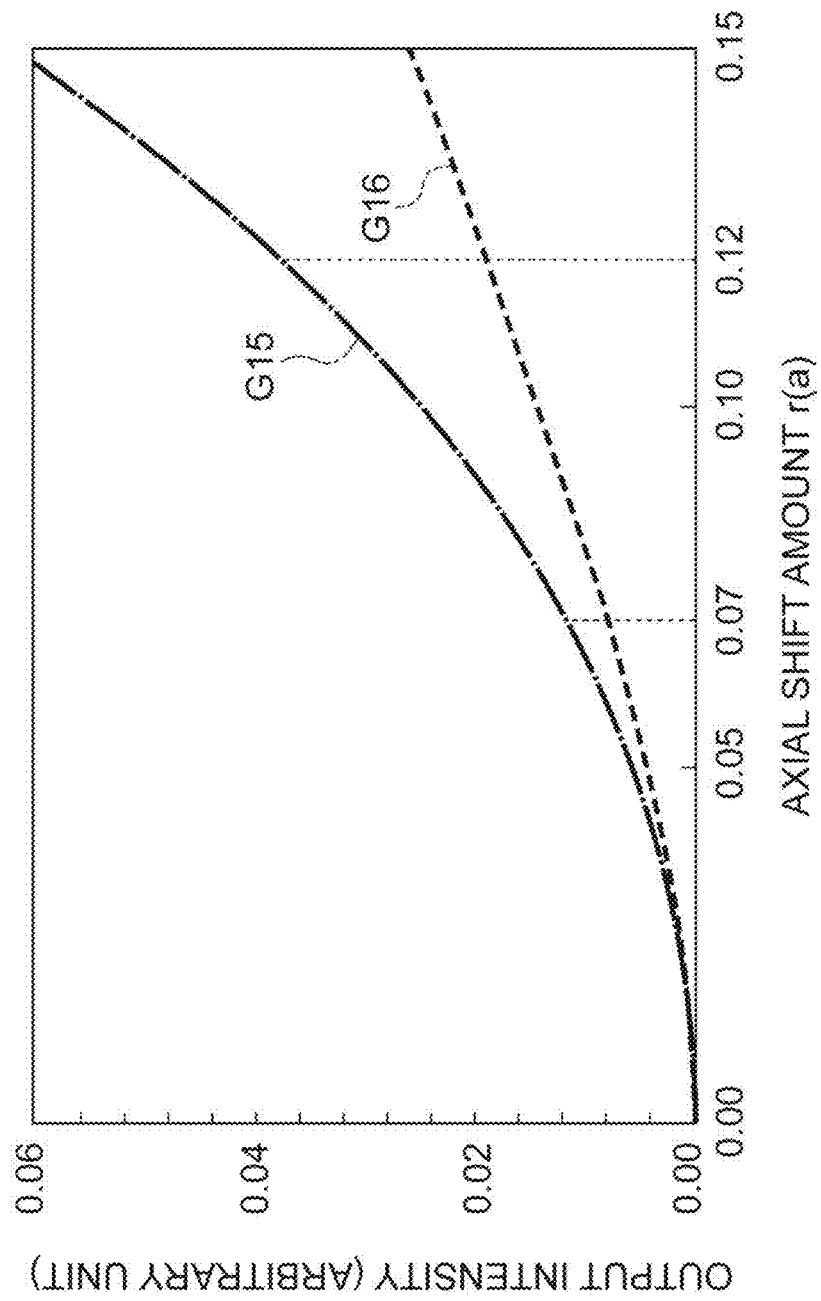
FIG. 17 is a graph illustrating a part of FIG. 16 in an enlarged manner.
Figure 18:
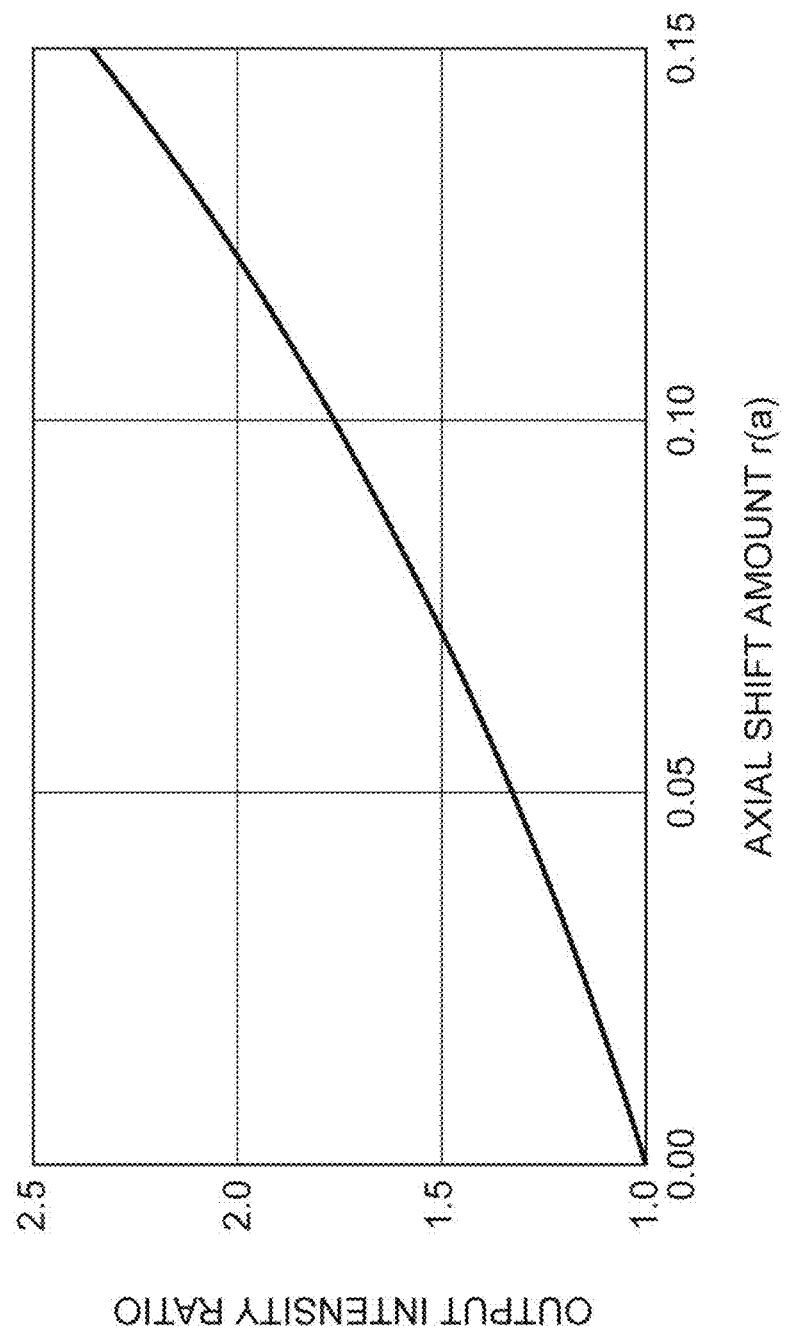
FIG. 18 is a graph illustrating a relationship between a ratio ($I_1/I_{-1}$) between a light intensity $L_{-1}$ of the −1st-order light and a light intensity $I_1$ of the 1st-order light, and the value $R_0$.

Here, a suitable range of a maximum value $R_0$ and a minimum value $-R_0$ of the distance r(x, y) between the gravitycenter G of each of the modified refractive index regions 15b and the corresponding lattice point O of each of the unit constituent regions R will be examined. As described above, the amplitudes of the 0th-order light, the −1st-order light, and the 1st-order light of the single fundamental plane wave are represented by the above Formulas (22) to (24). FIG. 15 is a graph of the above Formulas (22) to (24), and illustrates a relationship between each amplitude of the 0th-order light, the −1st-order light, and the 1st-order light, and the value $R_0$. Incidentally, in FIG. 15, the vertical axis represents the amplitude (arbitrary unit), and the horizontal axis represents a ratio of the value $R_0$ relative to the lattice interval a. A graph G11 illustrates the amplitude of the 0th-order light, a graph G12 illustrates the amplitude of the 1st-order light, and a graph G13 illustrates the amplitude of the −1st-order light. In addition, the intensity of light is proportional to the square of the amplitude of light. Therefore, the relationship between each light intensity of the 0th-order light, the −1st-order light, and the 1st-order light, and the value $R_0$ is given as the relationship as illustrated in FIG. 16. In FIG. 16, the vertical axis represents the light intensity (arbitrary unit), and the horizontal axis represents the ratio of the value $R_0$ relative to the lattice interval a. A graph G14 illustrates the light intensity of the 0th-order light, a graph G15 illustrates the light intensity of the 1st-order light, and a graph G16 illustrates the light intensity of the −1st-order light. FIG. 17 is a graph illustrating a part of FIG. 16 in an enlarged manner, and FIG. 18 is a graph illustrating a relationship between a ratio ($I_1/I_{-1}$) between the light intensity $L_{-1}$ of the −1st-order light and the light intensity $I_1$ of the 1st-order light and the value $R_0$.

Referring to FIGS. 16 and 17, the 1st-order light is 1.5 times or more stronger than the −1st-order light in a range where $R_0$ is larger than 0.07a. In addition, the 1st-order light is twice or more stronger than the −1st-order light in a range where $R_0$ is larger than 0.12a. Further, $R_0$=0.30a is an inflection point of the light intensity of the −1 order light. Therefore, when $R_0$ exceeds 0.30a, the light intensity of the −1st-order light decreases and the light intensity of the 1st-order light increases as $R_0$ increases. Therefore, the ratio ($I_1/L_{-1}$) increases as $R_0$ increases in the range of $R_0$>0.30a. From the above, $R_0$ may be larger than 0.07a, may be larger than 0.12a, and further, may be larger than 0.30a.

Incidentally, the graphs illustrated in FIGS. 15 to 18 are graphs illustrating general properties of diffracted light of the traveling wave AU described in the description of the above-described axial shift scheme (FIGS. 14A and 14B), and are not graphs depending on a specific material system, pore structure, or the like. As one specific example, these graphs illustrate an example in which the semiconductor light-emitting element 1A is made of a GaAs-based compound semiconductor (emission wavelength of 940 nm band), and assumes the case of having a layer structure illustrated in FIG. 27 to be described later. Further, assumed is a case where the planar shape of the modified refractive index region 15b is circular, the tilt angle θ of the straight line D is 45°, and the filling factor FF is about 15%. If the lattice interval a is 280 nm, 0.07a is approximately 19.6 nm, and 0.12a is approximately 33.6 nm.

(First Modification)

Figure 19A:
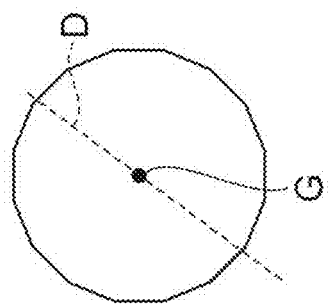
FIGS. 19A to 19G are views illustrating an example of a planar shape of the modified refractive index region provided on an X-Y plane (design plane) (Part 1 thereof).
Figure 19B:
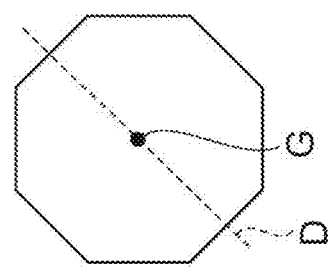
Figure 19C:
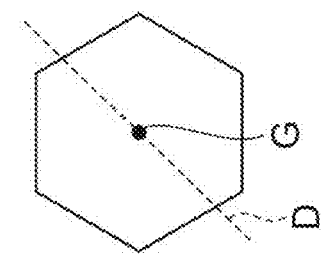
Figure 19D:
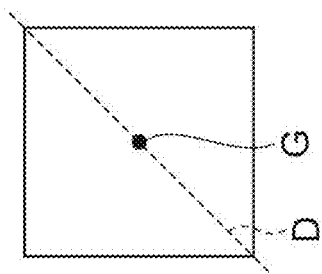
Figure 19E:
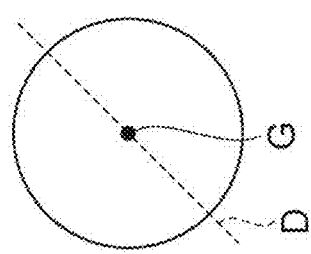
Figure 19F:
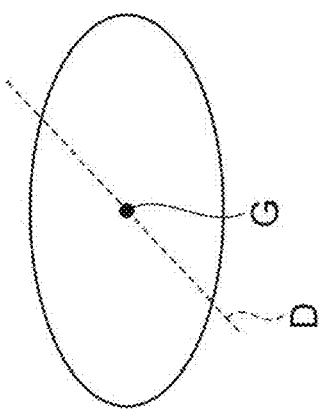
Figure 19G:
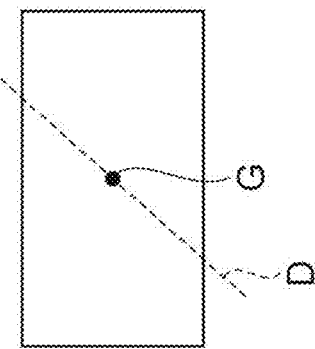
Figure 20A:
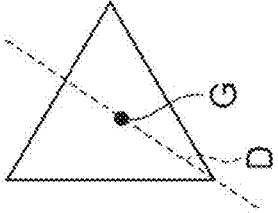
FIGS. 20A to 20K are views illustrating examples of the planar shapes of the modified refractive index regions on the X-Y plane (Part 2 thereof).
Figure 20B:
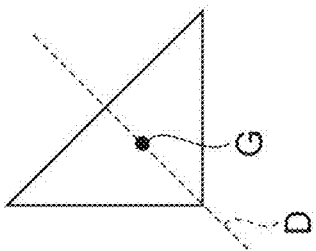
Figure 20C:
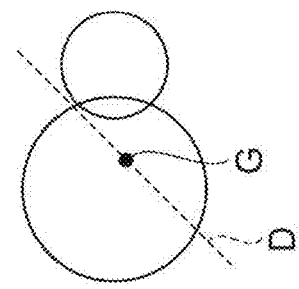
Figure 20D:
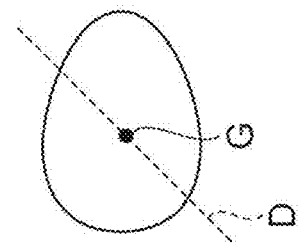
Figure 20E:
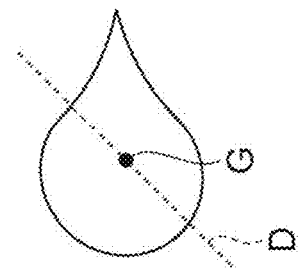
Figure 20F:
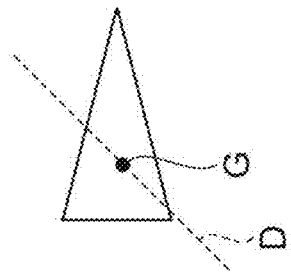
Figure 20G:
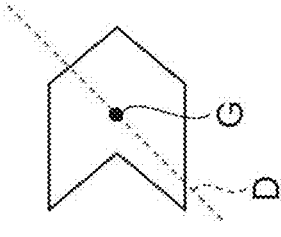
Figure 20H:
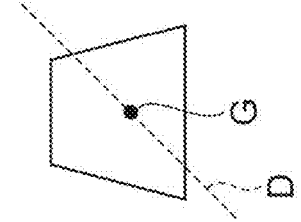
Figure 20I:
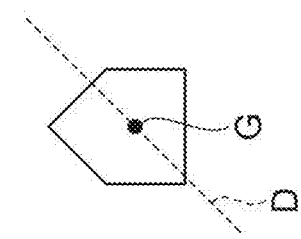
Figure 20J:
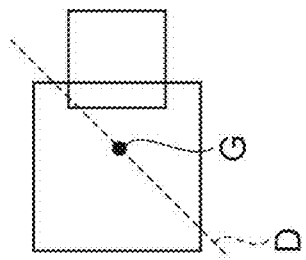
Figure 20K:
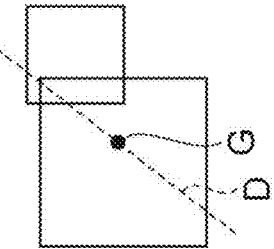

FIGS. 19A to 19G and FIGS. 20A to 20K are plan views illustrating examples of the shape of the modified refractive index region 15b in the X-Y plane. The example in which the shape of the modified refractive index region 15b in the X-Y plane is circular is illustrated in the above-described embodiment. However, the modified refractive index region 15b may have a shape other than the circular shape. For example, the shape of the modified refractive index region 15b in the X-Y plane may have a mirror-image symmetry (line symmetry). Here, the mirror-image symmetry (line symmetry) represents that a planar shape of the modified refractive index region 15b positioned on one side of a straight line and a planar shape of the modified refractive index region 15b positioned on the other side of the straight line can be mirror-image symmetric (line symmetric) with each other with a certain straight line along X-Y plane interposed therebetween. Examples of the shape having mirror-image symmetry (line symmetry) includes a perfect circle illustrated in FIG. 19A, a square illustrated in FIG. 19B, a regular hexagon illustrated in FIG. 19C, a regular octagon illustrated in FIG. 19D, a regular hexadecagon illustrated in FIG. 19E, a rectangle illustrated in FIG. 19F, an ellipse illustrated in FIG. 19G, and the like. In this manner, the shape of the modified refractive index region 15b in the X-Y plane has a mirror-image symmetry (line symmetry). In this case, the shape is simple in each of the unit constituent regions R of the virtual square lattice of the phase modulation layer 15, and thus, a direction and a position of the gravity center G of the corresponding modified refractive index region 15b from the lattice point O can be determined with high precision, so that patterning with high precision is possible.

In addition, the shape of the modified refractive index region 15b in the X-Y plane may adopt a shape that does not have a 180-degree rotational symmetry. Examples of such a shape include an equilateral triangle illustrated in FIG. 20A, a right-angled isosceles triangle illustrated in FIG. 20B, a shape illustrated in FIG. 20C in which two circles or ellipses partially overlap, a shape (egg shape) illustrated in FIG. 20D in which a dimension in the minor-axis direction near one end along the major axis of an ellipse is deformed to be smaller than a dimension in the minor-axis direction near the other end, a shape (teardrop shape) illustrated in FIG. 20E in which one end along the major axis of an ellipse is deformed into a sharp end protruding along the major-axis direction, an isosceles triangle illustrated in FIG. 20F, a shape (arrow shape) illustrated in FIG. 20G in which one side of a rectangle is recessed in a triangular shape and the opposite side thereof is pointed in a triangular shape, a trapezoid illustrated in FIG. 20H, a pentagon illustrated in FIG. 20I, a shape illustrated in FIG. 20J in which two rectangles partially overlap, a shape illustrated in FIG. 20K in which two rectangles partially overlap and do not have mirror-image symmetry, and the like. Since the shape of the modified refractive index region 15b in the X-Y plane does not have the 180-degree rotational symmetry in this manner, it is possible to obtain a higher light output.

FIGS. 21A to 21K and FIG. 22 are plan views illustrating other examples of the shape of the modified refractive index region in the X-Y plane. In the present modification, a plurality of modified refractive index regions 15c different from the plurality of modified refractive index regions 15b are further provided. Each of the modified refractive index regions 15c is made of a second refractive index medium having a refractive index different from that of the first refractive index medium of the base layer 15a. The modified refractive index region 15c may be a depression (or hole) similarly to the modified refractive index region 15b, or may be formed by embedding a compound semiconductor in the depression. The modified refractive index regions 15c are provided in the modified refractive index regions 15b with one-to-one correspondence. Then, the combined gravity center G of the modified refractive index regions 15b and 15c, is positioned on the straight line D that crosses the lattice points O of the unit constituent regions R constituting the virtual square lattice. Incidentally, each of the modified refractive index regions 15b and 15c is included in the range of the unit constituent region R constituting the virtual square lattice. The unit constituent region R is a region surrounded by a straight line that bisects the lattice point of the virtual square lattice.

A planar shape of the modified refractive index region 15c is, for example, a circular shape, but can have various shapes similarly to the modified refractive index region 15b. FIGS. 21A to 21K illustrate examples of shapes and a relative relationship of the modified refractive index regions 15b and 15c in the X-Y plane. FIGS. 21A and 21B illustrate a form in which the modified refractive index regions 15b and 15c have the same figure shape. FIGS. 21C and 21D illustrate a form in which the modified refractive index regions 15b and 15c have the same figure shape, and parts thereof overlap with each other. FIG. 21E illustrates a form in which the modified refractive index regions 15b and 15c have the same figure shape, and a distance between gravity centers of the modified refractive index regions 15b and 15c is arbitrarily set for each lattice point. FIG. 21F illustrates a form in which the modified refractive index regions 15b and 15c have different figure shapes. FIG. 21G illustrates a form in which the modified refractive index regions 15b and 15c have different figure shapes, and a distance between gravity centers of the modified refractive index regions 15b and 15c is arbitrarily set for each lattice point.

In addition, the modified refractive index region 15b may be configured to include two regions 15b1 and 15b2 separated from each other as illustrated in FIGS. 21H to 21K. Then, the distance between the gravity center of the regions 15b1 and 15b2 (corresponding to the gravity center of the single modified refractive index region 15b) and the gravity center of the modified refractive index region 15c may be arbitrarily set for each lattice point. In addition, the regions 15b1 and 15b2 and the modified refractive index region 15c may have the same figure shape in this case as illustrated in FIG. 21H. Alternatively, two out of the regions 15b1 and 15b2 and the modified refractive index region 15c may have a figure different from the other as illustrated in FIG. 21I. In addition, an angle of the modified refractive index region 15c with respect to the X-axis may be arbitrarily set for each lattice point in addition to the angle of the straight line connecting the regions 15b1 and 15b2 with respect to the X-axis as illustrated in FIG. 21J. In addition, the angle of the straight line connecting the regions 15b1 and 15b2 with respect to the X-axis may be arbitrarily set for each lattice point while maintaining mutually the same relative angles among the regions 15b1 and 15b2 and the modified refractive index region 15c as illustrated in FIG. 21K.

Figure 22:
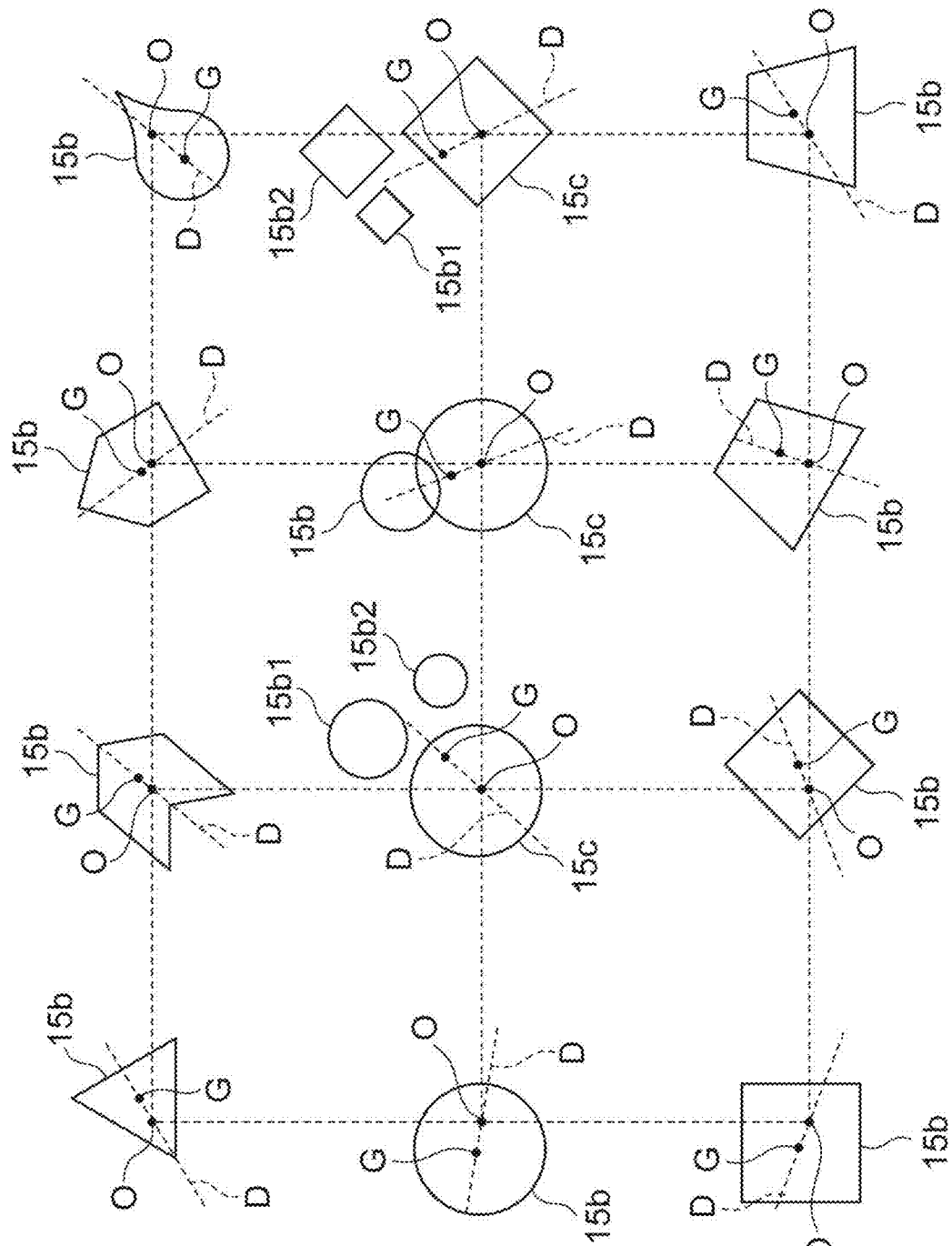
FIG. 22 is a view illustrating the planar shapes of the modified refractive index regions on the X-Y plane (Part 4 thereof).

The shapes of the modified refractive index regions in the X-Y plane may be the same between the respective lattice points. That is, the modified refractive index regions may have the same figure at all lattice points and can be caused to overlap with each other between the lattice points by a translational operation or the translational operation and a rotational operation. In that case, it is possible to suppress generation of noise light and 0th-order light causing noise in a beam pattern. Alternatively, the shapes of the modified refractive index regions in the X-Y plane are not necessarily the same between lattice points, and the shapes may be different between adjacent lattice points, for example, as illustrated in FIG. 22. Incidentally, as illustrated in the example of FIG. 14, the center of the straight line D passing through the respective lattice points O is preferably set to coincide with the lattice point O in any case of FIGS. 19A to 19G, FIGS. 20A to 20K, FIGS. 21A to 21K, and FIG. 22.

For example, it is possible to suitably exhibit the effects of the above-described embodiments even with the configuration of the phase modulation layer as in the present modification.

(Second Modification)

Figure 23:
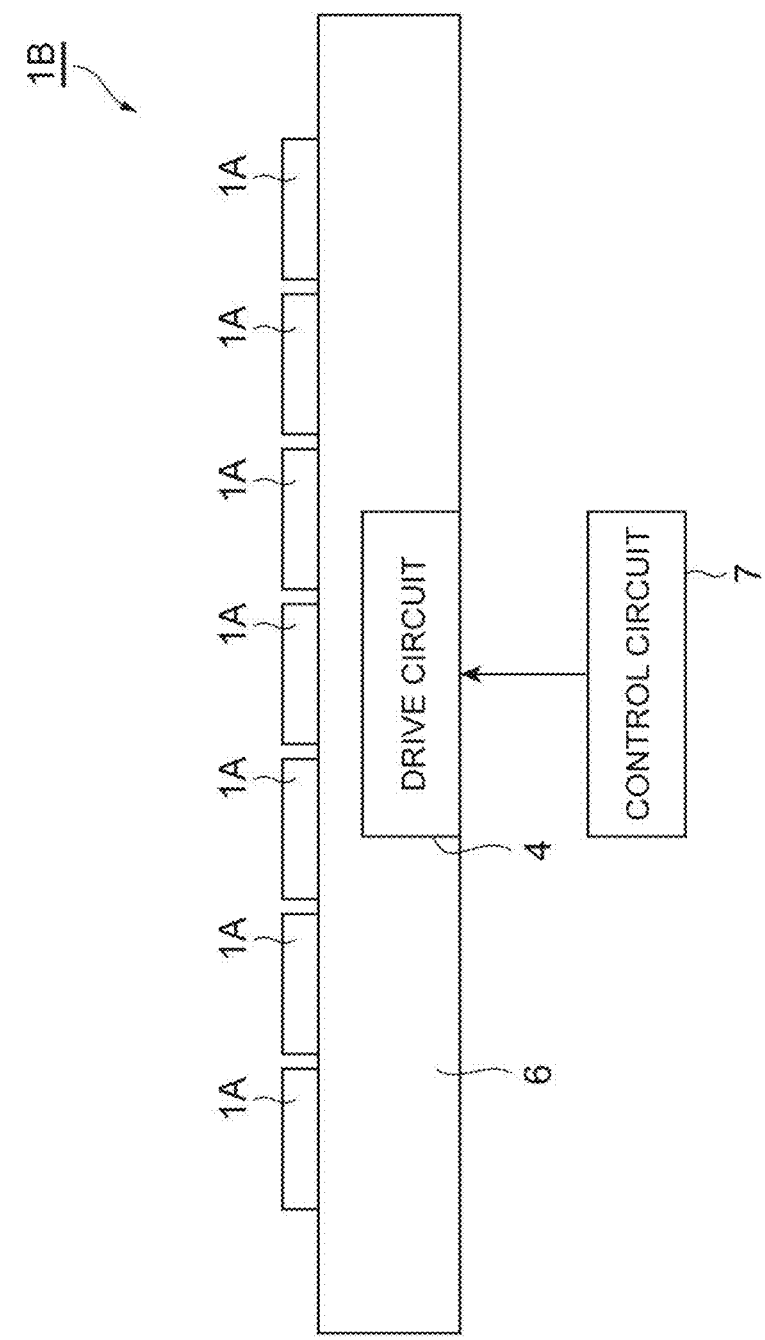
FIG. 23 is a view illustrating a configuration of a light-emitting device according to a second modification.

FIG. 23 is a view illustrating a configuration of a light-emitting device 1B according to a second modification. This light-emitting device 1B includes a support substrate 6, a plurality of the semiconductor light-emitting elements 1A arranged one-dimensionally or two-dimensionally on the support substrate 6, and a drive circuit 4 individually driving the plurality of the semiconductor light-emitting element 1A. The configuration of each of the semiconductor light-emitting elements 1A is the same as that of the above-described embodiment. However, the plurality of semiconductor light-emitting elements 1A include a laser element that outputs an optical image in a red wavelength region, a laser element that outputs an optical image in a blue wavelength region, and a laser element that outputs an optical image in a green wavelength region. The laser element outputting the optical image of the red wavelength range is constituted by, for example, a GaAs-based semiconductor. The laser element that outputs the optical image of the blue wavelength range and the laser element that outputs the optical image of the green wavelength range are configured using, for example, a nitride-based semiconductor. The drive circuit 4 is provided on a rear surface or the inside of the support substrate 6, and drives the respective semiconductor light-emitting elements 1A individually. The drive circuit 4 supplies a drive current to each of the semiconductor light-emitting elements 1A according to an instruction from a control circuit 7.

When the plurality of individually driven semiconductor light-emitting elements 1A are provided to extract a desired optical image from each of the semiconductor light-emitting elements 1A (to appropriately drive a necessary element) as in the present modification, a head-up display or the like can be suitably realized for a module in which semiconductor light-emitting elements corresponding to a plurality of patterns are arranged in advance. In addition, a color head-up display or the like can be suitably realized since the plurality of semiconductor light-emitting elements 1A include the laser element that outputs the optical image in the red wavelength range, the laser element that outputs the optical image in the blue wavelength range, and the laser element that outputs the optical image in the green wavelength range.

Second Embodiment

Figure 24:
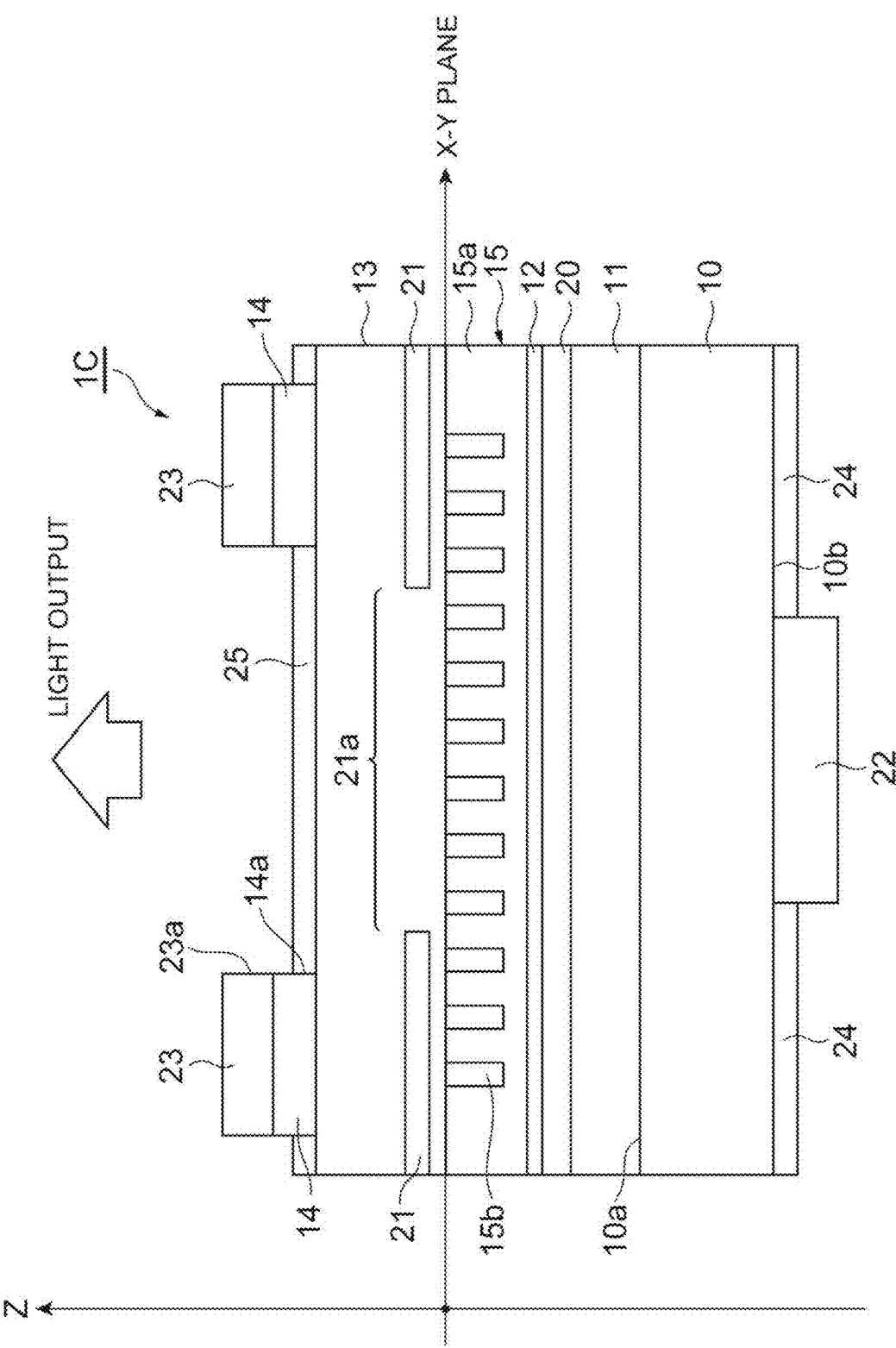
FIG. 24 is a view illustrating a cross-sectional structure of a semiconductor light-emitting element as a light-emitting device according to a second embodiment.

FIG. 24 is a view illustrating a cross-sectional structure of a semiconductor light-emitting element 1C as a light-emitting device according to a second embodiment. This semiconductor light-emitting element 1C is a laser light source that forms a standing wave along the X-Y plane and outputs a phase-controlled plane wave in the Z-axis direction, and outputs light that forms a two-dimensional optical image having an arbitrary shape in at least any one direction of a direction (normal direction) perpendicular to the main surface 10a of the semiconductor substrate 10 and an inclination direction inclined with respect to the normal direction similarly to the first embodiment. However, the semiconductor light-emitting element 1C of the present embodiment outputs the optical image from a front surface on the cladding layer 13 side with respect to the active layer 12 while the semiconductor light-emitting element 1A of the first embodiment outputs the optical image transmitted through the semiconductor substrate 10 from the rear surface.

The semiconductor light-emitting element 1C includes the cladding layer 11, the active layer 12, the cladding layer 13, the contact layer 14, the phase modulation layer 15, a light reflection layer 20, and a current confinement layer 21. The cladding layer 11 is provided on the semiconductor substrate 10. The active layer 12 is provided on the cladding layer 11. The cladding layer 13 is provided on the active layer 12. The contact layer 14 is provided on the cladding layer 13. The phase modulation layer 15 is provided between the active layer 12 and the cladding layer 13. The light reflection layer 20 is provided between the active layer 12 and the cladding layer 11. The current confinement layer 21 is provided in the cladding layer 13. Configurations (preferable materials, band gaps, refractive indices, or the like) of the respective layers 11 to 15 are the same as those in the first embodiment. Incidentally, the light reflection layer 20 may be omitted if light absorption by the semiconductor substrate 10 does not matter.

Figure 25:
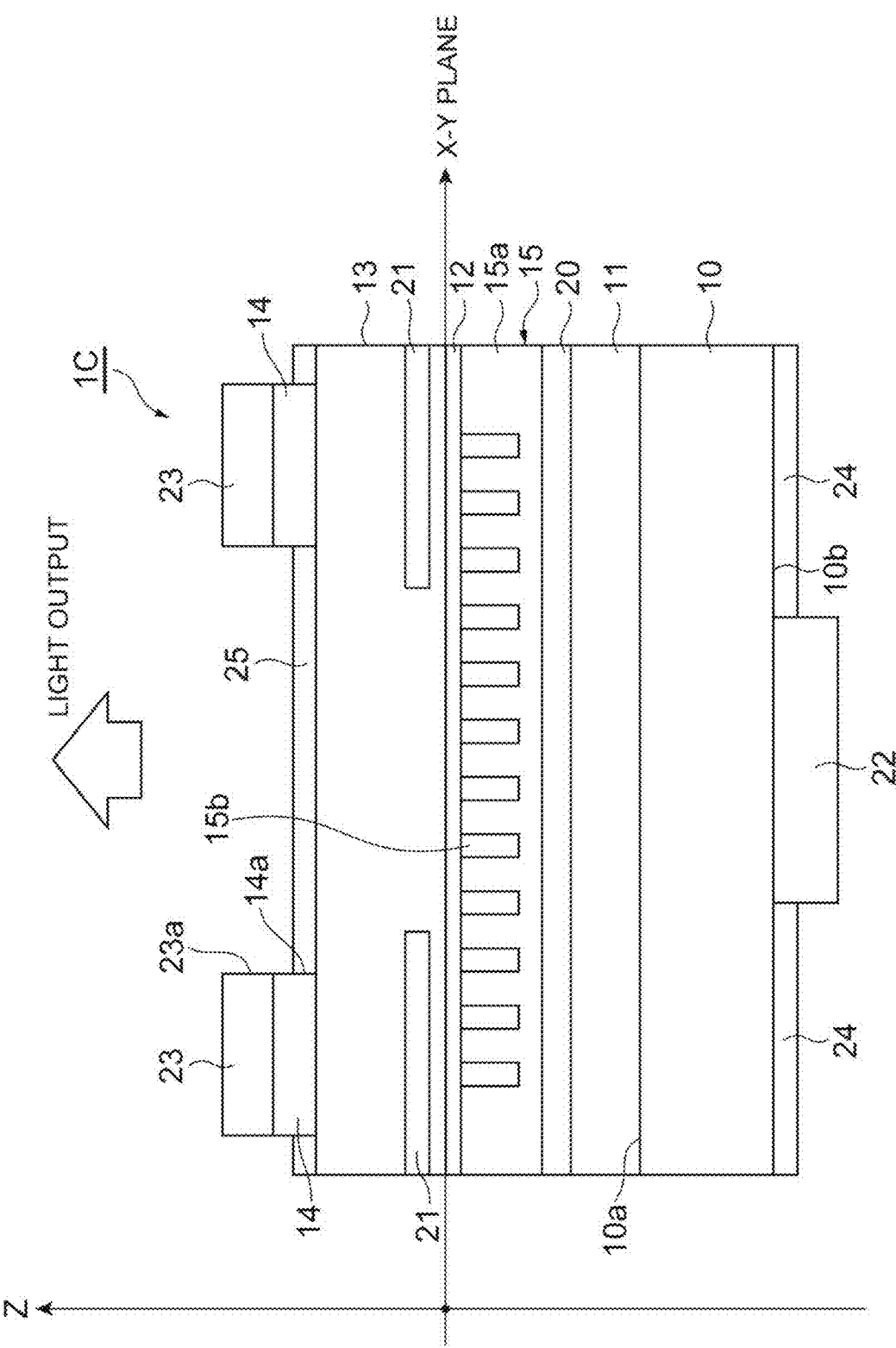
FIG. 25 is a view illustrating the stacked structure of the semiconductor light-emitting element in a case where a phase modulation layer is provided between a cladding layer 11 and an active layer 12.

A structure of the phase modulation layer 15 is the same as the structure of the phase modulation layer 15 described in the first embodiment (see FIGS. 4 and 5). A light guide layer may be provided at least one of between the active layer 12 and the cladding layer 13 and between the active layer 12 and the cladding layer 11 if necessary. As illustrated in FIG. 25, the phase modulation layer 15 may be provided between the cladding layer 11 and the active layer 12. Incidentally, a light guide layer may include a carrier barrier layer configured to efficiently confine carriers in the active layer 12.

Figure 26:
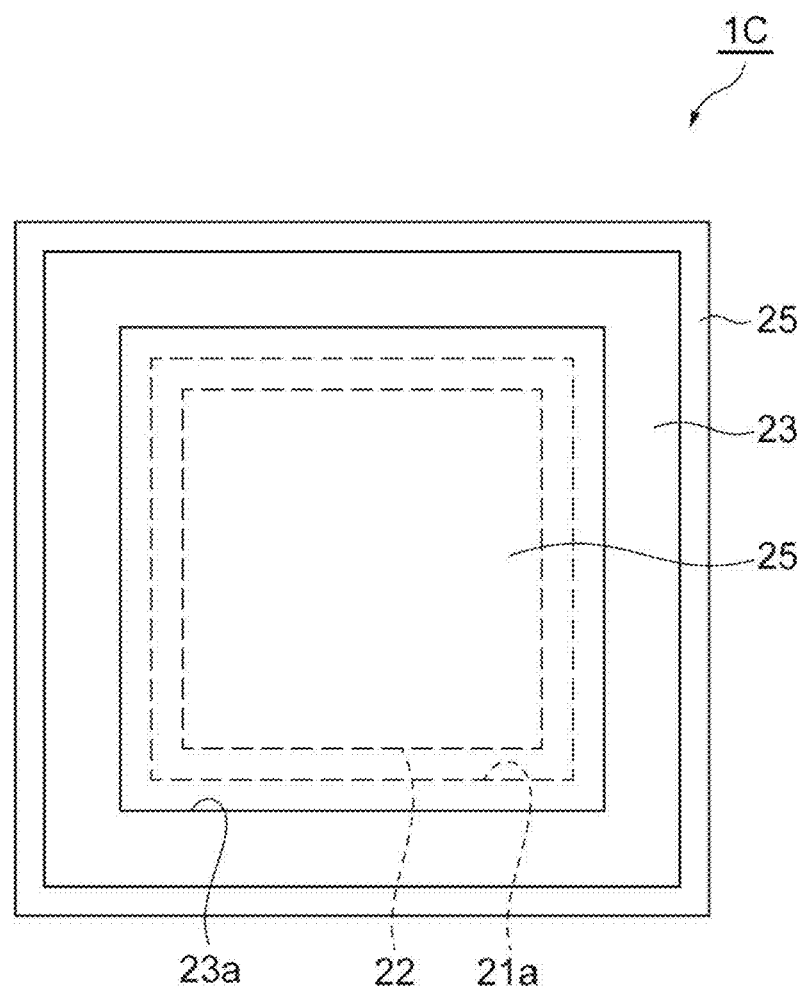
FIG. 26 is a plan view of the semiconductor light-emitting element as viewed from a front surface side.

The semiconductor light-emitting element 1C further includes an electrode 23 provided on the contact layer 14 and an electrode 22 provided on a rear surface 10b of the semiconductor substrate 10. The electrode 23 is in ohmic contact with the contact layer 14, and the electrode 22 is in ohmic contact with the semiconductor substrate 10. FIG. 26 is a plan view of the semiconductor light-emitting element 1C as viewed from the electrode 23 side (front surface side). As illustrated in FIG. 26, the electrode 23 has a frame-like (annular) planar shape (having an opening 23a). Incidentally, FIG. 26 illustrates the electrode 23 in a square frame shape. However, various shapes such as an annular shape can be adopted as the planar shape of the electrode 23. In addition, a shape of the electrode 22 indicated by a broken line in FIG. 26 is similar to a shape of the opening 23a of the electrode 23, and is, for example, a square or a circle. An inner diameter of the opening 23a of the electrode 23 (a length of one side when the shape of the opening 23a is a square) is, for example, 20 μm to 50 μm.

FIG. 24 will be referred to again. The contact layer 14 of the embodiment has the same planar shape as the electrode 23. That is, a central portion of the contact layer 14 is removed by etching to form the opening 14a, and the contact layer 14 has a frame-like (annular) planar shape. Light outputted from the semiconductor light-emitting element 1C passes through the opening 14a of the contact layer 14 and the opening 23a of the electrode 23. As the light is caused to pass through the opening 14a of the contact layer 14, the light absorption in the contact layer 14 is avoided, and it is possible to enhance light output efficiency. When it is possible to allow the light absorption in the contact layer 14, however, the contact layer 14 may cover the entire surface of the cladding layer 13 without providing the opening 14a. As the light passes through the opening 23a of the electrode 23, the light can be suitably outputted from the front surface side of the semiconductor light-emitting element 1C without being blocked by the electrode 23.

A front surface of the cladding layer 13 (or a front surface of the contact layer 14 when the opening 14a is not provided) exposed from the opening 14a of the contact layer 14 is covered with an anti-reflection film 25. Incidentally, the anti-reflection film 25 may also be provided outside the contact layer 14. In addition, a part other than the electrode 22 on the rear surface 10b of the semiconductor substrate 10 is covered with a protective film 24. A material of the protective film 24 is the same as that of the protective film 18 of the first embodiment. A material of the anti-reflection film 25 is the same as that of the anti-reflection film 19 of the first embodiment.

The light reflection layer 20 reflects the light generated in the active layer 12 toward the front surface side of the semiconductor light-emitting element 1C. The light reflection layer 20 is composed of, for example, a distributed bragg reflector (DBR) layer in which a plurality of layers having a modified refractive index are alternately stacked. Incidentally, the light reflection layer 20 of the present embodiment is provided between the active layer 12 and the cladding layer 11, but the light reflection layer 20 may be provided between the cladding layer 11 and the semiconductor substrate 10. Alternatively, the light reflection layer 20 may be provided inside the cladding layer 11.

Incidentally, a conductivity type which is the same as that of the semiconductor substrate 10 is given to the cladding layer 11 and the light reflection layer 20, and a conductivity type opposite to that of the semiconductor substrate 10 is given to the cladding layer 13 and the contact layer 14. In one example, the semiconductor substrate 10, the cladding layer 11 and the light reflection layer 20 are the n-type and the cladding layer 13 and the contact layer 14 are the p-type. When provided between the active layer 12 and the cladding layer 11, the phase modulation layer 15 has the same conductivity type as the semiconductor substrate 10, and has a conductivity type opposite to that of the semiconductor substrate 10 when provided between the active layer 12 and the cladding layer 13. Incidentally, an impurity concentration is, for example, $1 \times 10^{17}$ to $1 \times 10^{21}/cm^3$. The active layer 12 is intrinsic (i-type) which is not intentionally doped with any impurity, and an impurity concentration thereof is $1 \times 10^{15}/cm^3$ or less. In addition, an impurity concentration of the phase modulation layer 15 may be intrinsic (i-type) in a case where it is necessary to suppress the influence of loss caused by light absorption via the impurity level, or the like.

The current confinement layer 21 has a structure that causes the current to hardly pass (or not to pass) therethrough, and has an opening 21a in a central portion thereof. As illustrated in FIG. 26, a planar shape of the opening 21a is similar to the shape of the opening 23a of the electrode 23, and is, for example, a square or a circle. The current confinement layer 21 is, for example, an Al oxide layer formed by oxidizing a layer containing Al at a high concentration. Alternatively, the current confinement layer 21 may be a layer formed by injecting protons ($H^+$) into the cladding layer 13. Alternatively, the current confinement layer 21 may have a reverse p-n junction structure in which a semiconductor layer having a conductivity type opposite to that of the semiconductor substrate 10 and a semiconductor layer having the same conductivity type as that of the semiconductor substrate 10 are stacked in order.

An example of dimensions of the semiconductor light-emitting element 1C of the present embodiment will be described. An inner diameter La of the opening 23a of the electrode 23 (a length of one side when the shape of the opening 23a is a square) is in the range of 5 μm to 100 μm, and is, for example, 50 μm. In addition, a thickness ta of the phase modulation layer 15 is within a range of, for example, 100 nm to 400 nm, and is, for example, 200 nm. A interval tb between the current confinement layer 21 and the contact layer 14 is within a range of 2 μm to 50 μm. In other words, the interval tb is within a range of 0.02 La to 10 La (for example, 0.1 La), and is within a range of 5.0 to 500 ta (for example, 25 ta). In addition, a thickness tc of the cladding layer 13 is larger than the interval tb and is within a range of 2 μm to 50 μm. In other words, the thickness tc is within a range of 0.02 La to 10 La (for example, 0.1 La), and is within a range of 5.0 to 500 ta (for example, 25 ta). A thickness td of the cladding layer 11 is within a range of 1.0 μm to 3.0 μm (for example, 2.0 μm).

When a drive current is supplied between the electrode 22 and the electrode 23, the driving current reaches the active layer 12. At this time, the current flowing between the electrode 23 and the active layer 12 sufficiently diffuses in the thick cladding layer 13 and passes through the opening 21a of the current confinement layer 21. As a result, the current diffuses uniformly near the center of the active layer 12. Then, recoupling of electrons and holes occurs in the active layer 12, and light is generated in the active layer 12. The electrons and holes contributing to the light emission and the generated light are efficiently confined between the lower cladding layer 11 and the upper cladding layer 13. The laser light outputted from the active layer 12 enters the inside of the phase modulation layer 15, and forms a predetermined mode corresponding to a lattice structure inside the phase modulation layer 15. The laser light outputted from the inside of the phase modulation layer 15 is reflected by the light reflection layer 20, and is outputted from the cladding layer 13 to the outside through the openings 14a and 23a.

Specific Example of First Embodiment

The inventors have examined conditions that do not cause a higher-order mode for the thickness and the refractive index of the optical waveguide layer including the active layer and the thickness and the refractive index of the contact layer. A process and a result of the examination will be described hereinafter.

Figure 28:
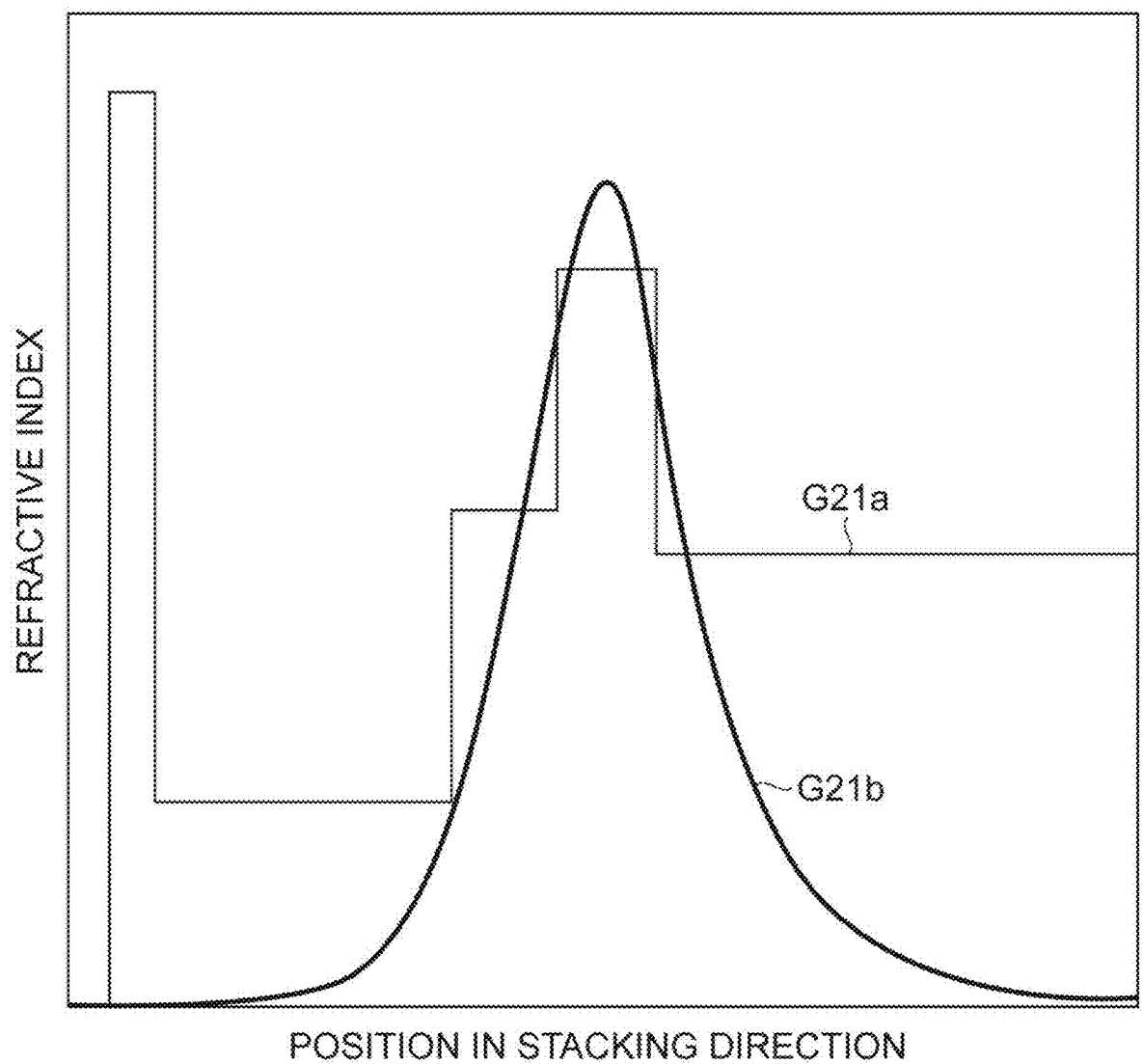
FIG. 28 illustrates a refractive index profile and a mode distribution of the semiconductor light-emitting element having the layer structure illustrated in FIG. 27.

First, a specific structure of the semiconductor light-emitting element 1A that has been examined in this specific example will be described. FIG. 27 is a table illustrating a layer structure when the semiconductor light-emitting element 1A is made of a GaAs-based compound semiconductor (emission wavelength: 940 nm band). The table of FIG. 27 illustrates a conductivity type, a composition, a layer thickness, and a refractive index of each layer. Incidentally, layer number 1 indicates the contact layer 14, layer number 2 indicates the cladding layer 13, layer number 3 indicates the phase modulation layer 15, layer number 4 indicates the light guide layer and the active layer 12, and layer number 5 indicates the cladding layer 11. FIG. 28 illustrates a refractive index profile G21a and a mode distribution G21b of the semiconductor light-emitting element 1A having the layer structure illustrated in FIG. 27. The horizontal axis represents a position in the stacking direction (range is 2.5 μm). At this time, it can be understood that only a fundamental mode has been generated and the higher-order mode has been suppressed.

Figure 30:
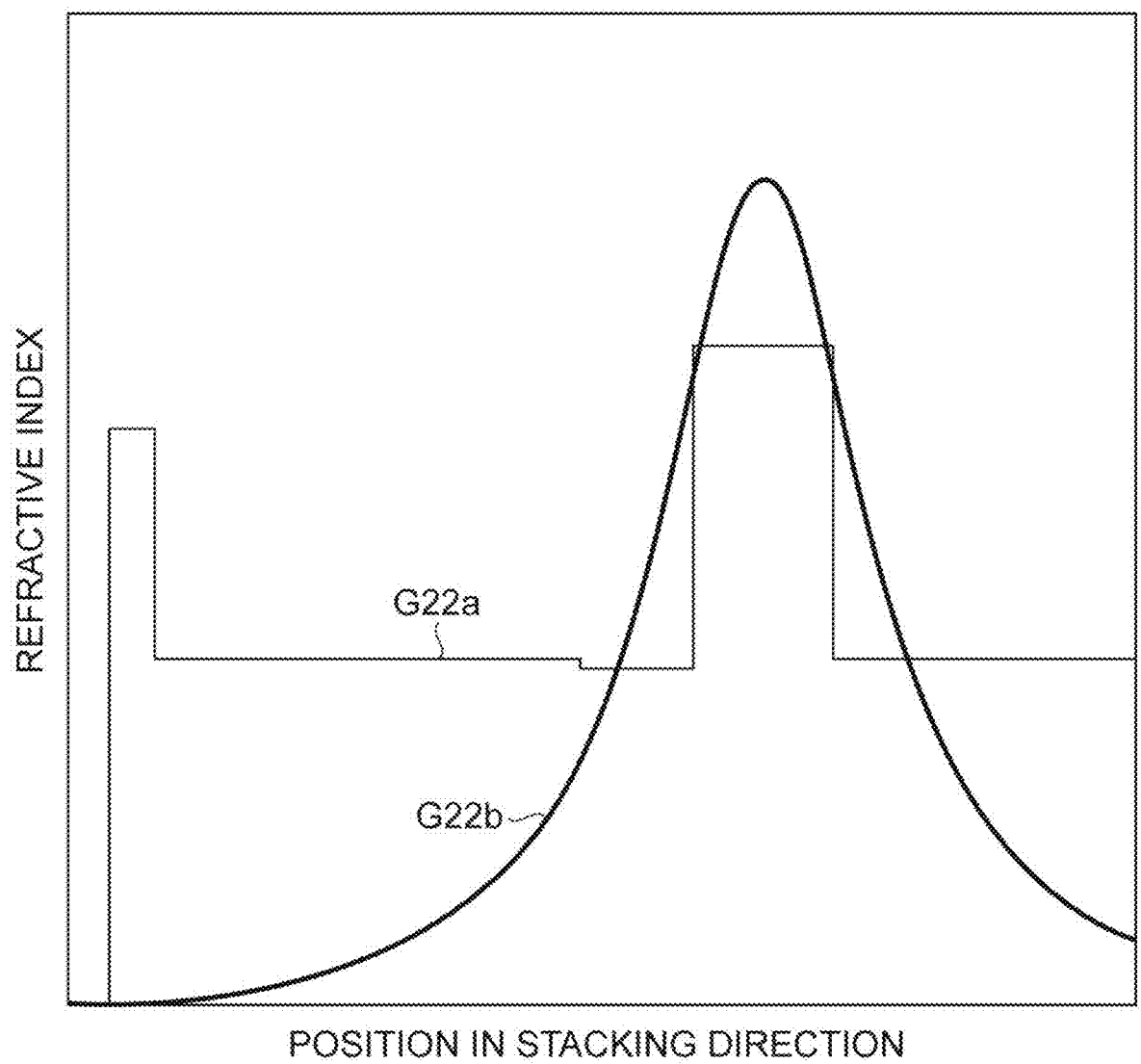
FIG. 30 illustrates a refractive index profile and a mode distribution of the semiconductor light-emitting element having the layer structure illustrated in FIG. 29.

FIG. 29 is a table illustrating a layer structure when the semiconductor light-emitting element 1A is made of an InP-based compound semiconductor (emission wavelength: 1300 nm band). Layer number 1 indicates the contact layer 14, layer number 2 indicates the cladding layer 13, layer number 3 indicates the phase modulation layer 15, layer number 4 indicates the light guide layer and the active layer 12, and layer number 5 indicates the cladding layer 11. FIG. 30 illustrates a refractive index profile G22a and a mode distribution G22b of the semiconductor light-emitting element 1A having the layer structure illustrated in FIG. 29. The horizontal axis represents a position in the stacking direction (range is 2.5 μm). At this time, it can be understood that only a fundamental mode has been generated and the higher-order mode has been suppressed.

Figure 32:
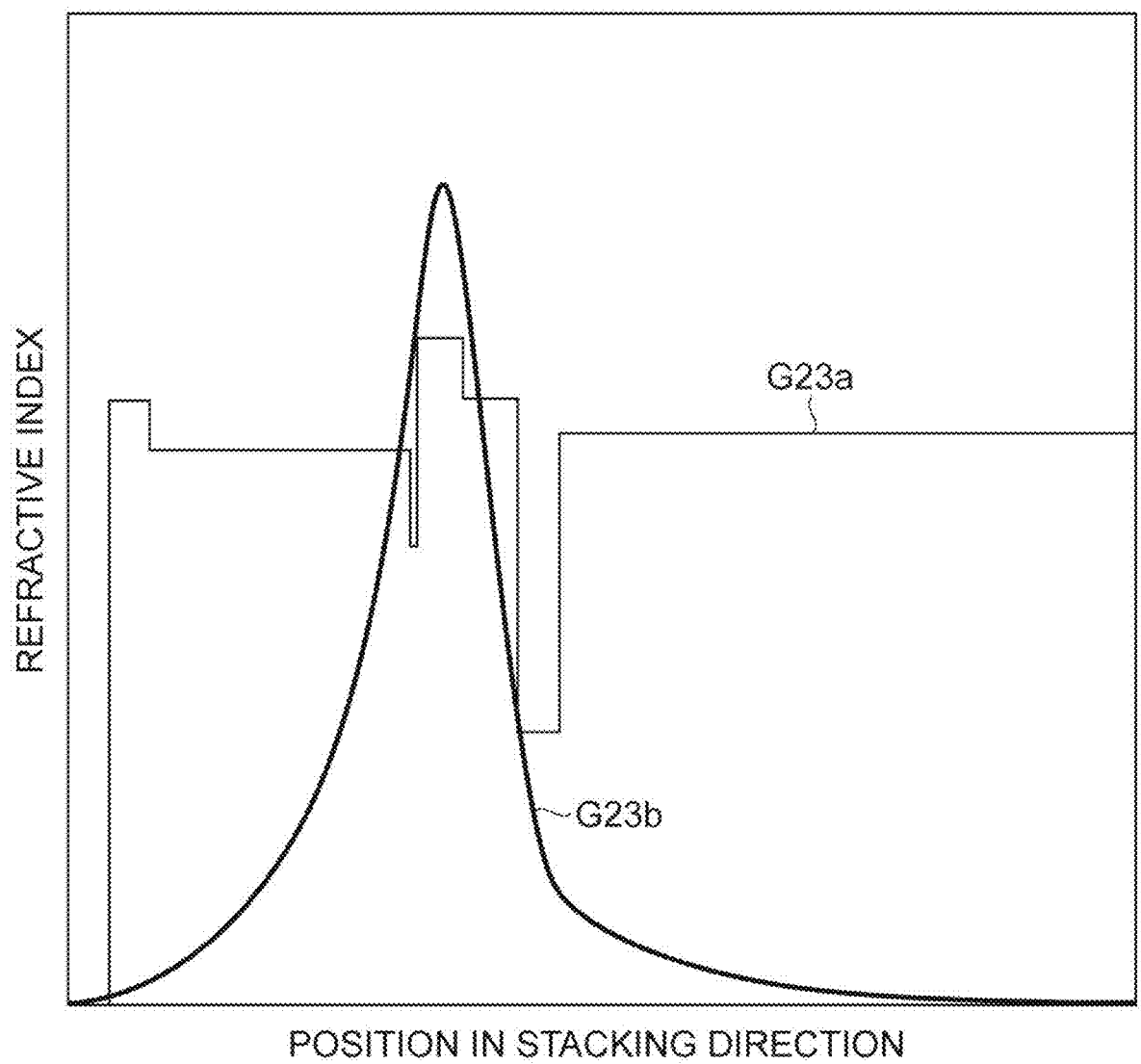
FIG. 32 illustrates a refractive index profile and a mode distribution of the semiconductor light-emitting element having the layer structure illustrated in FIG. 31.

FIG. 31 is a table illustrating a layer structure when the semiconductor light-emitting element 1A is made of a nitride-based compound semiconductor (emission wavelength: 405 nm band). Layer number 1 indicates the contact layer 14, layer number 2 indicates the cladding layer 13, layer number 3 indicates the carrier barrier layer, layer number 4 indicates the active layer 12, layer number 5 indicates the light guide layer, layer number 6 indicates the phase modulation layer 15, and layer number 7 indicates the cladding layer 11. FIG. 32 illustrates a refractive index profile G23a and a mode distribution G23b of the semiconductor light-emitting element 1A having the layer structure illustrated in FIG. 31. The horizontal axis represents a position in the stacking direction (range is 2.5 μm). At this time, it can be understood that only a fundamental mode has been generated and the higher-order mode has been suppressed.

Incidentally, the filling factor (FF) of the phase modulation layer 15 is 15% in each of the above structures. The filling factor is a ratio of the area of the modified refractive index region 15b accounting for the single unit constituent region R.

Next, preconditions for the examination will be described. The following examination has been conducted assuming a TE mode. That is, a leakage mode and a TM mode are not considered. In addition, the cladding layer 11 is sufficiently thick, and the influence of the semiconductor substrate 10 is negligible. In addition, a refractive index of the cladding layer 13 is equal to or lower than a refractive index of the cladding layer 11. Then, the active layer 12 (MQW layer) and the light guide layer are regarded as one optical waveguide layer (core layer) having an average dielectric constant and a total film thickness unless otherwise specified. In addition, a dielectric constant of the phase modulation layer 15 is an average dielectric constant based on a filling factor.

Calculation formulas of an average refractive index and the film thickness of the optical waveguide layer including the active layer 12 and the light guide layer are given as follows. That is, $\varepsilon_{core}$ is an average dielectric constant of the optical waveguide layer, and is defined by the following Formula (26). Further, $\varepsilon_i$ is a dielectric constant of each layer, $d_i$ is a thickness of each layer, and $n_i$ is a refractive index of each layer. Further, $n_{core}$ is the average refractive index of the optical waveguide layer and is defined by the following Formula (27). Further, $d_{core}$ is the film thickness of the optical waveguide layer and is defined by the following Formula (28).

$$\varepsilon_{core} = \frac{\sum_{i=1}^{N} \varepsilon_i \cdot d_i}{\sum_{i=1}^{N} d_i} = \frac{\sum_{i=1}^{N} n_i^2 \cdot d_i}{\sum_{i=1}^{N} d_i} \quad (26)$$

$$n_{core} = \sqrt{\varepsilon_{core}} = \sqrt{\frac{\sum_{i=1}^{N} n_i^2 \cdot d_i}{\sum_{i=1}^{N} d_i}} \quad (27)$$

$$d_{core} = \sum_{i=1}^{N} d_i \quad (28)$$

In addition, a calculation formula for an average refractive index of the phase modulation layer 15 is given as follows. That is, $n_{PM}$ is the average refractive index of the phase modulation layer 15 and is defined by the following Formula (29). Further, $\varepsilon_{PM}$ is a dielectric constant of the phase modulation layer 15, $n_1$ is a refractive index of a first refractive index medium, $n_2$ is a refractive index of a second refractive index medium, and FF is the filling factor.

$$n_{PM} = \sqrt{\varepsilon_{PM}} = \sqrt{n_1^2 \cdot FF + n_2^2 \cdot (1-FF)} \quad (29)$$

Figure 33B:
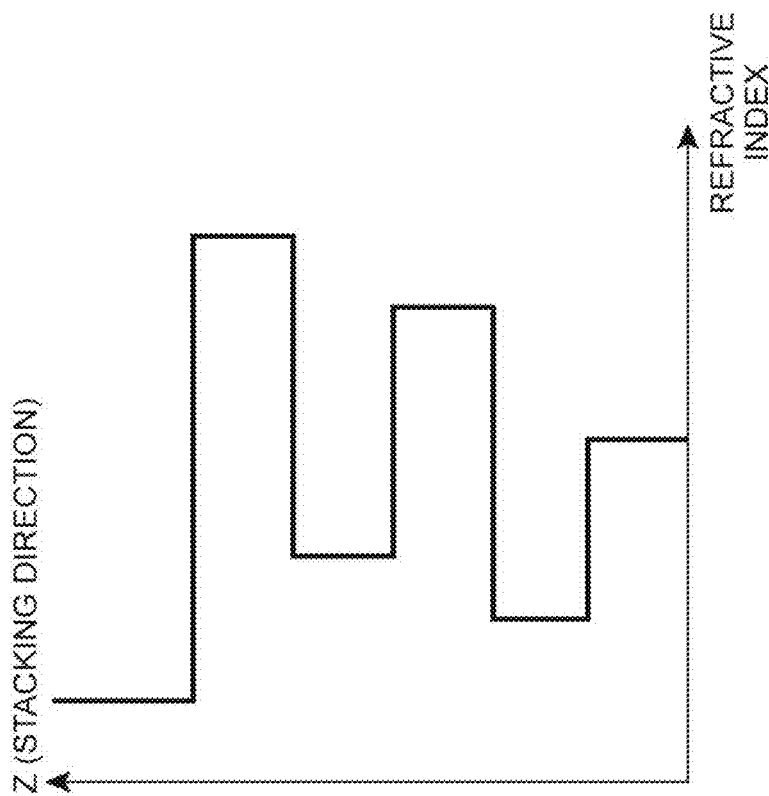
FIGS. 33A and 33B are a cross-sectional view and a refractive index profile for describing a case where a waveguide structure is approximated by a six-layer slab waveguide.
Figure 33A:
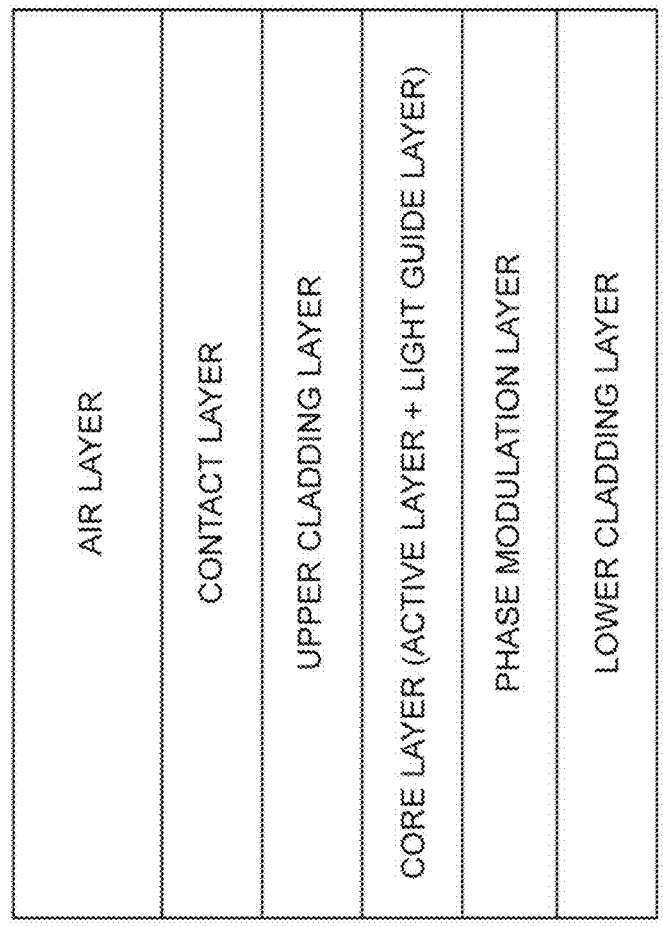
Figure 34A:
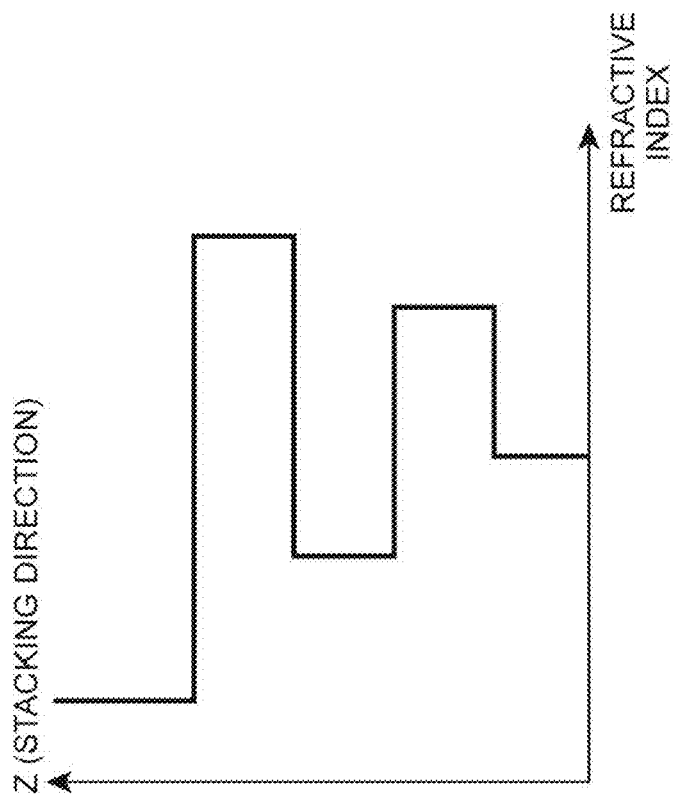
FIGS. 34A and 34B are a cross-sectional view and a refractive index profile for describing a case where a waveguide structure is approximated by a five-layer slab waveguide.
Figure 34B:
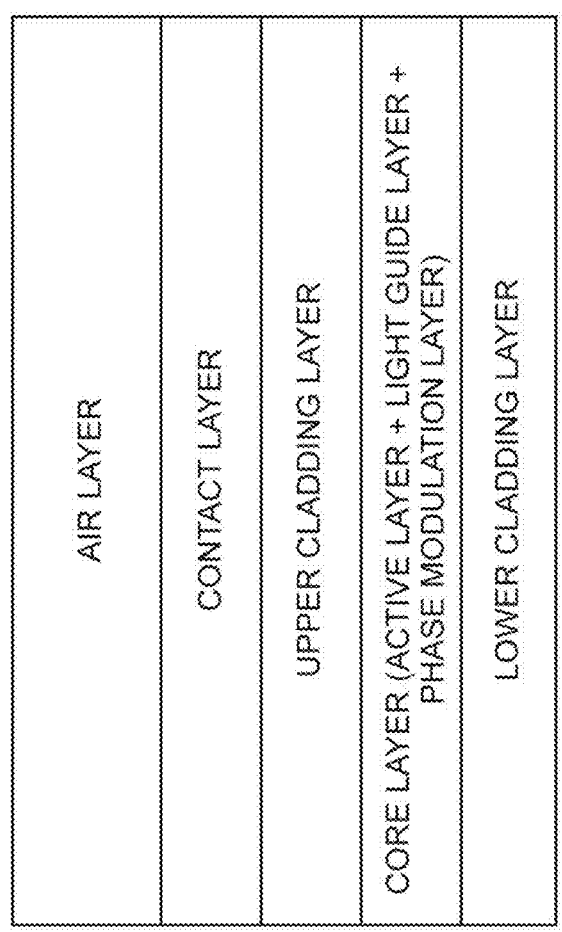

In the following examination, a waveguide structure has been approximated by a five-layer or six-layer slab waveguide. FIGS. 33A and 33B are a cross-sectional view and a refractive index profile for describing a case where the waveguide structure is approximated by the six-layer slab waveguide. FIGS. 34A and 34B are a cross-sectional view and a refractive index profile for describing a case where the waveguide structure is approximated by the five-layer slab waveguide. As illustrated in FIGS. 33A and 33B, when the refractive index of the phase modulation layer 15 is lower than the refractive index of the cladding layer 11, the phase modulation layer 15 does not have a waveguide function, and thus, the approximation has been made for the six-layer slab waveguide. That is, the optical waveguide layer has a structure that includes the active layer 12 and the light guide layer, but does not include the cladding layer 11, the cladding layer 13, and the phase modulation layer 15. Such an approximation can be applied to, for example, a structure illustrated in FIGS. 29 and 31 (In this specific example, an InP-based compound semiconductor or a nitride-based compound semiconductor).

In addition, as illustrated in FIGS. 34A and 34B, when the refractive index of the phase modulation layer 15 is equal to or higher than the refractive index of the cladding layer 11, the phase modulation layer 15 has the waveguide function, and thus, the approximation has been made for the five-layer slab waveguide. That is, the optical waveguide layer has a structure that includes the phase modulation layer 15 and the active layer 12, but does not include the cladding layer 11 and the cladding layer 13. Such an approximation can be applied to, for example, a structure illustrated in FIG. 27 (a GaAs-based compound semiconductor in this example).

Further, a calculation range is limited to a peripheral portion of each of the optical waveguide layer and the contact layer having refractive indices higher than an equivalent refractive index of the semiconductor light-emitting element 1A in order to further simplify the calculation. That is, a three-layer slab structure related to the optical waveguide layer is defined by the optical waveguide layer and upper and lower layers adjacent to the optical waveguide layer, and a three-layer slab structure related to the contact layer 14 is defined by the contact layer 14 and adjacent upper and lower layers.

Figure 35A:
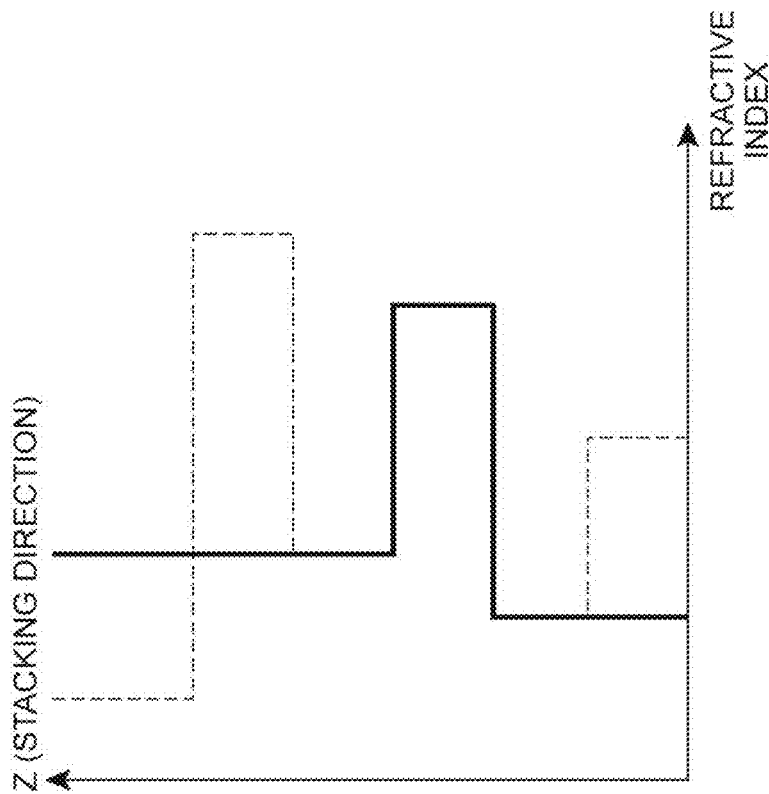
FIGS. 35A and 35B are a cross-sectional view and a refractive index profile illustrating a three-layer slab structure related to an optical waveguide layer in the six-layer slab waveguide.
Figure 35B:
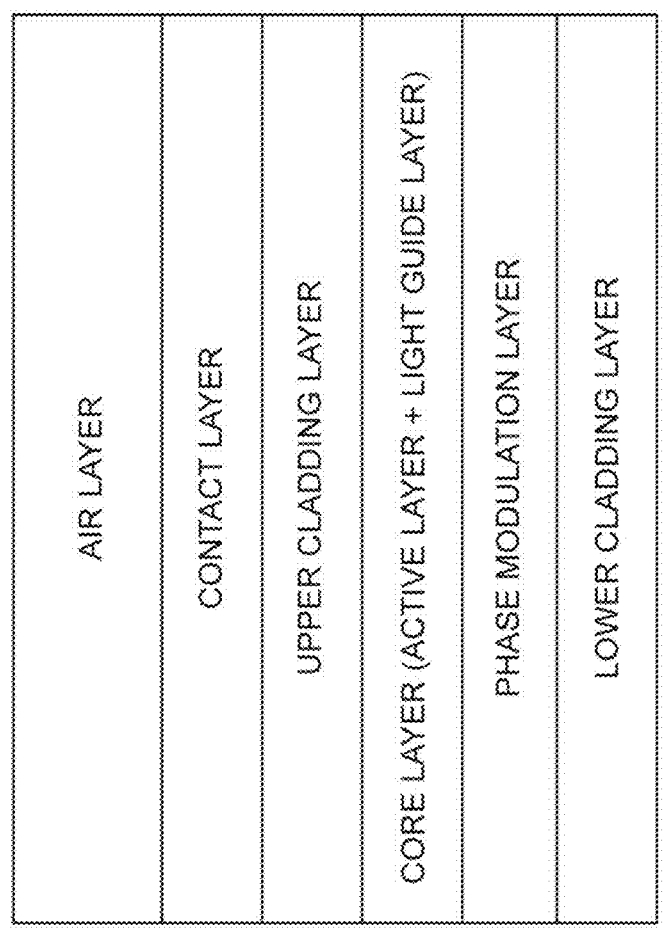
Figure 36A:
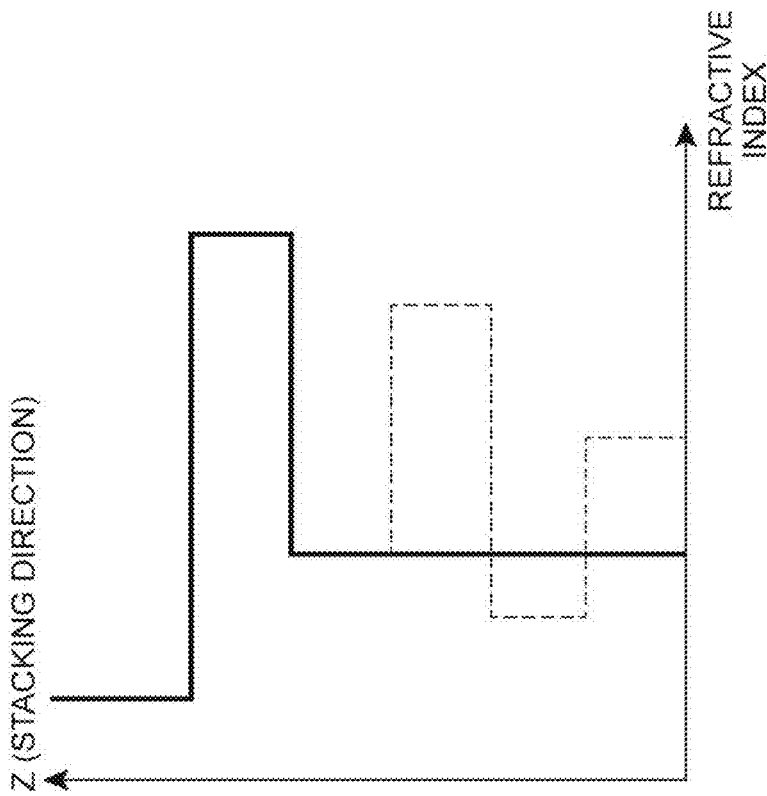
FIGS. 36A and 36B are a cross-sectional view and a refractive index profile illustrating a three-layer slab structure related to a contact layer in the six-layer slab waveguide.
Figure 36B:
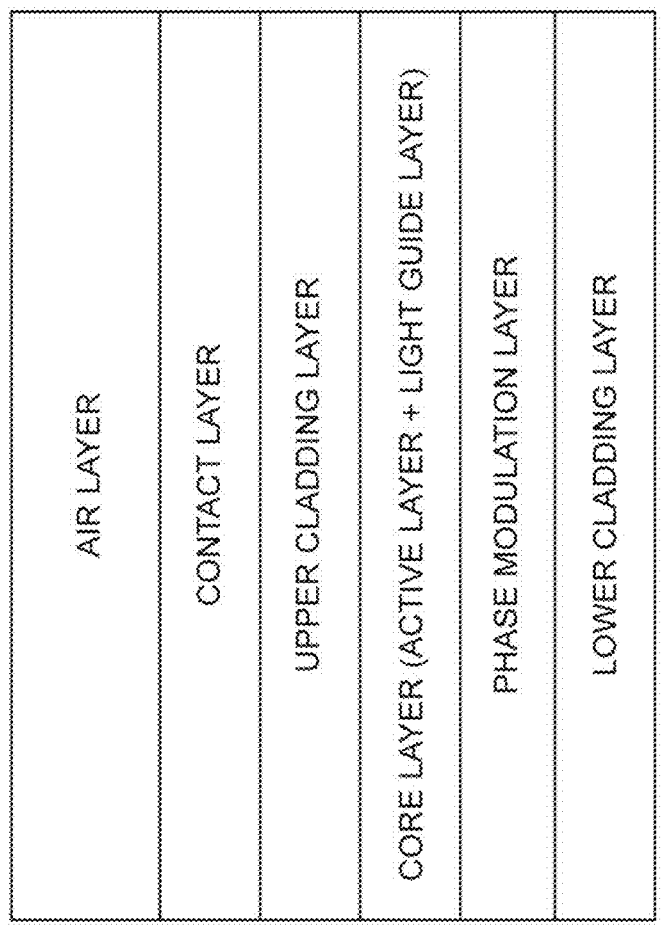

FIGS. 35A and 35B illustrate a cross-sectional view and a refractive index profile for describing the three-layer slab structure related to the optical waveguide layer in the six-layer slab waveguide (see FIGS. 33A and 33B). In this case, a guided mode of the optical waveguide layer is calculated based on a refractive index profile indicated by the solid line in the refractive index profile of FIG. 35B. In addition, FIGS. 36A and 36B illustrate a cross-sectional view and a refractive index profile for describing the three-layer slab structure related to the contact layer 14 in the six-layer slab waveguide (see FIGS. 33A and 33B). In this case, a guided mode of the contact layer 14 is calculated based on a refractive index profile illustrated by the solid line in FIG. 36B.

FIGS. 37A and 37B illustrate a cross-sectional view and a refractive index profile for describing the three-layer slab structure related to the optical waveguide layer in the five-layer slab waveguide (see FIGS. 34A and 34B). In this case, a guided mode of the optical waveguide layer is calculated based on a refractive index profile indicated by the solid line in FIG. 37B. In addition, FIGS. 38A and 38B illustrate a cross-sectional view and a refractive index profile for describing the three-layer slab structure related to the contact layer 14 in the five-layer slab waveguide (see FIGS. 34A and 34B). In this case, a guided mode of the contact layer 14 is calculated based on a refractive index profile illustrated by the solid line in FIG. 38B.

Incidentally, the refractive index of the cladding layer 11 needs to be equal to or lower than the equivalent refractive index of the semiconductor light-emitting element 1A in order to prevent the guided mode from leaking to the semiconductor substrate 10 via the cladding layer 11 at the time of the approximation by the above-described three-layer slab structure.

Here, an analytical expression of the three-layer slab structure will be described. FIG. 39A illustrates a three-layer slab structure 30 including the cladding layer 11, the optical waveguide layer 31, and the cladding layer 13, and FIG. 39B illustrates a refractive index profile thereof. Here, the refractive index of the cladding layer 11 is $n_2$, the refractive index of the optical waveguide layer 31 is $n_1$, and the refractive index of the cladding layer 13 is $n_3$. Then, when the normalized waveguide width $V_1$ of the optical waveguide layer 31 is defined by the above Formula (1), the guided mode is set to only the fundamental mode within a range where there is only one solution of the normalized waveguide width $V_1$. However, when examining the guided modes of the above-described five-layer slab structure and six-layer slab structure with the analytical expression of the three-layer slab structure, the condition expressed by the above Formula (2) also needs to be satisfied since it is necessary for the guided mode not to leak to the cladding layer 11.

Regarding the contact layer 14, the cladding layer 11, the optical waveguide layer 31, and the cladding layer 13 may be replaced with the cladding layer 13, the contact layer 14, and an air layer, respectively, in FIGS. 39A and 39B. Then, assuming that the refractive index of the contact layer 14 is $n_4$ and a refractive index of the air layer is $n_5$, the above Formula (5) related to the normalized waveguide width $V_2$ of the contact layer 14 is obtained. Then, no guided mode exists in the contact layer 14 in a range where there is no solution of the normalized waveguide width $V_2$. However, when examining the guided modes of the above-described five-layer slab structure and six-layer slab structure with the analytical expression of the three-layer slab structure, the condition expressed by the above Formula (6) also needs to be satisfied since it is necessary for the guided mode not to leak to the cladding layer 11.

Incidentally, it has been confirmed that the thickness of the cladding layer 13 has no influence on the guided mode by changing the thickness of the cladding layer 13 and analyzing the guided mode thus generated.

(When Semiconductor Light-Emitting Element 1A is Made of GaAs-Based Compound Semiconductor)

FIG. 40 is a table illustrating an example of a five-layer slab structure when the semiconductor light-emitting element 1A is made of a GaAs-based compound semiconductor. A range of a film thickness of the optical waveguide layer (layer number 4) and a contact layer (layer number 2) in this five-layer slab structure can be obtained by the following calculation.

Figure 42:
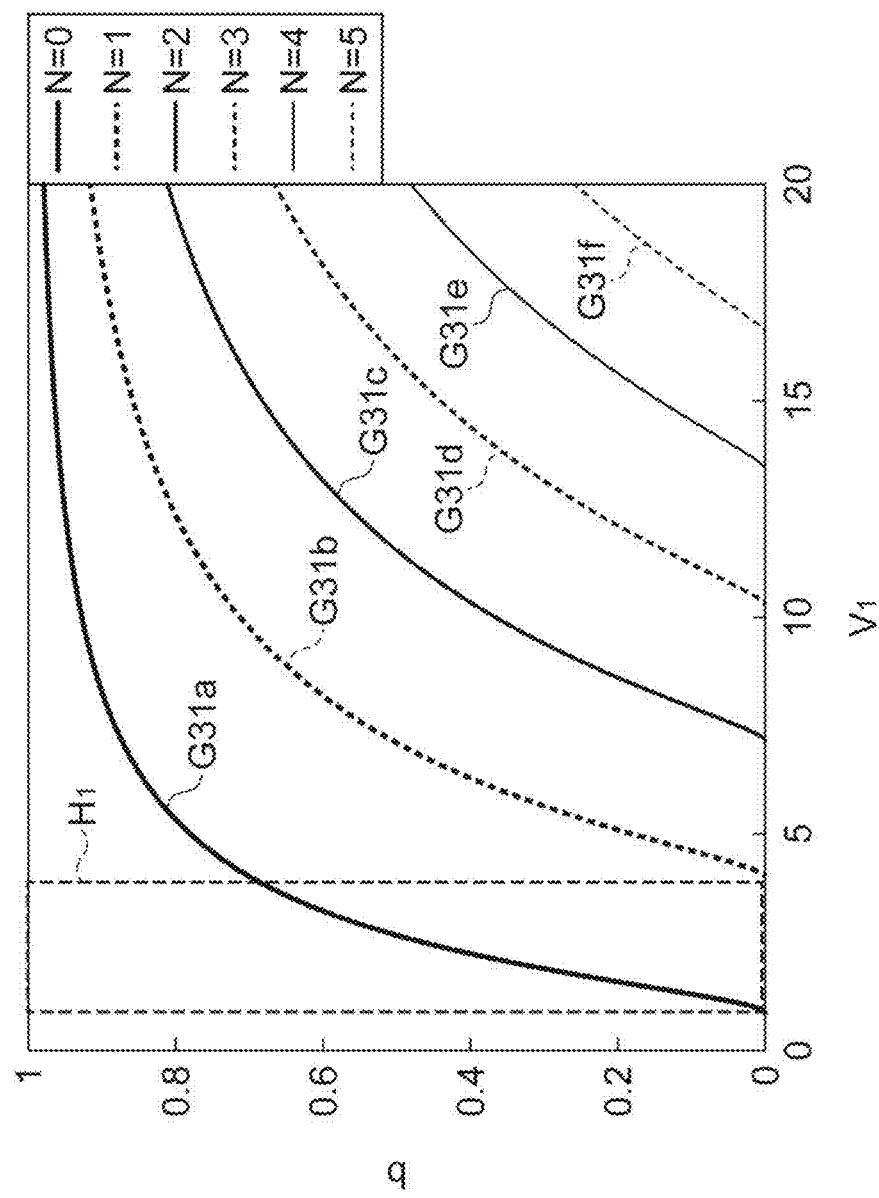
FIG. 42 is a graph illustrating a relationship between the normalized waveguide width $V_1$ of an optical waveguide layer expressed by Formulas (1) and (2) and the normalized propagation coefficient b.

FIG. 41A is a table illustrating the refractive indices $n_1$, $n_2$, and $n_3$, the asymmetric parameter a', and the refractive index $n_{clad}$ of the cladding layer 11 used in the calculation. In this case, FIG. 42 illustrates a relationship between the normalized waveguide width $V_1$ of the optical waveguide layer and the normalized propagation coefficient b expressed by the above Formulas (1) and (2). In FIG. 42, graphs G31a to G31f illustrate cases where a mode order N=0 to 5, respectively. In this graph, the guided mode is set to only the fundamental mode (that is, N=0) in the range where the normalized waveguide width $V_1$ has one solution, and is inside a range $H_1$. The range $H_1$ is a range having a value of the normalized waveguide width $V_1$ corresponding to N=0 when the normalized propagation coefficient b is 0 as a lower limit value and a value of the normalized waveguide width $V_1$ corresponding to N=1 when the normalized propagation coefficient b is 0 as an upper limit value. FIG. 41B is a table illustrating calculation results of such lower limit value and upper limit value.

Figure 44:
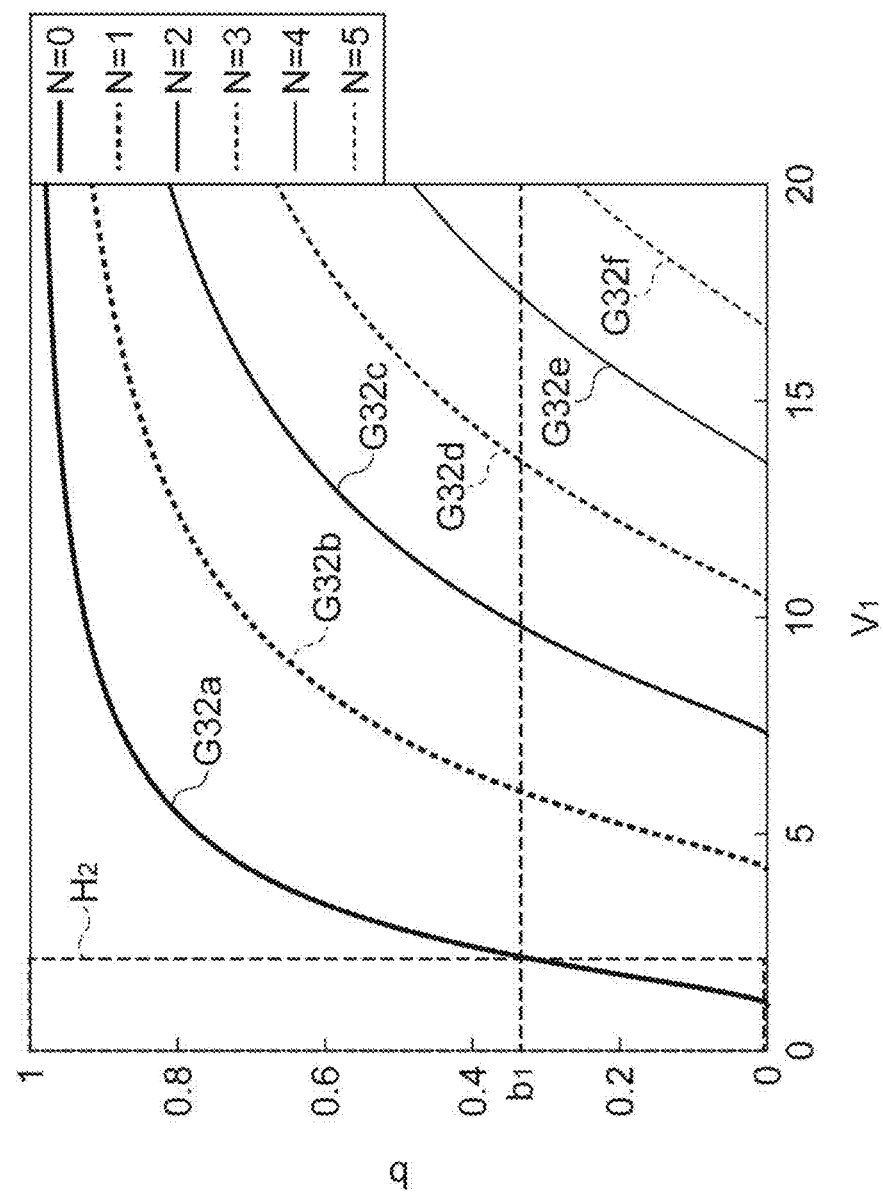
FIG. 44 is a graph illustrating a relationship between the normalized waveguide width $V_2$ of a contact layer expressed by Formulas (5) and (6) and the normalized propagation coefficient b.

In addition, FIG. 43A is a table illustrating the refractive indices $n_4$, $n_5$, and $n_6$, the asymmetric parameter a', and the refractive index $n_{clad}$ of the cladding layer 11 used in the calculation. In this case, FIG. 44 illustrates a relationship between the normalized waveguide width $V_2$ of the contact layer 14 and the normalized propagation coefficient b expressed by the above Formulas (5) and (6). In FIG. 44, graphs G32a to G32f illustrate cases where the mode order N=0 to 5, respectively. In the graph, no guided mode caused by the contact layer 14 is generated, and the guided mode of the semiconductor light-emitting element 1A is set to only the fundamental mode of the optical waveguide layer in a range where there is no solution of the normalized waveguide width $V_2$, and is inside a range $H_2$. The range $H_2$ is a range having 0 as a lower limit value and a value of the normalized waveguide width $V_2$ corresponding to N=0 when the normalized propagation coefficient b is a value $b_1$ corresponding to the refractive index of the cladding layer 11 as an upper limit value. FIG. 43B is a table illustrating a calculation result of such an upper limit value.

Figure 45:
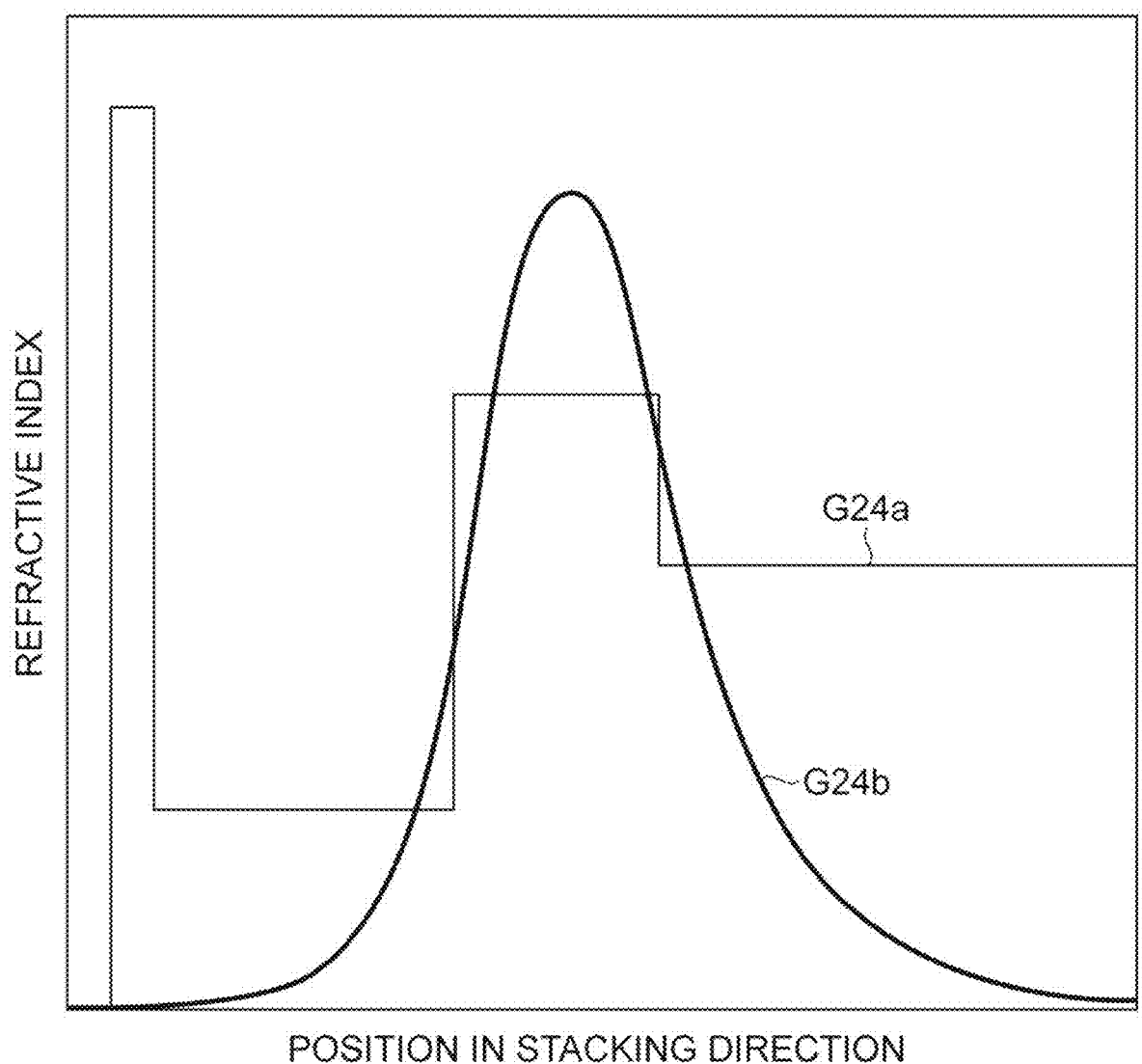
FIG. 45 illustrates a refractive index profile and a mode distribution of the semiconductor light-emitting element having the layer structure illustrated in FIG. 40.

FIG. 45 illustrates a refractive index profile G24a and a mode distribution G24b of the semiconductor light-emitting element 1A having the layer structure illustrated in FIG. 40. It can be understood that only the fundamental mode has been generated remarkably, and the higher-order mode has been suppressed.

(When Semiconductor Light-Emitting Element 1A is Made of InP-Based Compound Semiconductor)

FIG. 46 is a table illustrating an example of a six-layer slab structure when the semiconductor light-emitting element 1A is made of an InP-based compound semiconductor. A range of a film thickness of the optical waveguide layer (layer number 5) and a contact layer (layer number 2) in this six-layer slab structure can be obtained by the following calculation.

Figure 48:
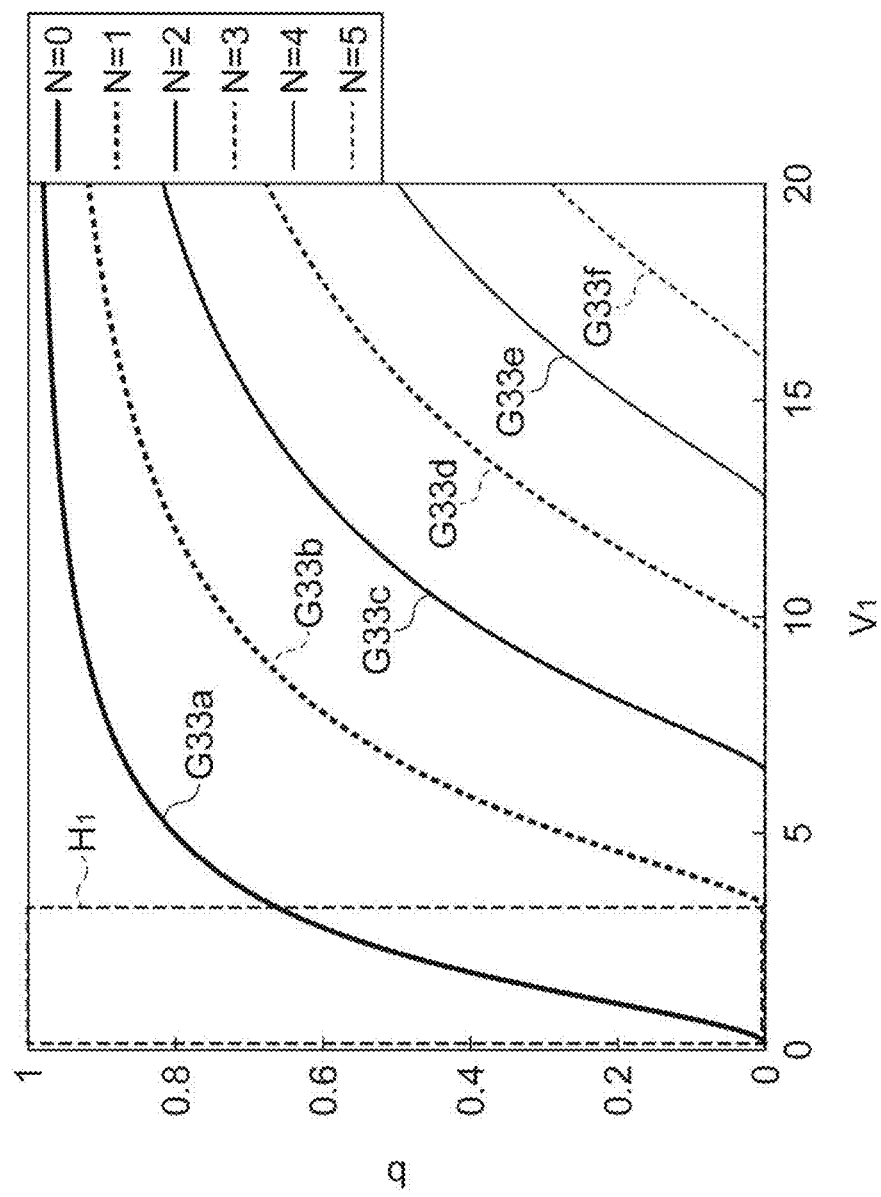
FIG. 48 is a graph illustrating a relationship between the normalized waveguide width $V_1$ of an optical waveguide layer expressed by Formulas (1) and (2) and the normalized propagation coefficient b.

FIG. 47A is a table illustrating the refractive indices $n_1$, $n_2$, and $n_3$, the asymmetric parameter a', and the refractive index $n_{clad}$ of the cladding layer 11 used in the calculation. In this case, FIG. 48 illustrates a relationship between the normalized waveguide width $V_1$ of the optical waveguide layer and the normalized propagation coefficient b expressed by the above Formulas (1) and (2). In FIG. 48, graphs G33a to G33f illustrate cases where the mode order N=0 to 5, respectively. In this graph, the guided mode is set to only the fundamental mode (that is, N=0) in the range where the normalized waveguide width $V_1$ has one solution, and is inside a range $H_1$. Incidentally, a definition of the range $H_1$ is the same as that in the case of the GaAs-based compound semiconductor described above. FIG. 47B is a table illustrating calculation results of a lower limit value and an upper limit value.

Figure 50:
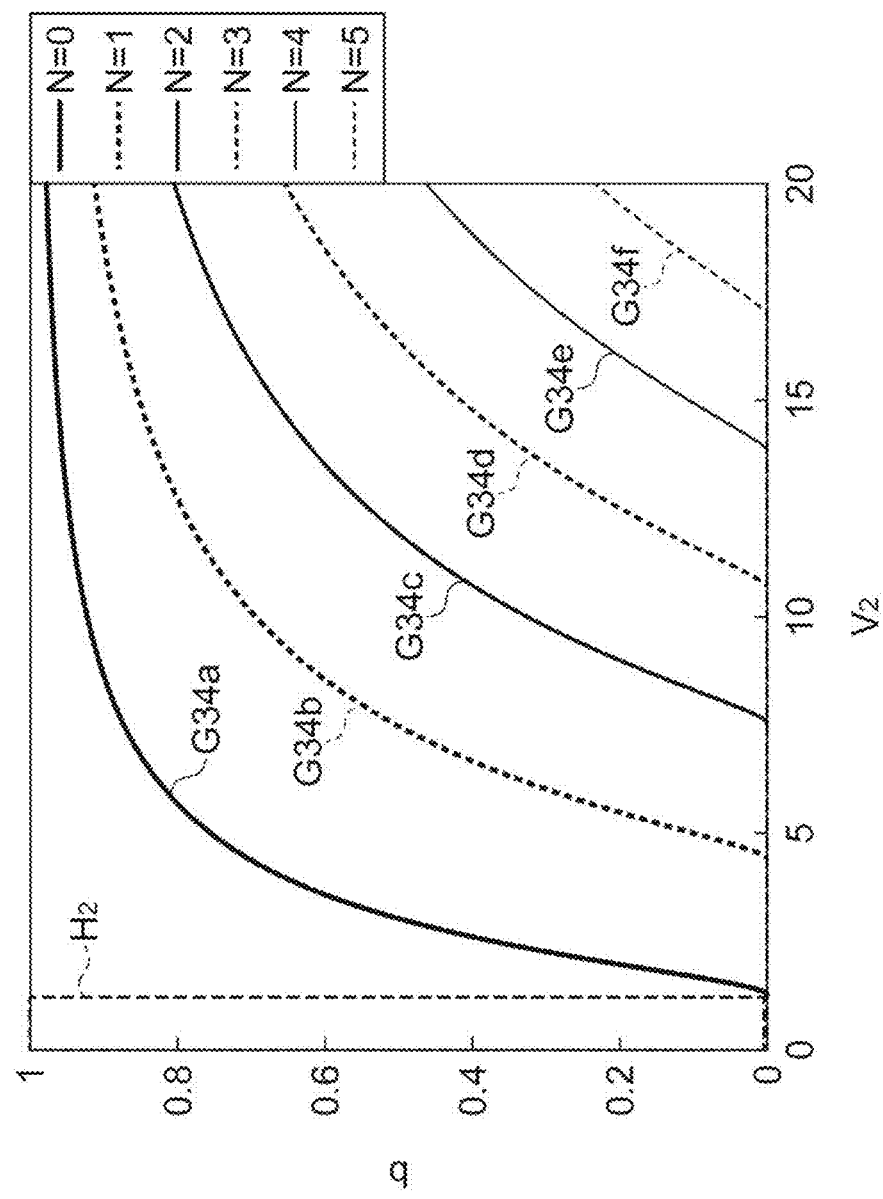
FIG. 50 is a graph illustrating a relationship between the normalized waveguide width $V_2$ of a contact layer expressed by Formulas (5) and (6) and the normalized propagation coefficient b.

In addition, FIG. 49A is a table illustrating the refractive indices $n_4$, $n_5$, and $n_6$, the asymmetric parameter a', and the refractive index $n_{clad}$ of the cladding layer 11 used in the calculation. In this case, the graph of FIG. 50 illustrates a relationship between the normalized waveguide width $V_2$ of the contact layer 14 and the normalized propagation coefficient b expressed by the above Formulas (5) and (6). In FIG. 50, graphs G34a to G34f illustrate cases where the mode order N=0 to 5, respectively. In the graph, no guided mode caused by the contact layer 14 is generated, and the guided mode of the semiconductor light-emitting element 1A is set to only the fundamental mode of the optical waveguide layer in a range where there is no solution of the normalized waveguide width $V_2$, and is inside a range $H_2$. A definition of the range $H_2$ is the same as that in the case of the GaAs-based compound semiconductor described above. FIG. 49B is a table illustrating a calculation result of such an upper limit value.

Figure 51:
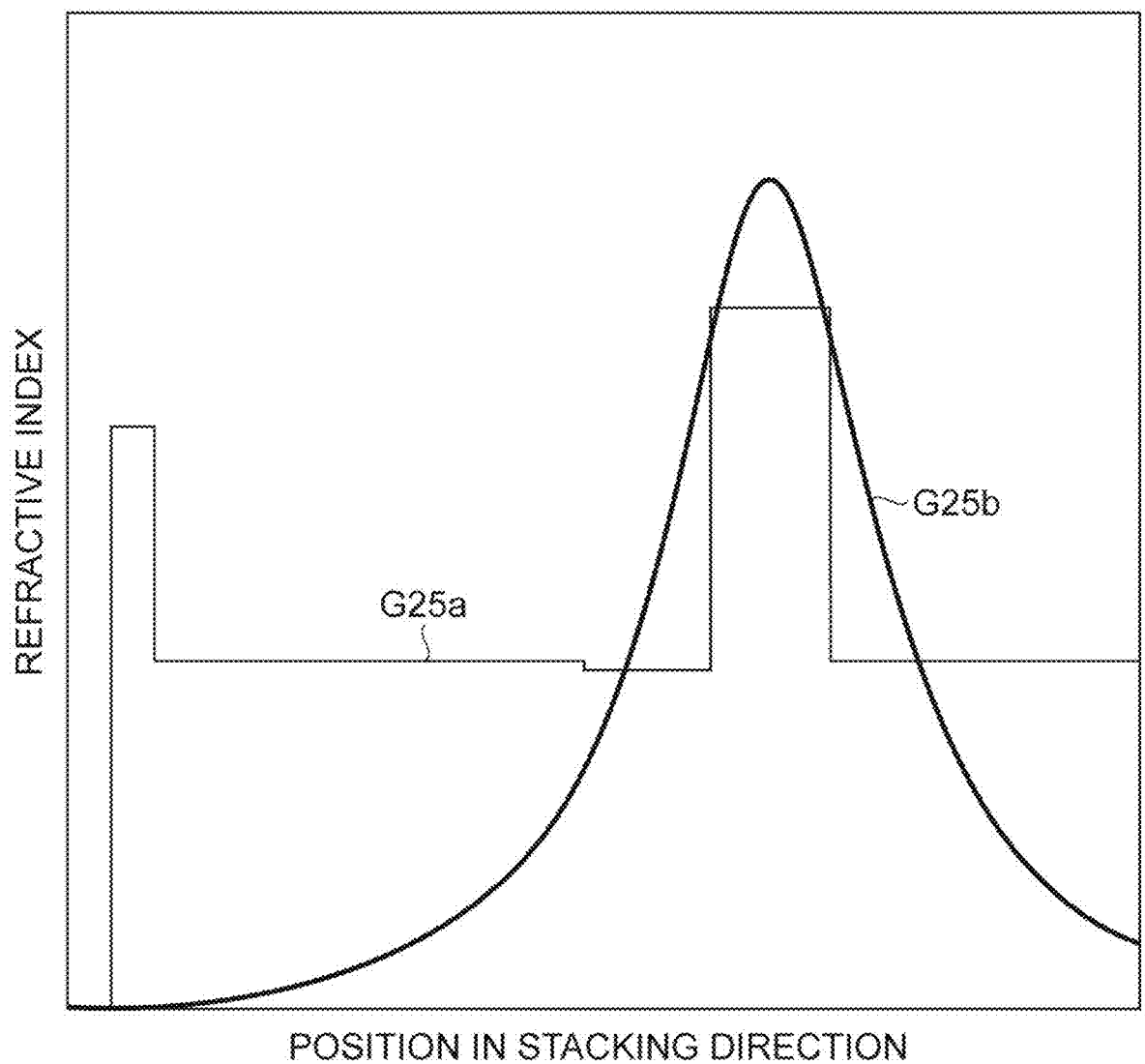
FIG. 51 illustrates a refractive index profile and a mode distribution of the semiconductor light-emitting element having the layer structure illustrated in FIG. 46.

FIG. 51 illustrates a refractive index profile G25a and a mode distribution G25b of the semiconductor light-emitting element 1A having the layer structure illustrated in FIG. 46. It can be understood that only the fundamental mode has been generated remarkably, and the higher-order mode has been suppressed.

(When Semiconductor Light-Emitting Element 1A is Made of Nitride-Based Compound Semiconductor)

FIG. 52 is a table illustrating an example of a six-layer slab structure when the semiconductor light-emitting element 1A is made of a nitride-based compound semiconductor. A range of a film thickness of the optical waveguide layer (layer number 4) and a contact layer (layer number 2) in this six-layer slab structure can be obtained by the following calculation.

Figure 54:
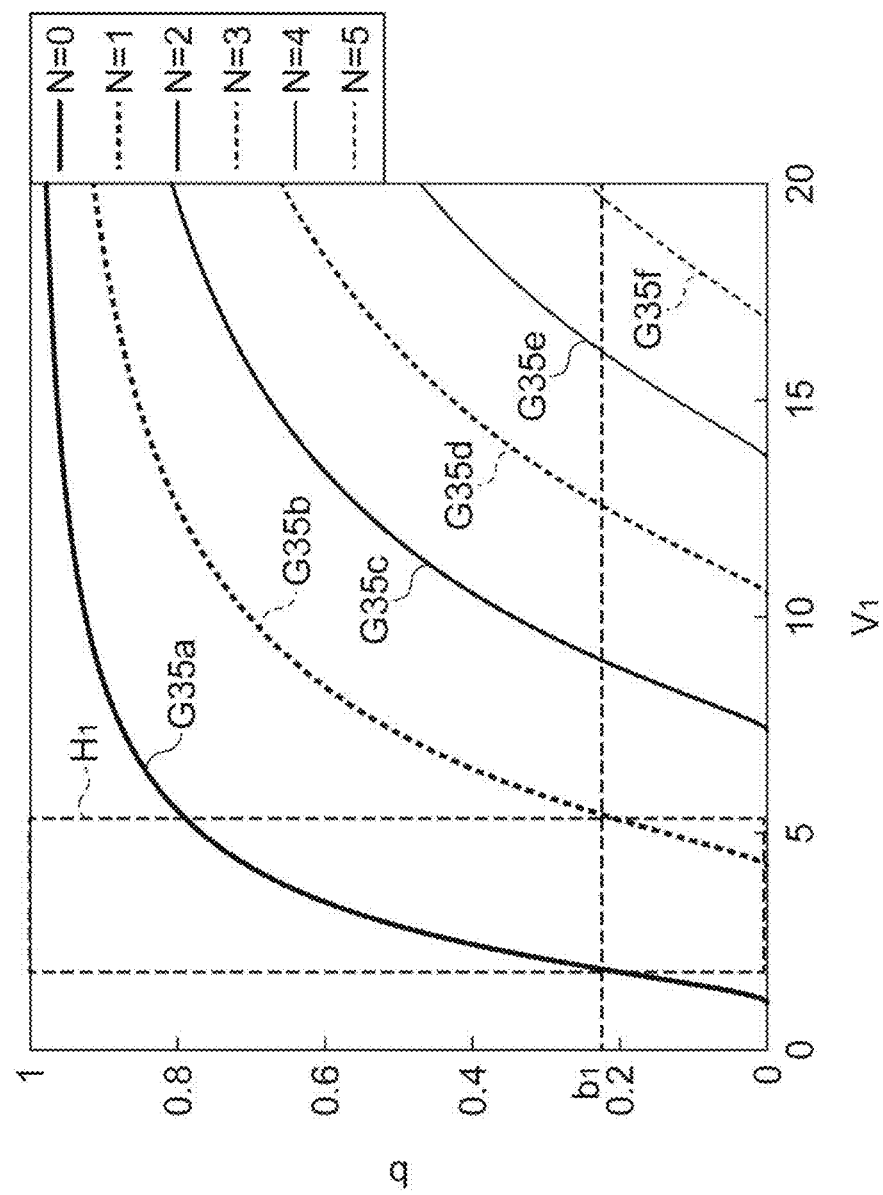
FIG. 54 is a graph illustrating a relationship between the normalized waveguide width $V_1$ of an optical waveguide layer expressed by Formulas (1) and (2) and the normalized propagation coefficient b.

FIG. 53A is a table illustrating the refractive indices $n_1$, $n_2$, and $n_3$, the asymmetric parameter a', and the refractive index $n_{clad}$ of the cladding layer 11 used in the calculation. In this case, FIG. 54 illustrates a relationship between the normalized waveguide width $V_1$ of the optical waveguide layer and the normalized propagation coefficient b expressed by the above Formulas (1) and (2). In FIG. 54, graphs G35a to G35f illustrate cases where the mode order N=0 to 5, respectively. In this graph, the guided mode is set to only the fundamental mode (that is, N=0) in the range where the normalized waveguide width $V_1$ has one solution, and is inside a range $H_1$. The range $H_1$ is a range having a value of the normalized waveguide width $V_1$ corresponding to N=0 when the normalized propagation coefficient b is the value $b_1$ as a lower limit value and a value of the normalized waveguide width $V_1$ corresponding to N=1 when the normalized propagation coefficient b is the value $b_1$ as an upper limit value. FIG. 53B is a table illustrating calculation results of a lower limit value and an upper limit value.

Figure 56:
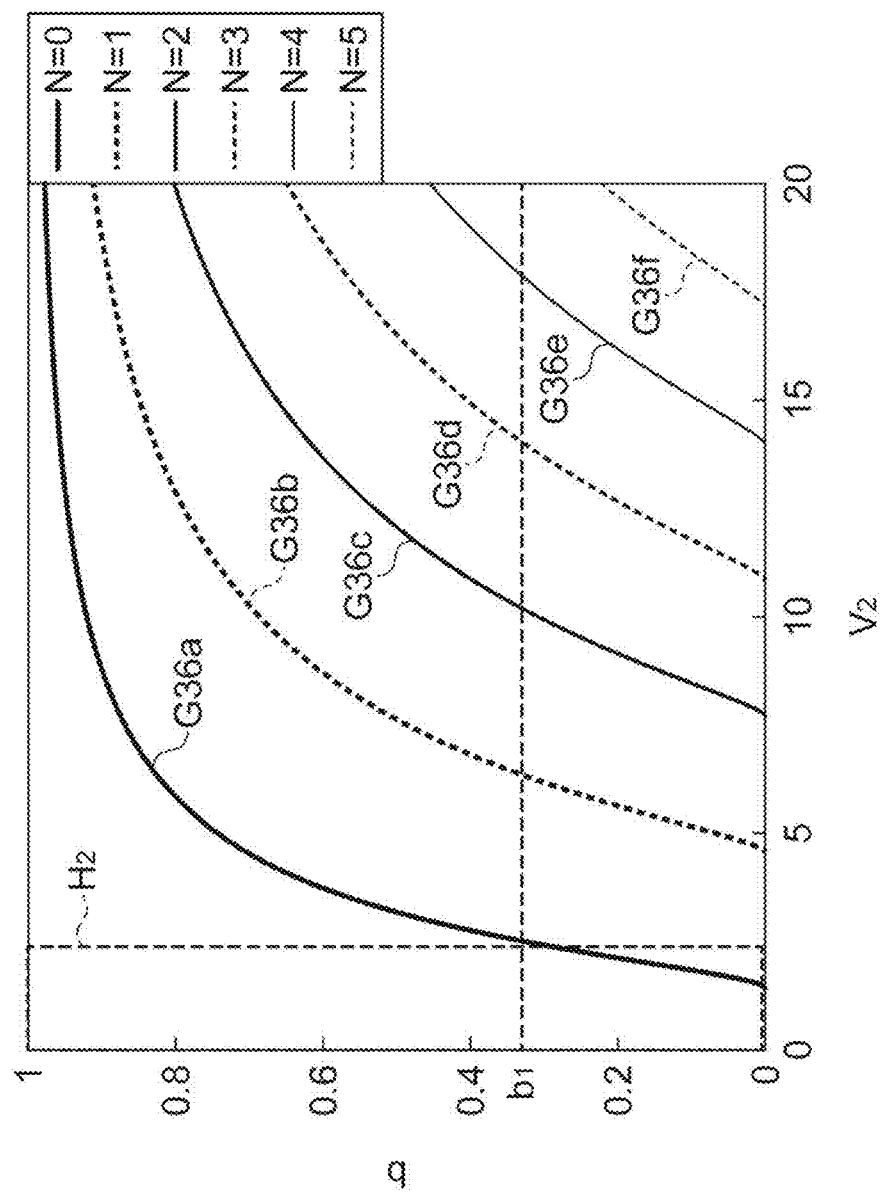
FIG. 56 is a graph illustrating a relationship between the normalized waveguide width $V_2$ of a contact layer expressed by Formulas (5) and (6) and the normalized propagation coefficient b.

In addition, FIG. 55A is a table illustrating the refractive indices $n_4$, $n_5$, and $n_6$, the asymmetric parameter a', and the refractive index $n_{clad}$ of the cladding layer 11 used in the calculation. In this case, FIG. 56 illustrates a relationship between the normalized waveguide width $V_2$ of the contact layer 14 and the normalized propagation coefficient b expressed by the above Formulas (5) and (6). In FIG. 56, graphs G36a to G36f illustrate cases where the mode order N=0 to 5, respectively. In the graph, no guided mode caused by the contact layer 14 is generated, and the guided mode of the semiconductor light-emitting element 1A is set to only the fundamental mode of the optical waveguide layer in a range where there is no solution of the normalized waveguide width $V_2$, and is inside a range $H_2$. A definition of the range $H_2$ is the same as that in the case of the GaAs-based compound semiconductor described above. FIG. 55B is a table illustrating a calculation result of such an upper limit value.

Figure 57:
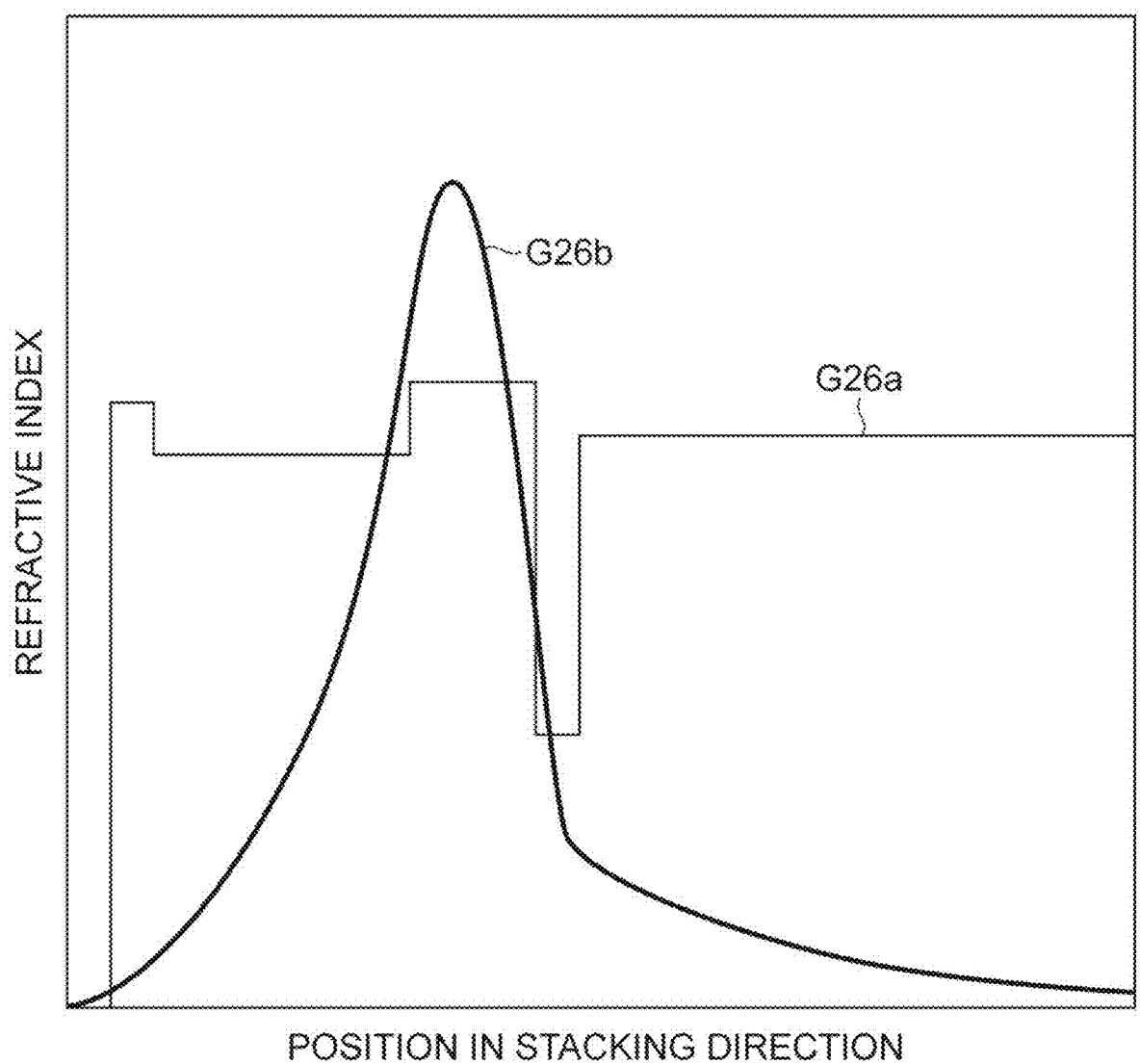
FIG. 57 illustrates a refractive index profile and a mode distribution of the semiconductor light-emitting element having the layer structure illustrated in FIG. 52.

FIG. 57 illustrates a refractive index profile G26a and a mode distribution G26b of the semiconductor light-emitting element 1A having the layer structure illustrated in FIG. 52. It can be understood that only the fundamental mode has been generated remarkably, and the higher-order mode has been suppressed.

The light-emitting device according to the invention is not limited to the above-described embodiments, and various other modifications can be made. For example, the semiconductor light-emitting element made of the semiconductor of GaAs-base, InP-base, and nitride-base (particularly, GaN-base) compound semiconductors has been exemplified in the above-described embodiments, but the light-emitting device of the present invention can include semiconductor light-emitting devices made of various semiconductor materials other than these.

In addition, the example in which the active layer 12 provided on the semiconductor substrate 10 common to the phase modulation layer 15 is used as the light-emitting portion has been described in the above-described embodiments, but the light-emitting portion may be provided separately from the semiconductor substrate 10 in the invention. The same effects as those in the above-described embodiments can be suitably obtained even with such a separated configuration as long as the light-emitting portion is a portion that is optically coupled to a phase modulation layer and supplies light to the phase modulation layer.

REFERENCE SIGNS LIST 1A, 1B, 1C . . . semiconductor light-emitting element; 4 . . . drive circuit; 6 . . . support substrate; 7 . . . control circuit; 10 . . . semiconductor substrate; 10a . . . main surface; 10b . . . rear surface; 11, 13 . . . cladding layer; 12 . . . active layer; 14 . . . contact layer; 14a . . . opening; 15 . . . phase modulation layer; 15a . . . base layer; 15b, 15c . . . modified refractive index region; 16, 17, 22, 23; electrode; 17a, 23a . . . opening; 18 . . . protective film; 19 . . . anti-reflection film; 20 . . . light reflection layer; 21 . . . current confinement layer; 21a . . . opening; 24 . . . protective film; 25 . . . anti-reflection film; a . . . lattice interval; AD, AL, AR, AU . . . traveling wave; B1 . . . first optical image portion; B2 . . . second optical image portion; BD, BL, BR, BU . . . beam pattern; D . . . straight line; G . . . gravity center; O . . . lattice point; R . . . unit constituent region; RIN . . . inner region; and ROUT . . . outer region.

The invention claimed is:

1. A production method for a light-emitting device that includes a substrate having a main surface and outputs light to form an optical image in at least one direction of a normal direction of the main surface and an inclination direction inclined with respect to the normal direction, the production method comprising:

a preparing step of preparing the substrate; and a stacking step of providing a light-emitting portion and a phase modulation layer optically coupled to the light-emitting portion on the substrate, wherein the stacking step comprises:

a first step of providing a base layer on the substrate, the base layer having a predetermined refractive index and constituting a part of the phase modulation layer; and a second step of providing a plurality of modified refractive index regions in the base layer provided in the first step, the plurality of modified refractive index regions having a refractive index different from the refractive index of the base layer, and the second step comprises:

a first setting step of setting a virtual square lattice, defined by a plurality of first reference lines arranged in parallel to each other and a plurality of second reference lines arranged in parallel to each other in a state of being orthogonal to the plurality of first reference lines, on a design plane of the base layer orthogonal to the normal direction;

a second setting step of specifying an intersection between any of the plurality of first reference lines and any of the plurality of second reference lines as a reference lattice point serving as an arrangement reference of a modified refractive index region, selected from among the plurality of modified refractive index regions, among lattice points of the square lattice;

a third setting step of setting a virtual straight line on which a gravity center of the selected modified refractive index region is arranged on the design plane of the base layer, the virtual straight line passing through the reference lattice point and having a predetermined tilt angle with respect to the first reference line or the second reference line orthogonal at the reference lattice point;

a fourth setting step of setting a distance on the virtual straight line from the reference lattice point to the gravity center of the selected modified refractive index region on the design plane of the base layer such that at least a part of the light to form the optical image is outputted; and a region formation step of performing the second to fourth setting steps for each of the plurality of modified refractive index regions and forming the plurality of modified refractive index regions in the base layer.

2. The production method for a light-emitting device according to claim 1, wherein
the second to fourth setting steps included in the second step are performed with the tilt angle fixed for at least the selected modified refractive index region having the reference lattice point as an arrangement reference among the plurality of modified refractive index regions and each of peripheral modified refractive index regions having lattice points adjacent to the reference lattice point at a shortest distance as arrangement references.

3. The production method for a light-emitting device according to claim 2, wherein
the tilt angle based on a line segment connecting the reference lattice point and a lattice point adjacent to the reference lattice point is an angle excluding 0°, 90°, 180°, and 270°, the line segment included in the first reference line or the second reference line orthogonal at the reference lattice point.

4. The production method for a light-emitting device according to claim 2, wherein
the tilt angle based on a line segment connecting the reference lattice point and a lattice point adjacent to the reference lattice point is 45°, 135°, 225°, or 315°, the line segment included in the first reference line or the second reference line orthogonal at the reference lattice point.

5. The production method for a light-emitting device according to claim 1, wherein
the second to fourth setting steps included in the second step are performed with the tilt angle fixed for each of the plurality of modified refractive index regions.

6. The production method for a light-emitting device according to claim 5, wherein
the tilt angle based on a line segment connecting the reference lattice point and a lattice point adjacent to the reference lattice point is an angle excluding 0°, 90°, 180°, and 270°, the line segment included in the first reference line or the second reference line orthogonal at the reference lattice point.

7. The production method for a light-emitting device according to claim 5, wherein
the tilt angle based on a line segment connecting the reference lattice point and a lattice point adjacent to the reference lattice point is 45°, 135°, 225°, or 315°, the line segment included in the first reference line or the second reference line orthogonal at the reference lattice point.

8. The production method for a light-emitting device according to claim 1, wherein
the light-emitting portion is an active layer provided on the substrate.

9. A light-emitting device produced by the production method for a light-emitting device according to claim 1.

10. A light-emitting device that outputs light to form an optical image in at least one direction of a normal direction of a main surface and an inclination direction inclined with respect to the normal direction, the light-emitting device comprising:

a substrate having the main surface;
a light-emitting portion provided on the substrate; and
a phase modulation layer provided on the substrate in a state of being optically coupled to the light-emitting portion, the phase modulation layer including a base layer having a predetermined refractive index, and a plurality of modified refractive index regions having a refractive index different from the refractive index of the base layer, wherein the plurality of modified refractive index regions of the phase modulation layer are arranged at predetermined positions in the base layer according to an arrangement pattern for formation of the optical image, the arrangement pattern is defined such that,
where a virtual square lattice configured by M1 (an integer of one or more)×N1 (an integer of one or more) unit constituent regions R each having a square shape is set on an X-Y plane in an XYZ orthogonal coordinate system defined by a Z-axis coinciding with the normal direction of the main surface and the X-Y plane including an X-axis and a Y-axis orthogonal to each other and coinciding with one surface of the phase modulation layer including the plurality of modified refractive index regions, a gravity center G of a modified refractive index region positioned in a unit constituent region R(x, y) is separated from a lattice point O(x, y), which is a center of the unit constituent region R(x, y), by a distance r in the unit constituent region R(x, y) on the X-Y plane specified by a coordinate component x (an integer of from 1 to M1) in an X-axis direction and a coordinate component y (an integer of from 1 to N1) in a Y-axis direction, and a vector from the lattice point O(x, y) to the gravity center G is directed in a specific direction, coordinates ($\xi$, $\eta$, $\zeta$) in the XYZ orthogonal coordinate system satisfy relationships expressed by following Formulas (1) to (3) with respect to spherical coordinates (d1, $\theta_{tilt}$, $\theta_{rot}$) defined by a length d1 of a radius, a tilt angle $\theta_{tilt}$ from the Z-axis, and a rotational angle $\theta_{rot}$ from the X-axis specified on the X-Y plane, $$\xi = d1 \sin\theta_{tilt} \cos\theta_{rot} \quad (1)$$

$$\eta = d1 \sin\theta_{tilt} \sin\theta_{rot} \quad (2)$$

$$\zeta = d1 \cos\theta_{tilt} \quad (3)$$

where a beam pattern corresponding to the optical image is a set of bright spots directed in directions defined by the angles $\theta_{tilt}$ and $\theta_{rot}$, the angles $\theta_{tilt}$ and $\theta_{rot}$ are converted to a coordinate value $k_x$, which is a normalized wave number defined by following Formula (4), on a Kx-axis corresponding to the X-axis and a coordinate value $k_y$, which is a normalized wave number defined by following Formula (5), on a Ky-axis corresponding to the Y-axis and orthogonal to the Kx-axis, $$k_x = \frac{a}{\lambda}\sin\theta_{tilt}\cos\theta_{rot} \qquad (4)$$

$$k_y = \frac{a}{\lambda}\sin\theta_{tilt}\sin\theta_{rot} \qquad (5)$$

a: Lattice constant of virtual square lattice
λ: Oscillation wavelength
a specific wave number range including the beam pattern is constituted by M2 (an integer of one or more)×N2 (an integer of one or more) image regions FR each having a square shape in a wave number space defined by the Kx-axis and the Ky-axis,
in the wave number space, a complex amplitude F(x, y), obtained by performing a two-dimensional inverse Fourier transform of each of image regions FR ($k_x$, $k_y$) specified by a coordinate component $k_x$ (an integer of from 0 to M2−1) in a Kx-axis direction and a coordinate component $k_y$ (an integer of from 0 to N2−1) in a Ky-axis direction into the unit constituent region R(x, y) on the X-Y plane, is given by following Formula (6), using j as an imaginary unit, $$F(x,y) = \sum_{k_x=0}^{M2-1}\sum_{k_y=0}^{N2-1} FR(k_x, k_y)\exp\left[j2\pi\left(\frac{k_x}{M2}x + \frac{k_y}{N2}y\right)\right] \qquad (6)$$

where an amplitude term is A(x, y) and a phase term is P(x, y) in the unit constituent region R(x, y), the complex amplitude F(x, y) is defined by following Formula (7), and $$F(x,y)=A(x,y)\times\exp\{jP(x,y)\} \qquad (7)$$

when the unit constituent region R(x, y) is defined by an s-axis and a t-axis that are parallel to the X-axis and the Y-axis, respectively, and are orthogonal at the lattice point O(x, y),
the phase modulation layer is configured such that
the gravity center G of the corresponding modified refractive index region is positioned on a straight line passing through the lattice point O(x, y) and having a predetermined tilt angle with respect to the s-axis, and the corresponding modified refractive index region, which satisfies a following relationship of a line segment length r(x, y) from the lattice point O(x, y) to the gravity center G of the corresponding modified refractive index region, is arranged in the unit constituent region R(x, y)

$$r(x,y)=C\times(P(x,y)-P_0)$$

C: proportional constant
$P_0$: arbitrary constant.

11. The light-emitting device according to claim 10, wherein
in a plurality of valid unit constituent regions in which the plurality of modified refractive index regions are respectively arranged among the M1×N1 unit constituent regions R, the tilt angle of the straight line set in a specific unit constituent region included in the plurality of valid unit constituent regions coincides with the tilt angle of the straight line set in each of the adjacent unit constituent regions sharing one side with the specific unit constituent region.

12. The light-emitting device according to claim 11, wherein
the tilt angle based on a part of the s-axis starting from the lattice point O(x, y) is an angle excluding 0°, 90°, 180° and 270°.

13. The light-emitting device according to claim 11, wherein
the tilt angle based on a part of the s-axis starting from the lattice point O(x, y) is 45°, 135°, 225°, or 315°.

14. The light-emitting device according to claim 10, wherein
in a plurality of valid unit constituent regions in which the plurality of modified refractive index regions are respectively arranged among the M1×N1 unit constituent regions R, the tilt angle of the straight line set in a specific unit constituent region included in the plurality of valid unit constituent regions coincides with the tilt angle of the straight line set in each of remaining valid unit constituent regions excluding the specific unit constituent region.

15. The light-emitting device according to claim 14, wherein
the tilt angle based on a part of the s-axis starting from the lattice point O(x, y) is an angle excluding 0°, 90°, 180° and 270°.

16. The light-emitting device according to claim 14, wherein
the tilt angle based on a part of the s-axis starting from the lattice point O(x, y) is 45°, 135°, 225°, or 315°.

17. The light-emitting device according to claim 10, wherein
the light-emitting portion is an active layer provided on the substrate.

* * * * *